(12) United States Patent
Li

(10) Patent No.: US 12,317,703 B2
(45) Date of Patent: May 27, 2025

(54) DISPLAY SUBSTRATE HAVING CONNECTION ELECTRODE IN A SAME LAYER WITH ONE CAPACITOR ELECTRODE AND ELECTRICALLY CONNECTING THE OTHER CAPACITOR ELECTRODE TO DATA WRITING SUB-CIRCUIT, AND DISPLAY DEVICE

(71) Applicant: BOE TECHNOLOGY GROUP CO., LTD., Beijing (CN)

(72) Inventor: Dachao Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 347 days.

(21) Appl. No.: 17/685,548

(22) Filed: Mar. 3, 2022

(65) Prior Publication Data
US 2022/0254856 A1 Aug. 11, 2022

Related U.S. Application Data

(63) Continuation of application No. 17/430,403, filed as application No. PCT/CN2020/080240 on Mar. 19, 2020, now Pat. No. 12,225,785.

(51) Int. Cl.
*H10K 59/131* (2023.01)
*G09G 3/3225* (2016.01)
(Continued)

(52) U.S. Cl.
CPC ......... *H10K 59/131* (2023.02); *G09G 3/3225* (2013.01); *G09G 3/3233* (2013.01);
(Continued)

(58) Field of Classification Search
CPC ............... H10K 59/131; H10K 59/121; H10K 59/1213; G09G 2300/0426;
(Continued)

(56) References Cited

U.S. PATENT DOCUMENTS

2002/0038998 A1 4/2002 Fujita et al.
2004/0227704 A1 11/2004 Wang et al.
(Continued)

FOREIGN PATENT DOCUMENTS

CN 107424569 A 12/2017
CN 108873552 A 11/2018
(Continued)

OTHER PUBLICATIONS

Extended European Search Report issued by the European Patent Office for the corresponding European Patent Application No. 20925419.2 which has an issue date of Apr. 3, 2023.
(Continued)

*Primary Examiner* — Amr A Awad
*Assistant Examiner* — Maheen I Javed
(74) *Attorney, Agent, or Firm* — Dilworth & Barrese, LLP.; Michael J. Musella, Esq.

(57) ABSTRACT

A display substrate and a display device are provided. The display substrate includes a sub-pixel and the sub-pixel includes a pixel circuit including a data writing sub-circuit, a storage sub-circuit and a driving sub-circuit. The display substrate further includes a first connection electrode and the storage sub-circuit includes a storage capacitor; the first connection electrode is in a same layer as the second capacitor electrode and is insulated form the second capacitor electrode, and the second capacitor electrode electrically connects the first capacitor electrode to the data writing sub-circuit.

20 Claims, 23 Drawing Sheets

(51) Int. Cl.
*G09G 3/3233* (2016.01)
*H10K 59/121* (2023.01)

(52) U.S. Cl.
CPC ... *H10K 59/121* (2023.02); *G09G 2300/0426* (2013.01); *G09G 2300/0833* (2013.01); *G09G 2300/0842* (2013.01); *G09G 2310/08* (2013.01); *G09G 2320/02* (2013.01)

(58) Field of Classification Search
CPC ....... G09G 2300/0842; G09G 2310/08; G09G 2320/02; G09G 2300/0819; G09G 2310/0251; G09G 2320/0223; G09G 3/3233; G09G 3/3225; G09G 2300/0833; H01L 27/1214
See application file for complete search history.

(56) References Cited

U.S. PATENT DOCUMENTS

| | | | | |
|---|---|---|---|---|
| 2005/0012100 | A1* | 1/2005 | Koo | H01L 29/78624 257/E29.279 |
| 2006/0232505 | A1* | 10/2006 | Asada | G09G 3/3651 345/55 |
| 2007/0085847 | A1* | 4/2007 | Shishido | G09G 3/3225 345/39 |
| 2010/0090931 | A1 | 4/2010 | Kawabe | |
| 2012/0249516 | A1 | 10/2012 | Wacyk et al. | |
| 2014/0168038 | A1 | 6/2014 | Kim | |
| 2015/0348462 | A1 | 12/2015 | Ma | |
| 2017/0004769 | A1* | 1/2017 | Nathan | G09G 3/3241 |
| 2018/0166018 | A1 | 6/2018 | Yang | |
| 2018/0366066 | A1 | 12/2018 | Kim et al. | |
| 2020/0105196 | A1 | 4/2020 | Xuan et al. | |
| 2020/0294446 | A1 | 9/2020 | Long | |
| 2021/0183968 | A1* | 6/2021 | Kim | H01L 29/78618 |

FOREIGN PATENT DOCUMENTS

| | | |
|---|---|---|
| CN | 208753327 U | 4/2019 |
| CN | 109754756 A | 5/2019 |
| EP | 3142099 A1 | 3/2017 |
| JP | 2005167212 A | 6/2005 |
| JP | 2008134577 A | 6/2008 |
| JP | 2015129945 A | 7/2015 |
| WO | 2015169043 A1 | 11/2015 |
| WO | 2020020118 A1 | 1/2020 |

OTHER PUBLICATIONS

Chinese Office Action from Chinese Patent Application No. 202210146119.4 dated Jan. 20, 2023.
Partial Supplementary European Search Report from European Patent Application No. 20925634.6 dated Feb. 17, 2023.
JP Application No. 2022-503870; Mailing Date: Jan. 22, 2024.
U.S. Appl. No. 17/430,403; Mailing Date: Mar. 4, 2024.

* cited by examiner

DISPLAY SUBSTRATE HAVING CONNECTION ELECTRODE IN A SAME LAYER WITH ONE CAPACITOR ELECTRODE AND ELECTRICALLY CONNECTING THE OTHER CAPACITOR ELECTRODE TO DATA WRITING SUB-CIRCUIT, AND DISPLAY DEVICE

CROSS REFERENCE TO RELATED APPLICATIONS

This application is a continuation of U.S. application Ser. No. 17/430,403, filed on Aug. 12, 2021, which is a national stage application of International Application No. PCT/CN2020/080240, filed on Mar. 19, 2020. All the aforementioned patent applications are hereby incorporated by reference in their entireties.

TECHNICAL FIELD

Embodiments of the present disclosure relate to a display substrate and a display device.

BACKGROUND

Micro OLED displays involve the combination of organic light-emitting diode (OLED) technology and complementary metal oxide semiconductor (CMOS) technology, and are related to a cross-integration of the optoelectronic industry and the microelectronics industry, micro OLED displays have promoted a development of a new generation of micro display technology, and have also promoted a research and development of organic electronics on silicon, and even a research and development of molecular electronics on silicon.

Micro OLED displays have excellent display characteristics, such as high resolution, high brightness, rich colors, low drive voltage, fast response speed, and low power consumption, and have broad development prospects.

SUMMARY

At least an embodiment of the present disclosure provides a display substrate, A display substrate, comprising a base substrate and a sub-pixel on the base substrate, wherein the sub-pixel comprises a pixel circuit, and the pixel circuit comprises a data writing sub-circuit, a storage sub-circuit and a driving sub-circuit, the storage sub-circuit comprises a storage capacitor, and the capacitor comprises a first capacitor electrode and a second capacitor electrode which respectively serve as a first terminal and a second terminal of the storage sub-circuit; the data writing sub-circuit is electrically connected with the first terminal of the storage sub-circuit, and is configured to transmit a data signal to the first terminal of the storage sub-circuit in response to a control signal; the driving sub-circuit comprises a control electrode, a first electrode and a second electrode, and the control electrode is electrically connected with the first terminal of the storage sub-circuit; the driving sub-circuit is configured to control a driving current which drives a light-emitting element to emit light; the display substrate further comprises a first connection electrode; the first connection electrode is in a same layer as the second capacitor electrode and is insulated form the second capacitor electrode, and the second capacitor electrode electrically connects the first capacitor electrode to the data writing sub-circuit.

In some examples, the first connection electrode comprises a first portion extended along a first direction and a second portion extended along a second direction, the first portion and the second portion are in an integral structure, and the first direction and the second direction are orthogonal to each other; the first portion is electrically connected with the data writing sub-circuit and the second portion is electrically connected with the first capacitor electrode.

In some examples, an orthographic projection of the first portion of the first connection electrode on the base substrate is not overlapped with an orthographic projection of the storage capacitor on the base substrate.

In some examples, the driving sub-circuit comprises a driving transistor, and a gate electrode, a first electrode and a second electrode of the driving transistor respectively serve as the control electrode, the first electrode and the second electrode; in a direction perpendicular to the base substrate, the first connection electrode is not overlapped with a channel region of the driving transistor.

In some examples, the display substrate further comprises a polysilicon layer on the base substrate, and the control electrode of the driving sub-circuit is in the polysilicon layer, and the first connection electrode is on a side of the polysilicon layer away from the base substrate.

In some examples, the driving current flows from the first electrode to the light-emitting element along a current path which sequentially comprises a first straight current path, a second polyline current path and a third U-shaped current path.

In some examples, the second polyline current path and the first straight current path are respectively in different layers of the display substrate.

In some examples, the first straight current path is in the base substrate, and the second polyline current path is in a layer where the first connection electrode is located.

In some examples, the display substrate further comprises a second connection electrode, the second polyline current path is in the second connection electrode, and a first terminal of the second connection electrode is electrically connected with the second electrode of the driving sub-circuit.

In some examples, in a direction perpendicular to the base substrate, the first connection electrode is not overlapped with the second connection electrode.

In some examples, the first connection electrode and the second connection electrode are in a same layer and are insulated from each other.

In some examples, the display substrate further comprises a U-shaped resistor on the base substrate, one terminal of the U-shaped resistor is electrically connected with a second terminal of the second connection electrode, and another terminal of the U-shaped resistor is configured to be electrically connected with the light-emitting element.

In some examples, the U-shaped resistor and the control electrode of the driving sub-circuit are in a same polysilicon layer, and a resistivity of the U-shaped resistor is higher than a resistivity of the control electrode of the driving sub-circuit.

In some examples, in a direction perpendicular to the base substrate, the second connection electrode is at least partially overlapped with the first capacitor electrode.

In some examples, an opening of the third U-shaped current path is facing a side where the driving sub-circuit is located.

In some examples, the storage capacitor further comprises a third capacitor electrode, wherein the third capacitor electrode is on a side of the first capacitor electrode away from the second capacitor electrode and is configured to be electrically connected with the second capacitor electrode.

In some examples, the third capacitor electrode is in the base substrate.

In some examples, the display substrate comprises a plurality of sub-pixels arranged in an array along a first direction and a second direction different from the first direction, and along the second direction, the data writing sub-circuit, the first connection electrode and the driving sub-circuit are sequentially arranged.

In some examples, the first connection electrode comprises a first portion extended along the first direction and a second portion extended along the second direction, and the first portion and the second portion are in an integral structure; the first portion is electrically connected with the data writing sub-circuit and the second portion is electrically connected with the first capacitor electrode.

At least an embodiment of the present disclosure further provides a display device, comprising any one of the above display substrates and the light-emitting element.

BRIEF DESCRIPTION OF THE DRAWINGS

In order to clearly illustrate the technical solution of the embodiments of the present disclosure, the drawings of the embodiments will be briefly described. It is apparent that the described drawings are only related to some embodiments of the present disclosure and thus are not limitative of the present disclosure.

DETAILED DESCRIPTION

Figure 1A:
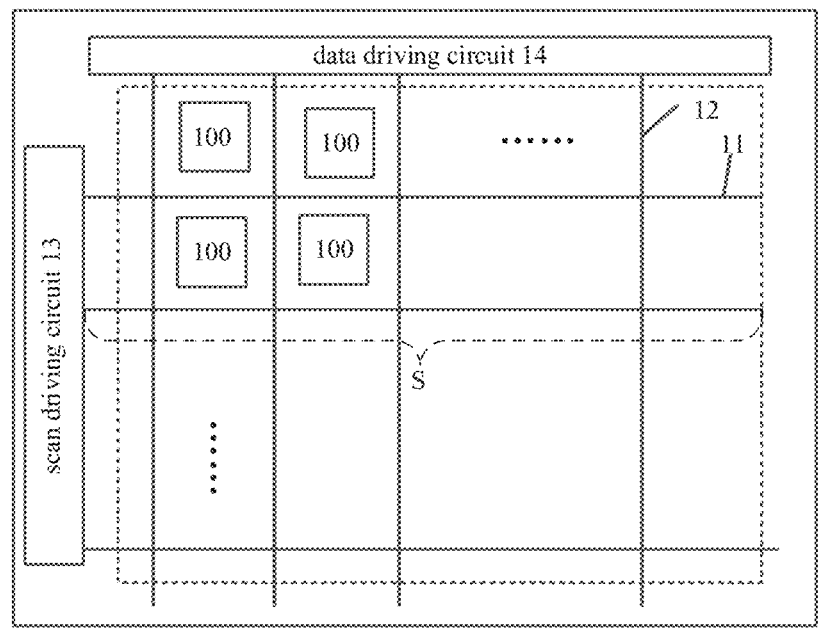
FIG. 1A is a first schematic diagram of a display substrate provided by at least one embodiment of the present disclosure.

In order to make objects, technical details and advantages of embodiments of the present disclosure clear, the technical solutions of the embodiments will be described in a clearly and fully understandable way in connection with the related drawings. It is apparent that the described embodiments are just a part but not all of the embodiments of the present disclosure. Based on the described embodiments herein, those skilled in the art can obtain, without any inventive work, other embodiment(s) which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and claims of the present disclosure, are not intended to indicate any sequence, amount or importance, but distinguish various components. The terms "comprises," "comprising," "includes," "including," etc., are intended to specify that the elements or the objects stated before these terms encompass the elements or the objects listed after these terms as well as equivalents thereof, but do not exclude other elements or objects. The phrases "connect", "connected", etc., are not intended to define a physical connection or a mechanical connection, but may comprise an electrical connection which is direct or indirect. The terms "on," "under," "right," "left" and the like are only used to indicate relative position relationship, and in a case that the position of an object is described as being changed, the relative position relationship may be changed accordingly.

In the field of OLED (Organic Light-Emitting Diode) display, with the rapid development of high-resolution products, higher requirements are put forward for a structural design of a display substrate, such as an arrangement of pixels and signal lines. For example, compared to an OLED display device with a resolution of 4K, the number of sub-pixel units that need to be arranged in a large-size 8K resolution OLED display device is doubled, and a pixel density is doubled accordingly; on one hand, a line width of the signal line is correspondingly smaller, which leads to an increase of a self-resistance of the signal line; on the other hand, more overlapping regions exist between signal lines, which leads to an increase of parasitic capacitance of the signal lines, thus leading to an increase of resistance capacitance load of the signal lines. Correspondingly, signal delay (RC delay), voltage drop (IR drop), voltage rise (IR rise) and other phenomena caused by the resistance capacitance load of the signal lines also become serious. These phenomena seriously affect a display quality of a display product.

A micro OLED display usually has a size of less than 100 microns, such as a size less than 50 microns, and involves a combination of organic light-emitting diode (OLED) technology and CMOS technology, which manufactures an OLED array on a silicon-based substrate including CMOS circuits.

Micro OLEDs are widely used in fields of AR and VR. With the continuous development of technology, higher resolutions are required for the Micro OLEDs. Therefore, higher requirements are put forward for the structural design of the display substrate, such as the arrangement of the pixels and the signal lines.

A display substrate provided by at least one embodiment of the present disclosure can achieve a sub-pixel area of 5.45 um×13.6 um by an optimized layout and wiring design processing in the design, which realizes a pixel circuit array with a high resolution (PPI) and an optimized arrangement, and achieves a better display effect.

FIG. 1A is a block diagram of a display substrate provided by at least one embodiment of the present disclosure. As shown in FIG. 1A, the display substrate 10 includes a plurality of sub-pixels 100 arranged in an array, a plurality of scan lines 11, and a plurality of data lines 12. Each of the plurality of sub-pixels 100 includes a light-emitting element and a pixel circuit that drives the light-emitting element. The plurality of scan lines 11 and the plurality of data lines 12 cross each other to define a plurality of pixel regions distributed in an array in a display region, and a pixel circuit of a sub-pixel 100 is provided in each of the plurality of pixel regions. The pixel circuit is, for example, a conventional pixel circuit, such as a 2T1C (that is, two transistors and a capacitor) pixel circuit, a 4T2C pixel circuit, a 5T1C pixel circuit, a 7T1C pixel circuit and other nTmC (n, m are positive integers) pixel circuits, and in different embodiments, the pixel circuit may further include a compensation sub-circuit, the compensation sub-circuit includes an internal compensation sub-circuit or an external compensation sub-circuit, and the compensation sub-circuit may include a transistor and a capacitor and so on. For example, according to needs, the pixel circuit may further include a reset circuit, a light-emitting control sub-circuit, and a detection circuit. For example, the display substrate may further include a gate driving sub-circuit 13 and a data driving sub-circuit 14 located in a non-display region. The gate driving sub-circuit 13 is connected with the pixel circuit through the scan lines 11 to provide various scanning signals, and the data driving sub-circuit 14 is connected with the pixel circuit through the data lines 12 to provide data signals. Positional relationships between the gate driving sub-circuit 13 and the data driving sub-circuit 14, and between the scan lines 11 and the data lines 12 shown in FIG. 1A are only exemplary, and actual arrangement and positions can be designed as required.

For example, the display substrate 10 may further include a control circuit (not shown). For example, the control circuit is configured to control the data driving sub-circuit 14 to apply the data signals and to control the gate driving sub-circuit to apply the scanning signals. An example of the control circuit is a timing control circuit (T-con). The control circuit can be in various forms, for example, including a processor and a memory, the memory includes an executable code, and the processor runs the executable code to execute the above detection method.

For example, the processor may be a central processing unit (CPU) or other form of processing device with data processing capability and/or instruction execution capability, for example, may include a microprocessor, a programmable logic controller (PLC), and so on.

For example, the storage device may include one or more computer program products, the computer program products may include various forms of computer-readable storage media, such as a volatile memory and/or a non-volatile memory. The volatile memory may include, for example, a random access memory (RAM) and/or a cache memory. The non-volatile memory may include, for example, a read-only memory (ROM), a hard disk, a flash memory, and so on. One or more computer program instructions can be stored on a computer-readable storage medium, and the processor can execute functions expected by the program instructions. Various application programs and various data can also be stored in the computer-readable storage medium.

The pixel circuit may include a driving sub-circuit, a data writing sub-circuit, a compensation sub-circuit and a storage sub-circuit as required, and may further include a light-emitting control sub-circuit, and a reset circuit as required.

Figure 1B:
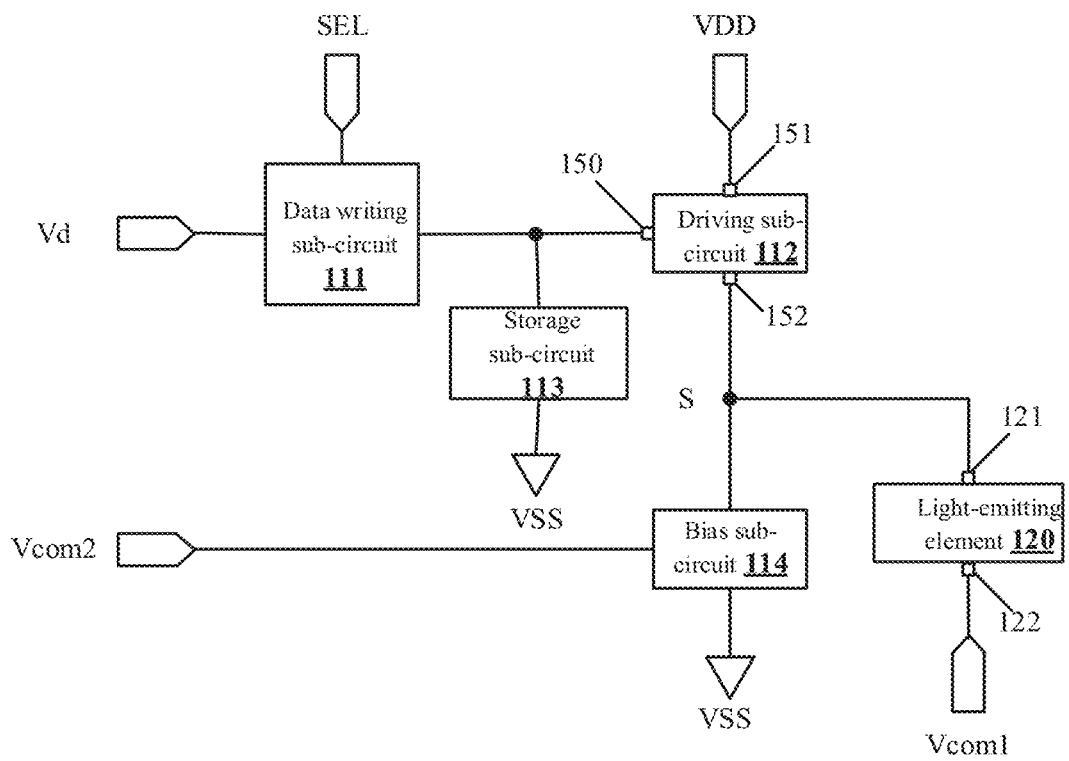
FIG. 1B is a first pixel circuit diagram provided by at least one embodiment of the present disclosure.

FIG. 1B shows a schematic diagram of a pixel circuit. As shown in FIG. 1B, the pixel circuit includes a data writing sub-circuit 111, a driving sub-circuit 112, and a storage sub-circuit 113.

The data writing sub-circuit 111 is electrically connected with a first terminal of the storage sub-circuit 113, and is configured to transmit a data signal Vd to the first terminal of the storage sub-circuit 113 in response to a control signal (a first control signal SEL). A second terminal of the storage sub-circuit 113 is, for example, configured to receive a second power voltage VSS.

The driving sub-circuit 112 includes a control electrode 150, a first electrode 151 and a second electrode 152, The control electrode (control terminal) 150 of the driving sub-circuit is electrically connected with the first terminal of the storage sub-circuit, the first electrode (first terminal) 151 of the driving sub-circuit 112 is configured to receive a first power voltage VDD, the second electrode (second terminal) 152 of the driving sub-circuit 112 is electrically connected with a first node S, and is connected with a first electrode 121 of a light-emitting element 120. The driving sub-circuit 112 is configured to drive the light-emitting element 120 to emit light in response to a voltage at the first terminal of the storage sub-circuit. A second electrode 122 of the light-emitting element 120 is, for example, configured to receive a first common voltage Vcom1.

In at least some embodiments of the present disclosure, as shown in FIG. 1B, the pixel circuit further includes a bias sub-circuit 114. The bias sub-circuit 114 includes a control terminal, a first terminal and a second terminal, the control terminal of the bias sub-circuit 114 is configured to receive a bias signal; the first terminal of the bias sub-circuit 114 is configured to, for example, receive the second power voltage VSS, the second terminal of the bias sub-circuit 114 is electrically connected with the first node S. For example, the bias signal is a second common voltage Vcom2. For example, the bias signal Vcom2 is a constant voltage signal, for example, ranging from 0.8V to 1V; the bias sub-circuit 114 is normally open under the action of the bias signal, and is configured to provide a constant current, so that the voltage applied to the light-emitting element 120 has a linear relationship with the data signal, which helps to achieve a fine control of a gray scale, thereby improving a display effect. This will be further explained in the following text in conjunction with specific circuits.

For example, in the case that the data signal (voltage) Vd changes from high to low, a gray-scale voltage written in the first electrode 121 of the light-emitting element 120 needs to change rapidly, and the bias sub-circuit 114 can also allow the first electrode 121 of the light-emitting element 120 to release charges quickly, thereby achieving better dynamic contrast.

The transistors used in the embodiments of the present disclosure may all be thin film transistors or field effect transistors or other switching devices with the same characteristics, in the embodiments of the present disclosure, metal-oxide semiconductor field effect transistors are taken as examples for description. A source electrode and a drain electrode of a transistor used herein can be symmetrical in structure, so that there is no difference between the source electrode and the drain electrode of the transistor in structure. In the embodiments of the present disclosure, in order to distinguish the two electrodes of the transistor other than a gate electrode, one electrode is directly described as a first electrode, and the other electrode is a second electrode. In addition, transistors can be divided into an N-type transistor and a P-type transistor according to their characteristics. In a case that the transistor is the P-type transistor, a turn-on voltage is a low-level voltage (for example, 0V, −5V, −10V or other suitable voltages), and an off voltage is a high-level voltage (for example, 5V, 10V or other suitable voltage); in a case that the transistor is the N-type transistor, the turn-on voltage is a high-level voltage (for example, 5V, 10V or other suitable voltage), and the off voltage is a low-level voltage (for example, 0V, −5V, −10V or other suitable voltages).

The display substrate provided by the embodiments of the present disclosure may adopt a rigid substrate, such as a glass substrate, a silicon substrate, etc., and can also be formed of flexible materials with excellent heat resistance and durability, such as polyimide (PI), polycarbonate (PC), polyethylene terephthalate (PET), polyethylene, polyacrylate, polyaryl compounds, polyetherimide, polyethersulfone, polyethylene glycol terephthalate (PET), polyethylene (PE), polypropylene (PP), polysulfone (PSF), polymethyl methacrylate (PMMA), triacetyl cellulose (TAC), cyclic olefin polymer (COP) and cyclic olefin copolymer (COC), etc. The embodiments of the present disclosure are described by taking a silicon substrate as an example, that is, the pixel structure is manufactured on the silicon substrate, however, the embodiment of the present disclosure are not limited thereto.

For example, the pixel circuit includes a complementary metal oxide semiconductor circuit (CMOS circuit), that is, the pixel circuit is manufactured on a monocrystal silicon substrate. Relying on mature CMOS integrated circuit technology, silicon-based technology can achieve higher accuracy (for example, the PPI can reach 6,500 or even more than 10,000).

For example, in the case that a short circuit occurs between the first electrode 121 and the second electrode 122 of the light-emitting element 120 in the sub-pixel due to process fluctuations of the display substrate, the voltage of the first electrode 121 of the light-emitting element 120 is too high (for example, the first common voltage Vcom1 is at a high potential) or too low (for example, the first common voltage Vcom1 is at a low potential), causing a PN junction between the second electrode of the driving circuit and the base substrate to turn on, and causing failure of the CMOS circuit, and resulting in defects such as dark lines in the display substrate.

In some examples, for example, the data writing sub-circuit includes a first data writing transistor P1, and the driving sub-circuit includes a driving transistor N2; for example, the first data writing transistor is a P-type metal-oxide semiconductor field effect transistor (PMOS), the driving transistor N2 is an N-type metal-oxide semiconductor field effect transistor (NMOS), a gate electrode, a first electrode, and a second electrode of the driving transistor N2 serve as the control electrode 150, the first electrode 151 and the second electrode 152 of the driving sub-circuit 112, respectively. In this case, for example, in a case that the first common voltage Vcom1 supplied to the second electrode 122 of the light-emitting element 120 is at a low potential, and the first electrode 121 and the second electrode 122 of the light-emitting element 120 are short circuited, the potential of the second electrode of the driving transistor directly connected with the first electrode 121 is caused to be too low.

Figure 1C:
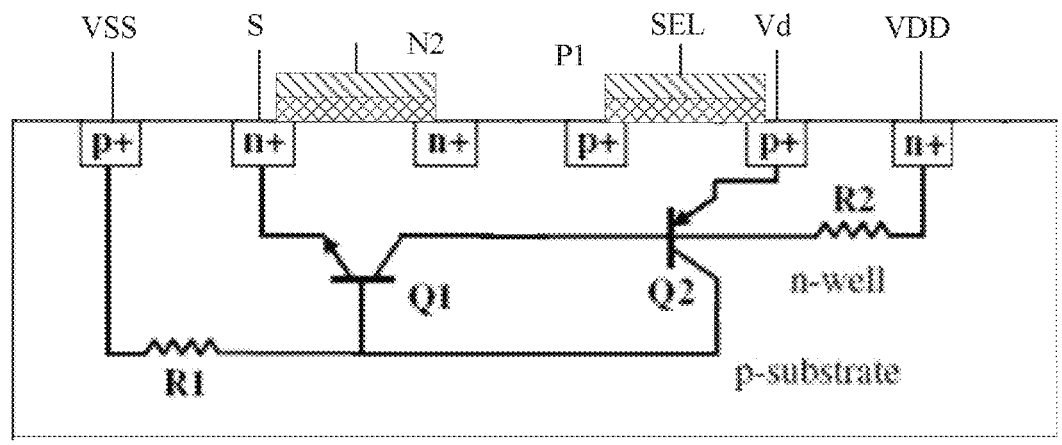
FIG. 1C is a schematic structural diagram of a pixel circuit.

FIG. 1C shows a schematic diagram of the failure of the transistors in the pixel circuit. An N-type active region (such as the second electrode) of the driving transistor N2, a P-type silicon-based substrate, an N-type well region where the first data writing transistor P1 is located, and a P-type active region (such as the first electrode) of the first data writing transistor P1 form two parasitic transistors Q1 and Q2 that are connected with each other, which forms an N-P-N-P structure. In the case that the potential of the second electrode (that is, the first node S) of the driving transistor N2 is too low, causing a PN junction (a transmitting junction) between the second electrode (a heavily-doped N-type region) of the driving transistor N2 and the P-type substrate to be positively biased and Q1 to be turned on, which provides a current large enough to turn on the parasitic transistor Q2; in turn, the parasitic transistor Q2 feeds back a current to the parasitic transistor Q1, to form a vicious circle, finally most of the current flows directly from VDD to VSS through the parasitic transistors without being controlled by the gate voltage of the transistor, which causes the CMOS pixel circuit to fail; in addition, the failure of the circuit will cause the parasitic transistor Q2 to continuously draw a current from a emitter, i.e., the data line, thereby causing a column of sub-pixels connected with the data line to fail, and causing defects such as a dark line on the display substrate, which greatly affects the display effect.

In at least some embodiments of the present disclosure, at least one sub-pixel further includes a resistance device, the resistance device is connected between the second electrode 152 of the driving sub-circuit 112 and the first electrode 121 of the light-emitting element 120, and the resistance device can increase or decrease the potential of the first node S, so that the latch-up effect can be relieved or avoided, the reliability of the circuit can be improved, and the display effect can be improved.

Figure 2A:
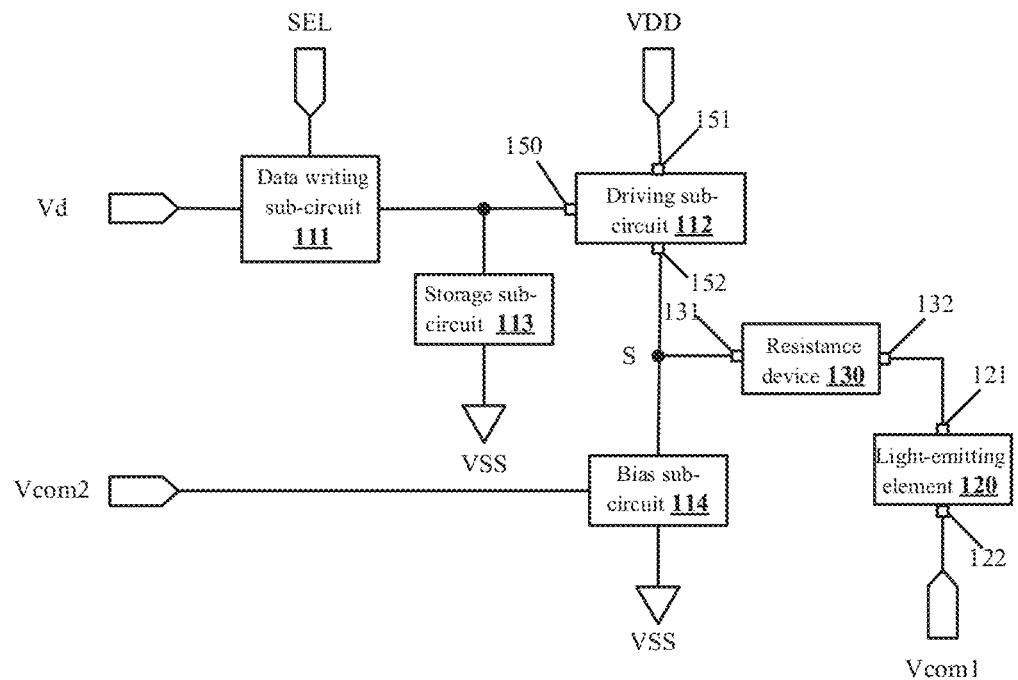
FIG. 2A is a second pixel circuit diagram provided by at least one embodiment of the present disclosure.

FIG. 2A is a schematic diagram of a pixel circuit provided by at least one embodiment of the present disclosure. As shown in FIG. 2A, the pixel circuit further includes the resistance device 130, the first terminal 131 of the resistance device 130 is electrically connected with the second electrode 152 of the driving sub-circuit 112, and the second terminal 132 is electrically connected with the first electrode 121 of the light-emitting element 120, that is, the second electrode 152 of the driving sub-circuit 112 is electrically connected with the first electrode 121 of the light-emitting element 120 through the resistance device 130.

For example, the resistance device 130 is a constant resistor or a variable resistor, and may also be an equivalent resistor formed by other devices (such as a transistor).

For example, the resistance device 130 and the control electrode 150 of the driving sub-circuit 112 are arranged in a same layer and insulated from each other, and a resistivity of the resistance device is higher than a resistivity of the control electrode of the driving sub-circuit; that is, a conductivity of the control electrode of the driving sub-circuit is higher than a conductivity of the resistance device. For example, the resistivity of the resistance device is more than ten times of the resistivity of the control electrode.

It should be noted that the "in a same layer" mentioned in the present disclosure refers to forming two (or more than two) structures through a same deposition process and patterning them through a same patterning process, and the materials of the structures can be the same or different. For example, the materials for forming precursors of the structures arranged in the same layer are the same, and the finally formed materials may be the same or different. The "an integrated structure" in the present disclosure refers to an interconnected structure formed by forming two (or more than two) structures through a same deposition process and patterning them through a same patterning process, and the materials of the structures can be the same or different.

Through this arrangement, the control electrode of the driving sub-circuit and the resistance device can be formed in the same patterning process, thereby saving process.

For example, both a material of the resistance device and a material the control electrode of the driving sub-circuit are polysilicon materials, and a doping concentration of the resistance device is lower than a doping concentration of the control electrode, thus the resistance device has a higher resistivity than the control electrode. For example, the resistance device may be intrinsic polysilicon or lightly doped polysilicon, and the control electrode may be heavily doped polysilicon.

In other examples, the material of the control electrode is different from the material of the resistance device. For example, the material of the control electrode may include a metal and the material of the resistance device may comprise a metal oxide corresponding to the metal. For example, the metal may include gold (Au), silver (Ag), copper (Cu), aluminum (Al), molybdenum (Mo), magnesium (Mg), tungsten (W), and alloy materials composed of the above metals.

In at least one embodiment of the present disclosure, the data writing sub-circuit 111 may include a transmission gate circuit composed of two complementary transistors in parallel connection with each other; the control signal includes two inverted control signals. The data writing sub-circuit 111 adopts a circuit in a transmission gate structure, which can help to transmit the data signal to the first terminal of the storage sub-circuit 113 with no loss.

For example, the data writing sub-circuit includes a first control electrode, a second control electrode, a first terminal and a second terminal, the first control electrode and the second control electrode of the data writing sub-circuit are respectively configured to receive a first control signal and a second control signal, the first terminal of the data writing sub-circuit is configured to receive a data signal, and the second terminal of the data writing sub-circuit is electrically connected to the first terminal of the storage sub-circuit, and is configured to transmit the data signal to the first terminal of the storage sub-circuit in response to the first control signal and the second control signal.

It should be noted that in the description of the embodiments of the present disclosure, the first node S does not necessarily represent an actual component, but represents a junction for connecting related circuits in a circuit diagram.

It should be noted that in the description of the embodiments of the present disclosure, the symbol Vd can represent both the data signal terminal and a level of the data signal, similarly, the symbol SEL can represent both a control signal and a control signal terminal, the symbols Vcom1 and Vcom2 can represent a first common voltage and a second common voltage, and can also represent a first common voltage terminal and a second common voltage terminal; the symbol VDD can represent both a first voltage terminal and a first power voltage, and the symbol VSS can represent both a second voltage terminal and a second power voltage. The case is the same in the following embodiments and is not repeated.

Figure 2B:
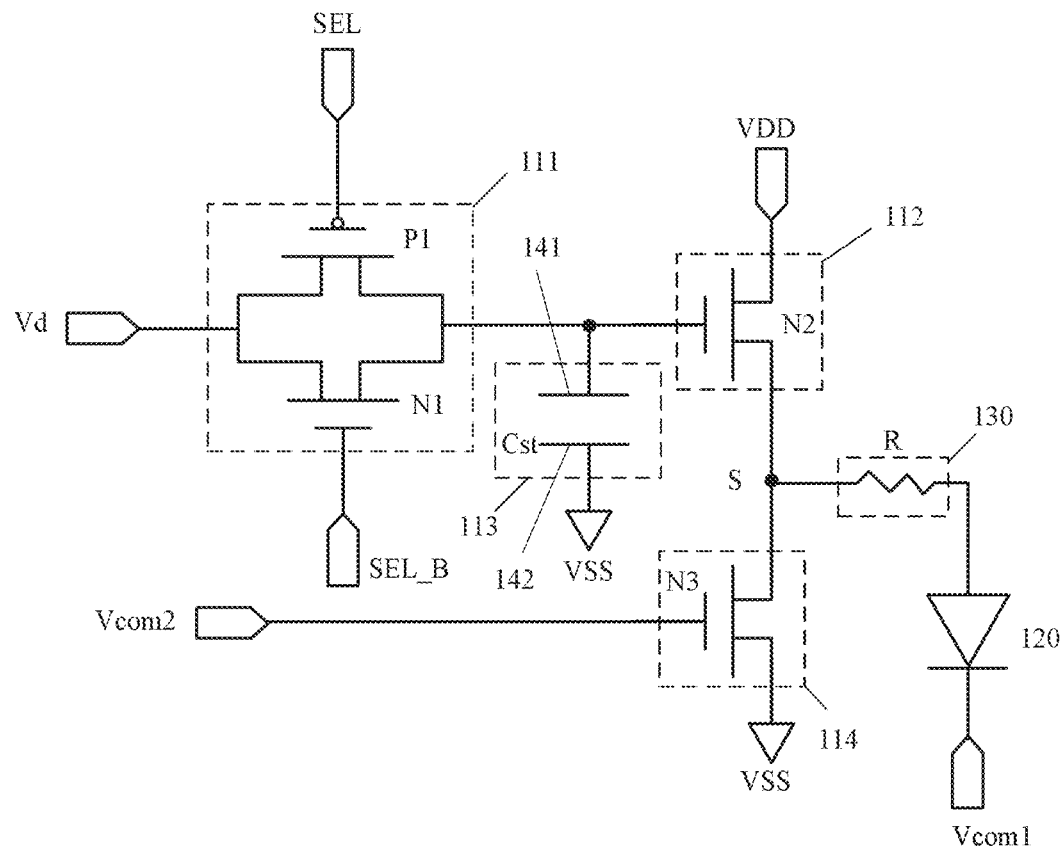
FIG. 2B is a third pixel circuit diagram provided by at least one embodiment of the present disclosure.

FIG. 2B shows a circuit diagram of a specific implementation example of the pixel circuit shown in FIG. 2A. As shown in FIG. 2B, the data writing sub-circuit 111 includes a first data writing transistor P1 and a second data writing transistor N1 that are connected in parallel with each other. The first data writing transistor P1 and the second data writing transistor N1 are a P-type metal-oxide semiconductor field effect transistor (PMOS) and an N-type metal-oxide semiconductor field effect transistor (NMOS), respectively. The control signal includes a first control signal SEL and a second control signal SEL_B that are inverted to each other, a gate electrode of the first data writing transistor P1 serves as the first control electrode of the data writing sub-circuit, and is configured to receive the first control signal SEL, a gate electrode of the second data writing transistor N1 serves as the second control electrode of the data writing sub-circuit, and is configured to receive the second control signal SEL_B. The first electrode of the second data writing transistor N1 and the first electrode of the first data writing transistor P1 are electrically connected and serve as the first terminal of the data writing sub-circuit, and are configured to receive a data signal Vd; the second electrode of the second data writing transistor N1 and the second electrode of the first data writing transistor P1 are electrically connected and serve as the second terminal of the data writing sub-circuit, and is electrically connected with the control electrode 150 of the driving sub-circuit 112.

For example, the first data writing transistor P1 and the second data writing transistor N1 have a same size and a same channel width to length ratio.

The data writing sub-circuit 111 take advantages of the complementary electrical characteristics of the transistors and has a low on-state resistance regardless of whether transmitting a high level or a low level, so that the data writing sub-circuit 111 has an advantage of electrical signal integrity in the transmission, and can transmit the data signal Vd to the first terminal of the storage sub-circuit 113 without loss.

For example, as shown in FIG. 2B, the driving sub-circuit 112 includes a driving transistor N2, for example, the driving transistor N2 is NMOS. The gate electrode, the first electrode and the second electrode of the driving transistor N2 serve as the control electrode, the first electrode and the second electrode of the driving sub-circuit 112, respectively.

For example, the storage sub-circuit 113 includes a storage capacitor Cst, the storage capacitor Cst includes a first capacitor electrode 141 and a second capacitor electrode 142, and the first capacitor electrode 141 and the second capacitor electrode 142 serve as the first terminal and the second terminal of the storage sub-circuit 113, respectively.

For example, the resistance device 130 includes a resistor R. For example, a PN junction is formed between the second electrode 152 of the driving sub-circuit 112 and the base substrate, a resistance value of the resistance device 130 is configured that in a case that the driving transistor N2 is operating in a saturation region, that is, in a case that the pixel circuit operates to drive the light-emitting element 120 to emit light, the PN junction is turned off. In this situation, even if a short circuit occurs between the two electrodes of the light-emitting element 120, because a voltage drop is occurred on the resistance device 130, the potential of the second electrode 152 can be protected, so that the occurrence of the failure of the circuit is avoided.

For example, the resistance value R of the resistance device 130 meets:

$$R > \frac{|Vs - Von - Vcom1|}{Is},$$

where Vs is a bias voltage of the base substrate, Vcom1 is the first common voltage provided for the second electrode of the light-emitting element, Von is the turn-on voltage of the PN junction, and Is is a saturation current of the driving transistor N2 working in the saturation region, that is $\frac{1}{2}\mu_n C_{ox} W/L(Vgs\ Vth)^2$, where $\mu_n$ is a carrier mobility of the driving transistor, $C_{ox}$ is a capacitance per unit area of the gate insulating layer, W/L is a width to length ratio of the channel region, Vgs is a voltage difference between the gate electrode and the source electrode of the driving transistor, and Vth is a threshold voltage of the driving transistor. For example, the turn-on voltage Von ranges from 0.6V to 0.7V. Through the above arrangement, it can be ensured that the PN junction formed between the second electrode 152 of the driving sub-circuit 112 and the base substrate is turned off in a case that the driving transistor N2 is working in the saturation region.

For example, the light-emitting element 120 is specifically implemented as an organic light-emitting diode (OLED). For example, the light-emitting element 120 may be an OLED with a top emitting structure, which may emit red light, green light, blue light, or white light. For example, the light-emitting element 120 is a micro OLED. The embodiments of the present disclosure do not limit the specific structure of the light-emitting element. For example, the first electrode 121 of the light-emitting element 120 is an anode of the OLED, the second electrode 122 is a cathode of the OLED, that is, the pixel circuit has a common cathode structure. However, the embodiments of the present disclosure are not limited thereto; the pixel circuit may also be in a common anode structure according to the change of the circuit structure.

For example, the bias sub-circuit 114 includes a bias transistor N3, and the gate electrode, the first electrode and the second electrode of the bias transistor N3 serve as the control terminal, the first terminal and the second terminal of the bias sub-circuit 114, respectively.

Figure 2C:
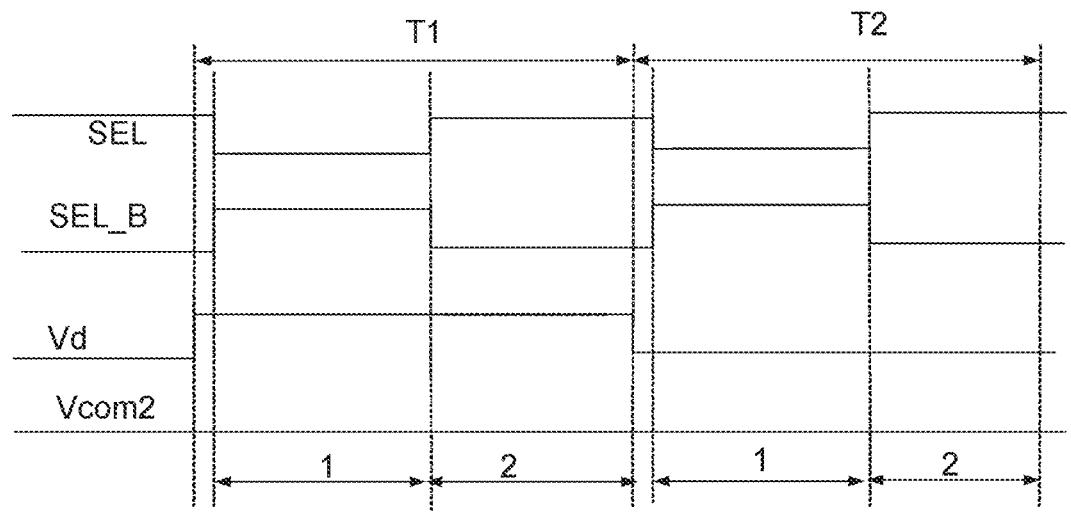
FIG. 2C is a signal timing diagram of a pixel circuit provided by at least one embodiment of the present disclosure.

FIG. 2C shows a signal timing diagram of the pixel circuit shown in FIG. 2B, the working principle of the pixel circuit shown in FIG. 2C is described below in conjunction with the signal timing diagram shown in FIG. 2B. For example, the second data writing transistor, the driving transistor, and the bias transistor are all N-type transistors, and the first data writing transistor is a P-type transistor, however, the embodiments of the present disclosure are not limited thereto.

FIG. 2C shows waveform diagrams of each signal in two consecutive display periods T1 and T2, for example, the data signal Vd is a high gray-scale voltage during the display period T1, and the data signal Vd is a low gray-scale voltage during the display period T2.

For example, as shown in FIG. 2C, a display process of each frame of image includes a data writing stage 1 and a light-emitting stage 2. A working process of the pixel circuit includes: in the data writing stage 1, both the first control signal SEL and the second control signal SEL_B are turn-on signals, the first data writing transistor P1 and the second data writing transistor N1 are turned on, the data signal Vd is transmitted to the gate electrode of the driving transistor N2 through the first data writing transistor P1 and the second data writing transistor N1; in the light-emitting stage 2, both the first control signal SEL and the second control signal SEL_B are off signals, due to a bootstrap effect of the storage capacitor Cst, the voltage across the storage capacitor Cst remains unchanged, the driving transistor N2 works in a saturated state and has an unchanged current, and drives the light-emitting element 120 to emit light. In a case that the pixel circuit enters the display period T2 from the display period T1, the data signal Vd changes from a high gray-scale voltage to a low gray-scale voltage, the bias transistor N3 under the control of the second common voltage Vcom2 generates a stable drain current which can quickly discharge the charge stored in the anode of the OLED in a case that the display gray scale of the OLED needs to change rapidly. For example, the discharge process occurs during data writing stage 1 in the display period T2, and thus in the light-emitting stage 2 of the display period T2, the voltage of the anode of the OLED can be rapidly reduced, so that a better dynamic contrast is achieved, and the display effect is improved.

Referring to FIG. 2B, for example, in the light-emitting stage, a light-emitting current of the light-emitting element OLED is on the order of nanoamperes (for example, a few nanoamperes) in a case that the light-emitting element OLED is written in a gray-scale data, while the bias transistor N3 generates a current generated on the order of microamperes (for example, 1 microampere) while working in the saturation region under the control of the bias signal, i.e. the second common voltage Vcom2, and thus almost all the current flowing through the driving transistor N2 flows into the bias transistor N3, the current of the driving transistor N2 and the current of the bias transistor N3 can be regarded as the same, that is $\frac{1}{2}\mu_n C_{ox} W/L(Vgs1-Vth1)^2 = \frac{1}{2}\mu_n C_{ox} W/L(Vgs2-Vth2)^2$, here it is assumed that the driving transistor N2 and the bias transistor N3 have a same transistor conductivity $\mu_n C_{ox} W/L$, then it is obtained that Vgs1−Vth1=Vgs2−Vth2, in which Vgs1 and Vth1 are the voltage difference Vgs1 between the gate electrode and the source electrode of the driving transistor N2 and the threshold voltage of the driving transistor N2, respectively; Vgs2 and Vth2 are the voltage difference between the gate electrode and the source electrode of the bias transistor N3 and the threshold voltage of the bias transistor N3, respectively; and because Vgs2−Vth2=Vcom2−VSS−Vth2, which is a fixed value, denoted as K0, that is, Vgs1−Vth1=K0, Vd−V0−Vth1=K0, in which Vd is the data signal held at the gate electrode of the driving transistor N2 during the light-emitting stage, V0 is the voltage at the first node S. In this way, it can be concluded that the voltage V0 at the first node S has a linear relationship with the data signal (data voltage) Vd.

For example, the bias transistor N3 works in a saturation region under the control of the bias signal Vcom2, and a difference between a voltage of the gate electrode and a voltage of the source electrode of the bias transistor is Vcom2−VSS and is a fixed value; according to the above formular of a current of the transistor in a saturation region, the current flowing through the bias transistor N3 in this situation is a constant current, so the bias transistor N3 can be regarded as a current source.

For example, in the case that the first node S is directly electrically connected with the light-emitting element 120, the voltage V0 is directly applied to the first electrode 121 of the light-emitting element 120, and is an anode voltage of the OLED for example; in a case that the first node S is electrically connected with the light-emitting element 120 through the resistance device 130, because the current flowing through the light-emitting element 120 is extremely small, a voltage of the first node S can be approximately equal to a voltage of the first electrode 121 of the light-emitting element 120; that is, the voltage of the first electrode 121 of the light-emitting element 120 is in a linear relationship with the data signal (data voltage) Vd, so that a fine control of the gray scale can be realized, and the display effect can be improved.

For example, the first control signal SEL and the second control signal SEL_B are differential complementary signals with a same amplitude but opposite phases, which helps to improve an anti-interference performance of the circuit. For example, the first control signal SEL and the second control signal SEL_B can be output by a same gate driving circuit unit (such as a GOA unit), thereby simplifying the circuit.

For example, as shown in FIG. 1A, the display substrate 10 may further include a data driving circuit 13 and a scan driving circuit 14. The data driving circuit 13 is configured to send out a data signal, such as the above-mentioned data signal Vd, as required (for example, inputting an image signal to the display device). The scan driving circuit 14 is configured to output various scanning signals, for example, including the above-mentioned first control signal SEL and second control signal SEL_B, for example, the scan driving circuit 14 is an integrated circuit chip (IC) or a gate driving circuit (GOA) directly manufactured on the display substrate.

For example, the display substrate uses a silicon substrate as the base substrate 101, the pixel circuit, the data driving circuit 13 and the scan driving circuit 14 can all be integrated on the silicon substrate. In this case, since the silicon-based circuit can achieve a higher accuracy, the data driving circuit 13 and the scan driving circuit 14 may also be formed, for example, in a region corresponding to the display region of the display substrate, and are not necessarily located in the non-display region.

For example, the display substrate 10 further includes a control circuit (not shown). For example, the control circuit is configured to control the data driving circuit 13 to apply the data signal Vd, and to control the gate driving circuit 13 to apply various scanning signals. An example of the control circuit is a timing control circuit (T-con). The control circuit can be in various forms, for example, including a processor and a memory, the memory includes executable code, and the processor runs the executable code to execute the above detection method.

For example, the processor may be a central processing unit (CPU) or another form of processing device with data processing capability and/or instruction execution capability, for example, may include a microprocessor, a programmable logic controller (PLC), and so on.

For example, the storage device may include one or more computer program products, the computer program product may include various forms of computer-readable storage media, such as a volatile memory and/or a non-volatile memory. The volatile memory may include, for example, a random access memory (RAM) and/or a cache memory. The non-volatile memory may include, for example, a read-only memory (ROM), a hard disk, a flash memory, and so on. One or more computer program instructions can be stored on a computer-readable storage medium, and the processor 121 can execute functions expected by the program instructions. Various application programs and various data can also be stored in the computer-readable storage medium, for example, the electrical characteristic parameters obtained in the above detection method.

The following uses the pixel circuit shown in FIG. 2B as an example to illustrate the display substrate provided by at least one embodiment of the present disclosure, but the embodiments of the present disclosure are not limited thereto.

Figure 3A:
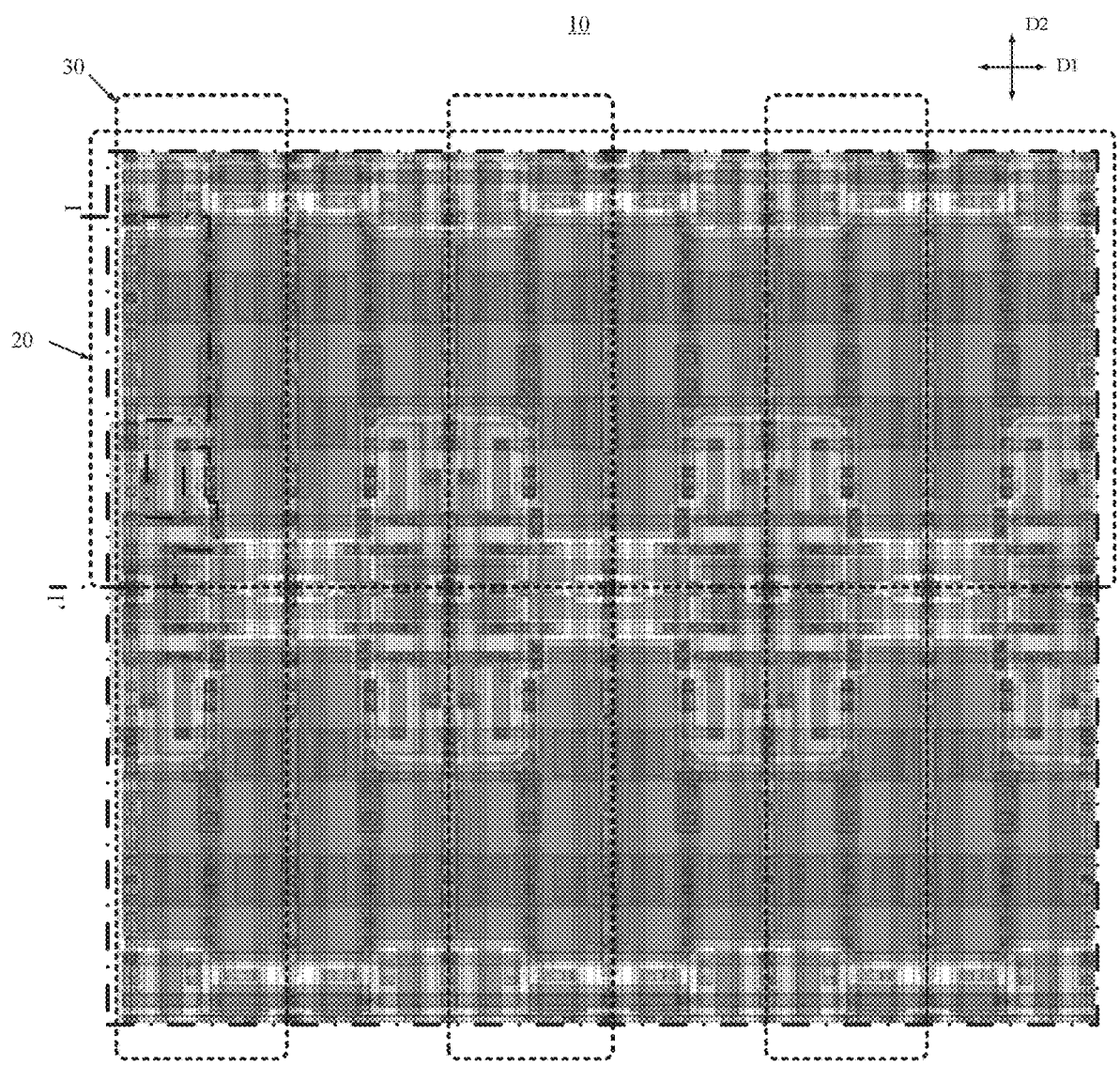
FIG. 3A is a second schematic diagram of a display substrate provided by at least one embodiment of the present disclosure.

FIG. 3A is a schematic diagram of a display substrate 10 provided by at least one embodiment of the present disclosure. For example, as shown in FIG. 3A, the display substrate 10 includes a base substrate 101, and a plurality of sub-pixels 100 are located on the base substrate 101. The plurality of sub-pixels 100 are arranged as a sub-pixel array, a row direction of the sub-pixel array is a first direction D1, a column direction of the sub-pixel array is a second direction D2, and the first direction D1 intersects the second direction D2, for example, the first direction D1 is orthogonal to the second direction D2. FIG. 3A exemplarily shows two rows and six columns of sub-pixels, that is, two pixel rows 20 and six pixel columns 30, and uses dashed-line frames to respectively show the regions of three pixel columns spaced apart from each other.

For example, the base substrate 101 may be a rigid substrate, such as a glass substrate, a silicon substrate, etc., and can also be formed of flexible materials with excellent heat resistance and durability, such as polyimide (PI), polycarbonate (PC), polyethylene terephthalate (PET), polyethylene, polyacrylate, polyaryl compounds, polyetherimide, polyether Sulfone, polyethylene glycol terephthalate (PET), polyethylene (PE), polypropylene (PP), polysulfone (PSF), polymethyl methacrylate (PMMA), triacetyl cellulose (TAC), cyclic olefin polymer (COP) and cyclic olefin copolymer (COC), etc. The embodiments of the present disclosure are described by always taking the base substrate 101 as a silicon substrate as an example, however, the embodiment of the present disclosure does not limit to this.

For example, the base substrate 101 includes monocrystal silicon or high-purity silicon. The pixel circuit is formed on the base substrate 10 through a CMOS semiconductor process, for example, an active region of the transistor (including the channel region, the first electrode and the second electrode of the transistor) is formed in the base substrate 101 through a doping process, each insulating layer is formed by a silicon oxidation process or a chemical vapor deposition process (CVD), and a plurality of conductive layers are formed by a sputtering process to form wiring structures. The active region of each of the transistors is located inside the base substrate 101.

Figure 3B:
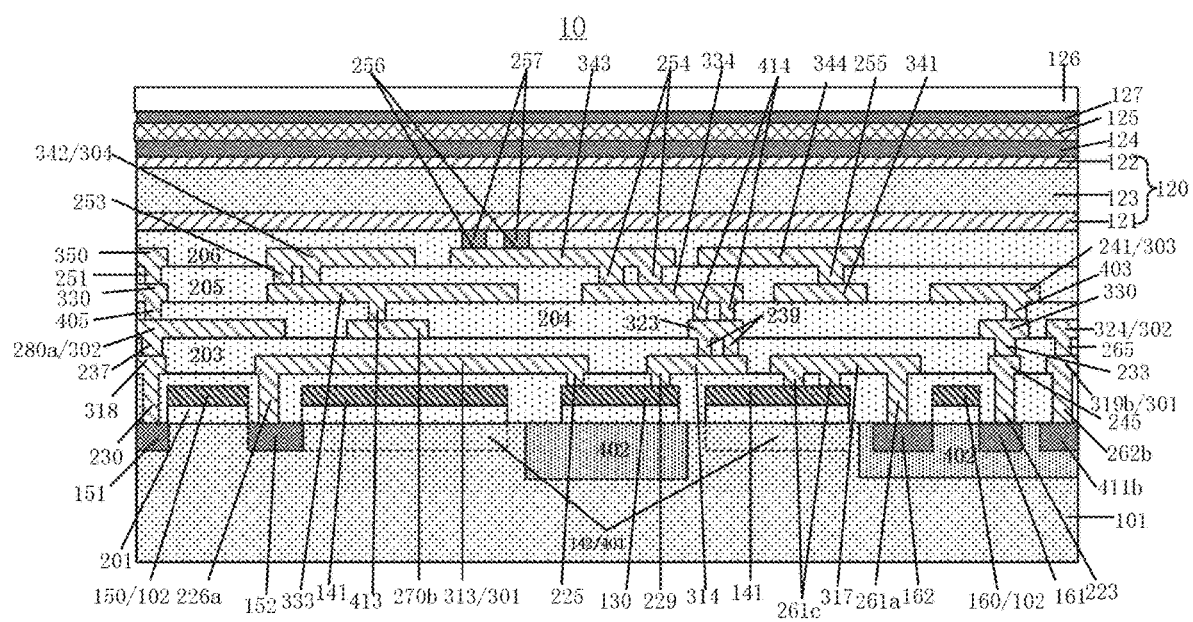
FIG. 3B is a schematic diagram of the display substrate shown in FIG. 3A along a section line I-I'.

FIG. 3B shows a cross-sectional schematic diagram of FIG. 3A along a section line I-I'. For clarity, some traces or electrode structures that are not directly connected are omitted in FIG. 3B.

For example, as shown in FIG. 3B, the display substrate 10 includes a base substrate 101, a first insulating layer 201, a polysilicon layer 102, a second insulating layer 202, a first conductive layer 301, a third insulating layer 203, a second conductive layer 302, a fourth insulating layer 204, a third conductive layer 303, a fifth insulating layer 205 and a fourth conductive layer 304 that are sequentially located on the base substrate 101. In the following, the structure of the display substrate 10 will be described hierarchically, and FIG. 3B will be used as a reference and will be described together.

Figure 4A:
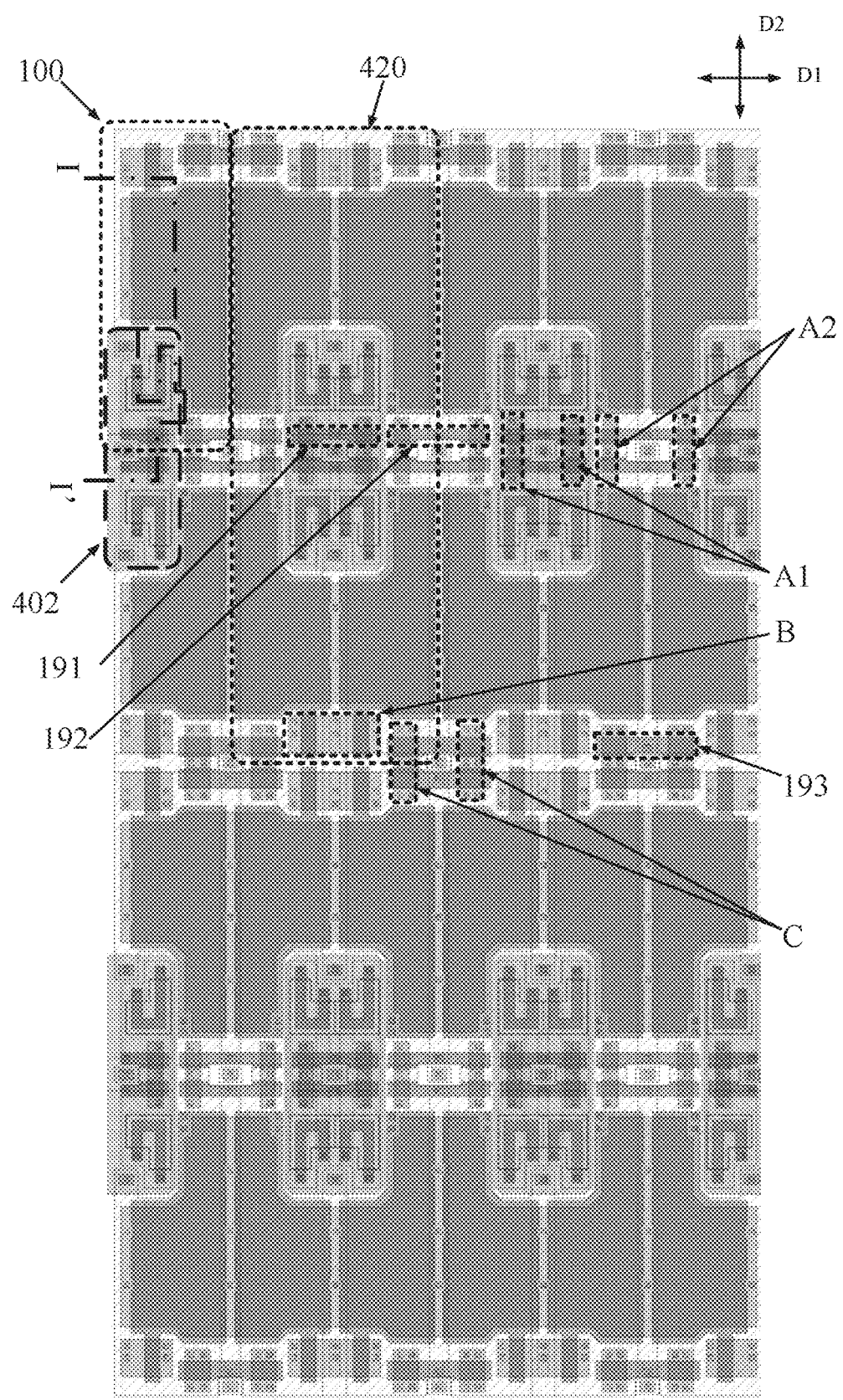
FIG. 4A is a third schematic diagram of a display substrate provided by at least one embodiment of the present disclosure.
Figure 4B:
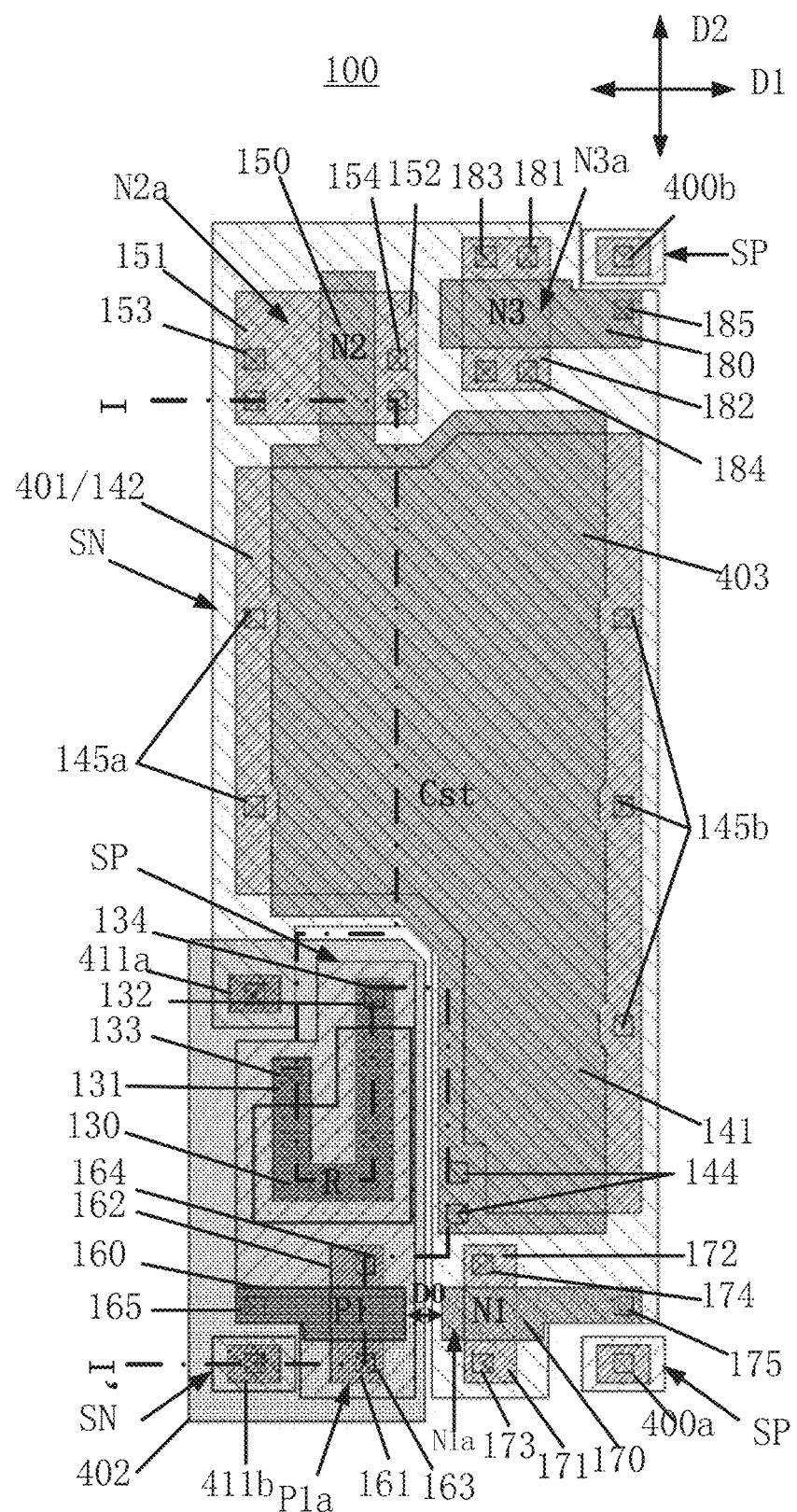
FIG. 4B is an enlarged schematic diagram of one sub-pixel of a display substrate provided by at least one embodiment of the present disclosure.

For clarity and convenience of description, FIG. 4A shows a portion of the display substrate 10 located below the first conductive layer 301, that is, the base substrate 101 and the first insulating layer 201 and the polysilicon layer 102 on the base substrate 101, including each of the transistors (P1, N1-N3), a storage capacitor Cst, and a resistance device 130; FIG. 4B shows an enlarged schematic diagram of a sub-pixel 100 in FIG. 4A; for clarity, the section line I-I' in FIG. 3A is also correspondingly shown in FIG. 4A, FIGS. 5A to 5E show a formation process of the substrate structure shown in FIG. 4A.

As shown in FIG. 4B, for example, in a direction parallel to a plate surface of the base substrate 101, the first data writing transistor P1 and the driving transistor N2 are on opposite sides of the storage capacitor Cst, for example, are on opposite sides of the storage capacitor Cst in the second direction D2.

With reference to FIG. 1C, this arrangement helps to increase a distance between the first data writing transistor P1 and the driving transistor N2, so that the resistance of the parasitic circuit is increased, and the risk of the failure of the CMOS circuit is further reduced.

For example, a material of the second capacitor electrode 142 of the storage capacitor 140 is a conductor or a semiconductor. For example, as shown in FIG. 3B and FIG. 4B, the second capacitor electrode 142 of the storage capacitor 140 is a first region 401 of the base substrate 101; for example, the base substrate 101 is a P-type silicon-based substrate, and the material of the second capacitor electrode 142 is P-type monocrystal silicon. In a case that a voltage is applied to the first capacitor electrode 141, the semiconductive first region 401 located under the first capacitor electrode 141 in the base substrate 101 forms an inversion region and becomes a conductor, so that the first region 401 is electrically connected with the contact hole regions (the contact hole regions 145a and 145b as shown in FIG. 4B) on both sides of the first region 401. In this case, no additional doping process is performed on the first region 401.

In another example, the first region 401 is, for example, a conductive region in the base substrate 101, such as a heavily doped region, so that the second capacitor electrode 142 can obtain a stable and higher conductivity.

For example, the base substrate 101 further includes a second region 402, and the second region 402 is an N-type well region in the base substrate 101. As shown in FIG. 4B, for example, the first data writing transistor P1 and the resistance device 130 are arranged side by side in the second direction D2 in the second region 402. Arranging the resistance device 130 made of polysilicon material in the N-type substrate helps to reduce parasitic effects, and improve the circuit characteristics.

For example, in a direction parallel to the plate surface of the base substrate 101, the resistance device (R) 130 and the first data writing transistor P1 are located on a same side of the second capacitor electrode 142. For example, in a direction parallel to the surface of the base substrate 101, the driving transistor N2 and the bias transistor N3 are located on a same side of the second capacitor electrode 142.

For example, as shown in FIG. 4B, the first data writing transistor P1 and the second data writing transistor P1 are arranged side by side in the first direction D1, and are symmetrical about a symmetry axis along the second direction D2. For example, the gate electrode 160 of the first data writing transistor P1 and the gate electrode 170 of the second data writing transistor N1 are arranged side by side in the first direction D1, and are symmetrical about the symmetry axis along the second direction D2.

For example, the resistance device 130 is a U-shaped structure, such as an asymmetrical U-shaped structure, for example, lengths of two branches of the U-shaped structure are not equal. For example, as shown in FIG. 4B, the second terminal 132 of the resistance device 130 is closer to the driving transistor N2.

The resistance device 130 arranged as a U-shaped structure helps to save a layout area occupied by the resistance device, so that the space utilization of the layout is improved, which helps to improve a resolution of the display substrate. For example, in a same space, the resistance device with the U-shaped structure can increase the length of the resistance device, so that a desired resistance value is obtained.

In addition, a design of the resistance device 130 as an asymmetric structure is also to make a reasonable use of the layout space. For example, as shown in FIG. 4B, a contact hole region 411a is designed above a shorter branch of the U-shaped resistor. The contact hole region 411a is side by side with the second terminal 132 of the resistance device 130 in the first direction D1. For example, the contact hole region 411a is an N-type heavily doped region (N+). For example, the contact hole region 411 is used to bias the well region 401 where the first data writing transistor P1 is located, so that a threshold voltage change caused by parasitic effects such as a substrate bias effect is avoided, and the stability of the circuit is improved. For example, referring to FIG. 3B, by applying a low-voltage bias to the P-type substrate 101 and a high-voltage bias to the N-type well region 402, the parasitic PN junction between the P-type substrate 101 and the N-type well region 402 can be reversely biased, so that electrical isolate between devices is realized, the parasitic effect between the devices is reduced, and the stability of the circuit is improved.

For example, an opening of the U-shaped structure faces the first capacitor electrode 141, the first terminal 131 and the second terminal 132 of the resistance device 130 are respectively located at two ends of the U-shaped structure. As shown in the figure, the first terminal 131 of the resistance device 130 is provided with a contact hole region 133 for electrically connecting with the gate electrode 150 of the driving transistor N2; the second terminal 132 of the resistance device 130 is provided with a contact hole region 134 for electrical connection with the first electrode 121 of the light-emitting element 120.

For example, the material of the resistance device 130 includes polysilicon material, the contact hole regions 133 and 134 are doped regions for reducing contact resistance; a body region of the resistance device 130 other than the contact hole region is, for example, an intrinsic region or a low-doped region, so that a desired resistance value is obtained.

For example, the first capacitor electrode 141 of the storage capacitor 140 and the resistance device 130 are arranged in a same layer and insulated from each other, and both include a polysilicon material; and a doping concentration of the first capacitor electrode 141 of the storage capacitor 140 is higher than a doping concentration of the body region of the resistance device 130. For example, the body region of the resistance device 130 is an intrinsic polysilicon material.

For example, the gate electrodes 160, 170, 150, and 180 of the transistors P1, N1 to N3 and the first capacitor electrode 141 of the storage capacitor 140 are arranged in a same layer, and all include a polysilicon material. For example, as shown in FIG. 4B, the gate electrode 150 of the driving transistor N2 and the first capacitor electrode 141 are connected with each other as an integral structure.

FIG. 4B also shows active regions P1a, N1a, N2a, and N3a of the transistors P1, N1 to N3, respectively, and shows a first electrode 161 and a second electrode 162 of the first data writing transistor P1, a first electrode 171 and a second electrode 172 of the second data writing transistor N1, a first electrode 151 and a second electrode of the driving transistor N2, a first electrode 181 and a second electrode 182 of the bias transistor N3.

FIG. 4B also shows a gate contact region 165, a first contact region 163, and a second electrode contact region 164 of the first data writing transistor P1, a gate contact region 175, a first contact region 173, and a second electrode contact region 174 of the second data writing transistor N1, a gate contact region 155, a first contact region 153 and a second electrode contact region 154 of the driving transistor N2, and a gate contact region 185, a first contact region 183, and a second electrode contact region 184 of the bias transistor N3. For example, each of the first electrode contact regions is a region where the corresponding first electrode is used to form electrical contacts, each of the second electrode contact regions is a region where the corresponding second electrode contact region is used to form electrical contacts, and each of the gate contact region is an area where the corresponding gate electrode is used to form electrical contacts.

For example, the active region P1a of the first data writing transistor P1 and the active region N1a of the second data writing transistor N1 are arranged side by side in the first direction D1, and are symmetrical about a symmetry axis along the second direction D2.

As shown in FIG. 4B, an area of the active region N2a of the driving transistor N2 is larger than an area of other transistors, so that a greater width to length ratio can be obtained, which helps to improve the driving capability of the driving transistor N2 and improve the display effect.

As shown in FIG. 4B, for the transistor with a larger active region, such as the drive transistor N2 and the bias transistor N3, since the space is enough, at least two contact hole regions can be respectively provided on the first electrode and the second electrode of the drive transistor N2 and the bias transistor N3, So that the drive transistor N2 and the bias transistor N3 can get sufficient contact with the structure to be connected and form a parallel structure, thereby reducing the contact resistance.

FIG. 4B also shows a contact hole region 144 on the first capacitor electrode 141 and contact hole regions 145a and 145b that are configured to be electrically connected with the second capacitor electrode 142. As shown in FIG. 4B, the first capacitor electrode 141 and the second capacitor electrode 142 are respectively arranged with at least two contact hole regions to reduce the contact resistance.

With reference to FIG. 4A, the transistors (including the shape and size of each transistor, etc.), the storage capacitors, and the resistance devices in two sub-pixels 100 adjacent in the first direction D1 are symmetrical about a symmetry axis along the second direction D2 respectively, that is, the corresponding structures in the two sub-pixels are respectively symmetrical about the symmetry axis along the second direction D2. The transistors in two sub-pixels 100 adjacent in the second direction D2 is axially symmetrical with respect to a symmetry axis along the first direction.

The symmetrical arrangement can maximize a uniformity of process errors, so that a uniformity of the display substrate is improved. In addition, the symmetrical arrangement allows some structures in the substrate that are arranged in a same layer and are connected with each other to be integrally formed, compared with separate arrangements, the symmetrical arrangement can make the pixel layout more compact, and improves the space utilization, so that the resolution of the display substrate is improved.

For example, as shown in FIG. 4A, second regions 402 of two sub-pixels 100 adjacent in the first direction D1 are in an integral structure, second regions 402 of two sub-pixels 100 adjacent in the second direction D2 are in an integral structure, that is, the first data writing transistor N1 and the resistance device 130 in the four adjacent sub-pixels 100 are located in a same well region. Compared with separate well regions, this arrangement can make the arrangement of pixels more compact under the premise of meeting the design rules, which helps to improve the resolution of the display substrate.

For example, as shown in FIG. 4A, the active regions P1a of the first data writing transistors P1 of two sub-pixels adjacent in the second direction D2 are connected with each other as an integral structure, that is, the active regions P1a of the two first data writing transistors P1 are located in a same doped region A1 (P well) of the same second region 402, and the first electrodes of the two first data transistors P1 are connected with each other as an integral structure, to receive the same data signal Vd.

For example, as shown in FIG. 4A, the active regions N1a of the second data writing transistors N1 of two sub-pixels adjacent in the second direction D2 are connected with each other as an integral structure, that is, the active regions N1a of the two second data writing transistors N1 are located in a same doped region A2 (N-well) of the base substrate 101, and the first electrodes of the two second data writing transistors N1 are connected with each other as an integral structure, to receive the same data signal Vd.

For example, as shown in FIG. 4A, the gate electrodes of the first data writing transistor P1 or the gate electrodes of the second data writing transistor N2 of two sub-pixels 100 adjacent in the first direction D1 are connected with each other to form an integral structure.

Since for each row of pixels, the gate electrodes of the first data writing transistor P1 are all configured to receive the same first control signal SEL, and the gate electrodes of the second data writing transistor N1 are all configured to receive the same second control signal SEL_B; additionally, since the transistors of the two sub-pixels adjacent in the first direction D1 are mirror-symmetrical, and the case where the first data writing transistor P1 of two sub-pixels are adjacent and the case where the second data writing transistors N1 of two sub-pixels are adjacent happen alternately in the first direction D1; therefore, the gate electrodes of two adjacent first data writing transistors P1 can be directly connected as an integral structure to form a first control electrode group 191, and the gate electrodes of the adjacent second data writing transistors N1 can be directly connected as an integral structure to form a second control electrode group 192. This arrangement can make the arrangement of the pixels more compact on the premise of meeting the design rules, which helps to improve the resolution of the display substrate.

As shown in FIG. 4A, for two sub-pixels 100 adjacent in the first direction D1, in a case that their driving transistors N2 are adjacent to each other, the active regions N2a of the two driving transistors N2 are connected with each other as an integral structure, that is, the active regions N2a of the two driving transistors N2 are located in a same doped region B (N well) of the base substrate 101, and the first electrodes of the two driving transistors N2 are connected with each other as an integral structure to form a third control electrode group 193, to receive the same first power supply voltage VDD; in a case that their bias transistors N3 are adjacent to each other, the gate electrodes of the two bias transistors N3 are connected to each other as an integral structure, to receive the same second common voltage Vcom2; the active regions N3a of the two bias transistors N3 are connected with each other as an integral structure, that is, the active regions N3a of the two bias transistors N3 are located in a same doped region C (N well) of the base substrate 101, and the first electrodes of the two bias transistors N3 are connected with each other to form an integral structure, to receive the same second power voltage VSS.

This arrangement can make the arrangement of the pixels more compact on the premise of meeting the design rules, which helps to improve the resolution of the display substrate.

FIGS. 5A to 5D show the formation process of the substrate structure shown in FIG. 4A, for clarity, only two rows and two columns of sub-pixels are shown in the figure, that is, four adjacent sub-pixels 100 are shown, and the four sub-pixels 100 form a pixel unit group 420. FIG. 4A illustrates the pixel unit group 420 with a dotted box. For example, the display substrate comprises a plurality of pixel unit groups arranged along the first direction and the second direction.

In the following, a forming process of the display substrate provided by the embodiment of the present disclosure will be exemplarily described with reference to FIGS. 5A to 5D, but this is not a limitation of the present disclosure.

For example, a silicon-based substrate is provided, for example, a material of the silicon-based substrate is P-type monocrystalline silicon. N-type transistors (such as driving transistors) can be directly manufactured on the P-type silicon substrate, that is, the P-type substrate serves as the channel region of the N-type transistors, which is conducive to taking advantage of a high speed of NMOS devices, and improves the circuit performance.

Figure 5A:
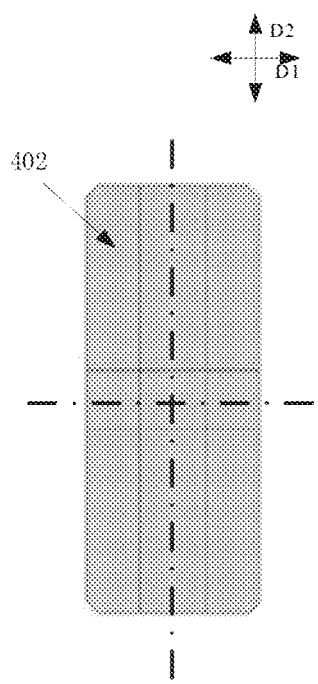
FIGS. 5A to 5E are diagrams showing the manufacturing steps of the display substrate shown in FIG. 4A.

As shown in FIG. 5A, for example, N-type doping is performed on a P-type silicon substrate, to form an N-type well region, that is, the second region 402, which serves as a substrate for the first data writing transistor P1 and the resistance device 130.

For example, the second regions 402 of two sub-pixels adjacent in the first direction D1 may be connected with each other, and the second regions 402 of two sub-pixels adjacent in the second direction D2 may be connected with each other. For example, the region which is not to be doped in the base substrate 101 is shielded while performing the N-type doping treatment.

Figure 5B:
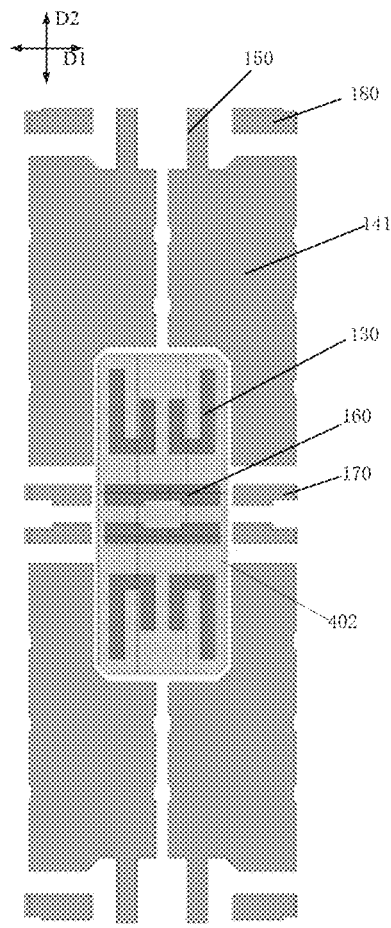

As shown in FIG. 4B and FIG. 5B, for example, a first insulating layer 201 is formed on the base substrate 101, then a polysilicon layer 102 is formed on the first insulating layer 201.

The first insulating layer 201 includes the gate insulating layer of each of the transistors, and further includes a dielectric layer 104 of the storage capacitor Cst. The polysilicon layer 102 includes a first capacitor electrode 141, a resistance device 130, and gate electrodes 150, 160, 170, and 180 of each of the transistors (P1, N1 to N3).

The gate electrode of the first data writing transistor P1 is located in the second region 402, and the N-type well region serves as the channel region of the P-type transistor. The resistance device 130 is also located in the second region 402, that is, an orthographic projection of the resistance device 130 on the base substrate is in the second region 4. Forming the resistance device 130 made of polysilicon material in the N-type substrate helps to reduce parasitic effects and improve the circuit characteristics. Each of the N-type transistors is directly formed on the P-type substrate outside the N-type well region.

For example, as shown in FIG. 5B, the orthographic projections of the first capacitor electrodes 141 of the four sub-pixels in each pixel unit group on the base substrate is outside the second region 402, and surrounds the second region 402. For example, the second region 402 is rectangular, the orthographic projection of the first capacitor electrode 141 of each sub-pixel on the base substrate is around a corner of the rectangle; for example, each first capacitor electrode 141 comprises a concave structure, and an outline of the concave structure is L-shaped, the corner of the rectangle stretches into the orthographic projection of the concave structure and matches the L-shaped outline.

As shown in FIG. 5B, patterns of the polysilicon layers in the two sub-pixels adjacent in the first direction D1 are symmetrical about a symmetry axis along the second direction D2; and patterns of the polysilicon layers in the two sub-pixels adjacent in the second direction D2 are symmetrical about a symmetry axis along the first direction D1; that is, the pattern of the polysilicon layer is a symmetrical pattern. For example, as shown in FIG. 5B, the resistance devices of sub-pixels adjacent in the first direction are symmetrical about a symmetry axis along the second direction, and the resistance devices of sub-pixels adjacent in the second direction are symmetrical about a symmetry axis along the first direction. For example, the first capacitor electrodes of sub-pixels adjacent in the first direction are symmetrical about a symmetry axis along the second direction, and the first capacitor electrodes of sub-pixels adjacent in the second direction are symmetrical about a symmetry axis along the first direction.

For example, the gate electrodes of the first data writing transistor P1 of two sub-pixels adjacent in the first direction D1 are symmetrical about a symmetry axis along the second direction, and the gate electrodes of the second data writing transistor N1 of the two sub-pixels adjacent in the first direction D1 are symmetrical about a symmetry axis along the second direction. For example, the gate electrodes of the first data writing transistor P1 of two sub-pixels adjacent in the first direction D1 are integrally formed, and the gate electrodes of the second data writing transistor N1 of the two sub-pixels adjacent in the first direction D1 are integrally formed.

For example, the gate electrodes of the first data writing transistor P1 of two sub-pixels adjacent in the second direction D2 are symmetrical about a symmetry axis along the first direction, and the gate electrodes of the second data writing transistor N1 of the two sub-pixels adjacent in the second direction D2 are symmetrical about a symmetry axis along the first direction.

For example, the first insulating layer is formed on the base substrate by a thermal oxidation method. For example, a material of the first insulating layer is silicon nitride, oxide or oxynitride.

For example, a polysilicon material layer is formed on the first insulating layer by a chemical vapor deposition process (PVD), then a photolithography process is performed on the polysilicon material layer to form the polysilicon layer 102.

Figure 5C:
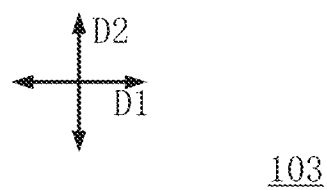
Figure 5C:
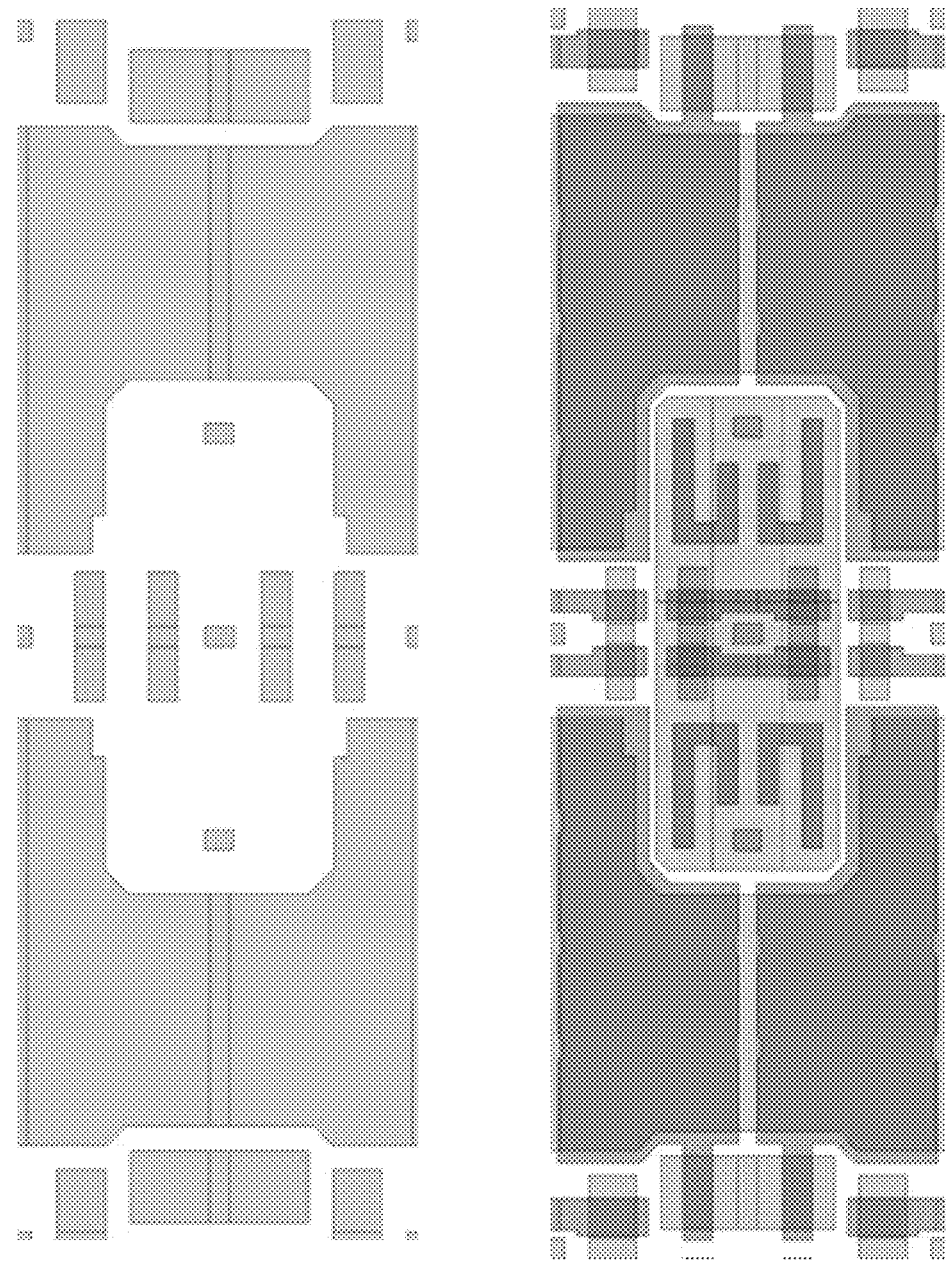

FIG. 5C shows a doping window region 103 of the base substrate (left picture), and also shows the doping window region on the substrate structure as shown in FIG. 5B (right picture). For example, the doping is heavy doping, to form contact hole regions for electrical connection in the base substrate. For example, the doping window region includes the source region and the drain region of each of the transistors. For example, the doping window region also includes the contact hole regions of the substrate and the contact hole regions of the resistance device 130, for example, including the contact hole regions 400a, 400b, 411a, 411b, 145a, 145b, 133, 134 shown in FIG. 4B. For example, since the gate electrode of the transistor is formed of polysilicon material, the polysilicon gate electrode also needs to be doped. In a case that the doping is performed, a barrier layer needs to be formed to cover the non-doped region, and only the corresponding doping window region and amorphous silicon areas are exposed.

It should be noted that FIG. 5C only illustrates each doping window region, in a case that an actual doping process is performed, a corresponding barrier layer/mask layer can be arranged to expose both the corresponding doping window region and the polysilicon region for doping. For example, a material of the barrier layer/mask layer may be photoresist or an oxide material.

Figure 5D:
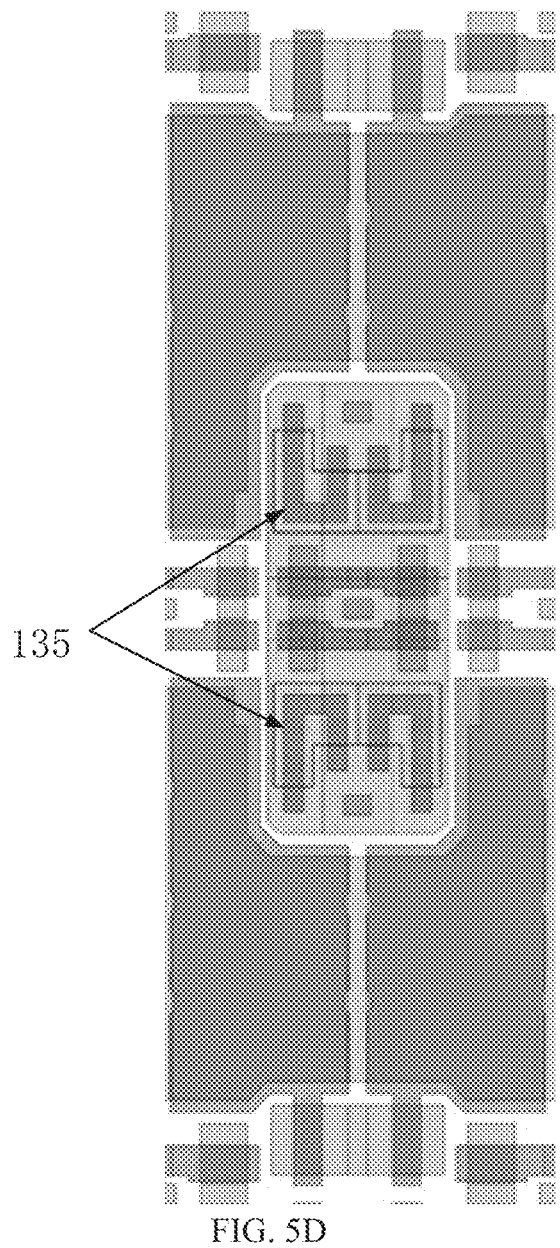

As shown in FIG. 5D, a barrier layer 135 is formed corresponding to the resistance device 130. In order to protect a resistance of the resistance device 130, the resistance device 130 needs to be shielded during the doping process to prevent the resistance device 130 from being damaged due to the doping. The barrier layer 135 covers the main body of the resistance device 130 and only exposes the contact hole regions 133 and 134 at both ends of the resistance device 130.

For example, the barrier layer 135 may be made of silicon nitride, oxide or oxynitride, or a photoresist material. After finishing the doping process, the barrier layer 135 may remain in the display substrate, or may be removed.

In other examples, the barrier layer 135 of the resistance device 130 can also be formed together with barrier layers/mask layers in other regions during doping, which are not limited in the embodiments of the present disclosure.

For example, during the doping process, the N-type doping and the P-type doping need to be performed separately, for example, to form both the source region and the drain region of the N-type transistor and both the source region and the drain region of the P-type transistor. In a case that the N-type doping process is performed, the barrier layer needs to be formed to shield the region where the N-type doping is not to be performed; in a case that the P-type doping process is performed, a barrier layer needs to be formed to shield the region where the P-type doping is not to be performed.

Figure 5E:
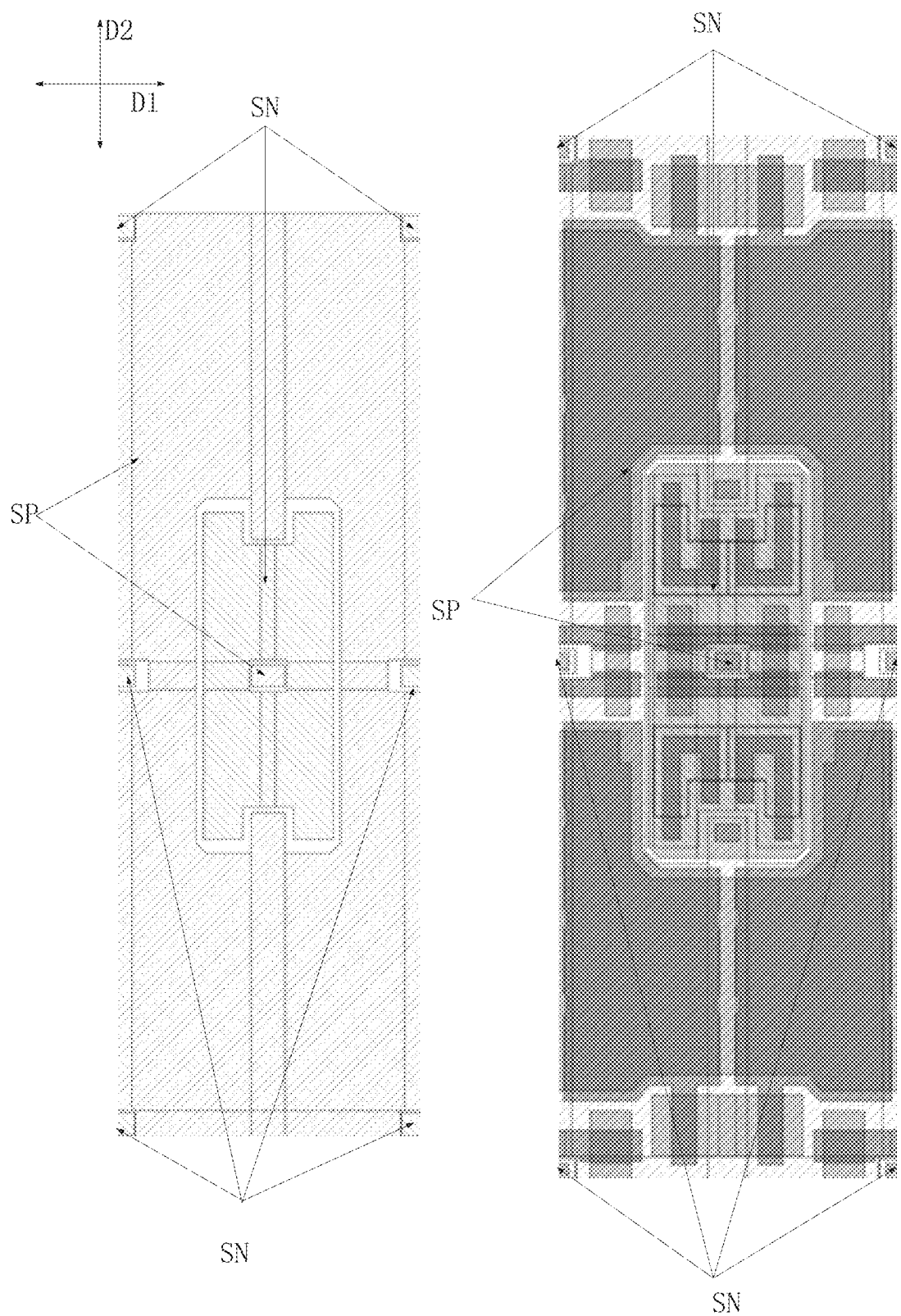

FIG. 5E shows the N-type doped region SN and the P-type doped region SP with different shading patterns (left picture), and also shows the N-type doped region SN and the P-type doped region SP on the substrate shown in FIG. 5D (right picture). The N-type doped region SN and the P-type doped region SP are also shown in FIG. 4B, and can be referred to together.

For example, performing an N-type doping process includes forming a barrier layer to cover the P-type doped region SP, and to cover the region of the N-type doped region SN except for the doping window region and the polysilicon region, and only the doping window region and the polysilicon region in the N-type doped region SN are retained, that is, the SN region overlaps with the doping window region 103 and the polysilicon region shown in FIG. 5C; then an N-type doping process is performed. Referring to FIG. 4B, the gate electrodes, the first electrodes and the second electrodes of the transistors N1 to N3, and the contact hole regions 411a, 411b, 145a, 145b can be formed through the N-type doping process. The N-type doping process may be, for example, an ion implantation process, and the doping element may be, for example, boron element.

For example, performing a P-type doping process includes forming a barrier layer to cover the N-type doped region SN, and to cover the P-type doped region SP except for the doping window region and the polysilicon region, and only the doping window region and the polysilicon region in the P-type doped region SP are retained, that is, the SP region overlaps with the doping window region 103 and the polysilicon region shown in FIG. 5C; then the P-type doping process is performed. Referring to 4B, the gate electrode, the first electrode and the second electrode of the transistor P1, and the contact holes 400a, 400b, 133, and 134 can be formed through the P-type doping process. The P-type doping process may be, for example, an ion implantation process, and the doping element may be, for example, phosphorus element.

In the doping process, for example, an ion implantation process is applied, and the polysilicon pattern can serve as a mask, so that an implantation of ions into the silicon-based substrate happens on both sides of the polysilicon, thereby forming the first electrode and the second electrode of each of the transistors, and realizing a self-alignment. In addition, a resistivity of the polysilicon with original high resistance is reduced through the doping process, the gate electrode of each transistor and the first capacitor electrode can be formed. Therefore, using the polysilicon material the material of the resistance device and the gate electrode has multiple beneficial effects, and the process cost is reduced.

In this way, the structure of the display substrate shown in FIG. 4A is formed, which includes each of the transistors P1, N1 to N3, the resistance device 130 and the storage capacitor Cst.

For example, corresponding transistors, the resistance devices, and the storage capacitors Cst in two sub-pixels adjacent in the first direction D1 are respectively symmetrical about a symmetry axis along the second direction D2; corresponding transistors, resistance devices, and storage capacitors Cst in two sub-pixels in adjacent the second direction D2 are respectively symmetrical about a symmetry axis along the first direction D1.

It should be noted that, in the embodiment, the storage capacitor Cst is a capacitor formed by a field effect, after a voltage is applied to the first capacitor electrode 141, inversion charges are generated in a region of the base substrate 101 under the first capacitor electrode 141, rendering a bottom electrode plate of the storage capacitor Cst, i. e. the second capacitor electrode 142 conductive.

In other embodiments, a conducting treatment (for example, a doping treatment) may be performed in advance on the region of the base substrate 101 located below the first capacitor electrode 141 to form the second capacitor electrode 142. The embodiments of the present disclosure are not limited thereto.

The second insulating layer 202, the first conductive layer 301, the third insulating layer 203, the second conductive layer 302, the fourth insulating layer 204, the third conductive layer 303, the fifth insulating layer 205, and the fourth conductive layer 304 are sequentially formed on the substrate shown in FIG. 4A, and the display substrate shown in FIG. 3A is formed.

Figure 6A:
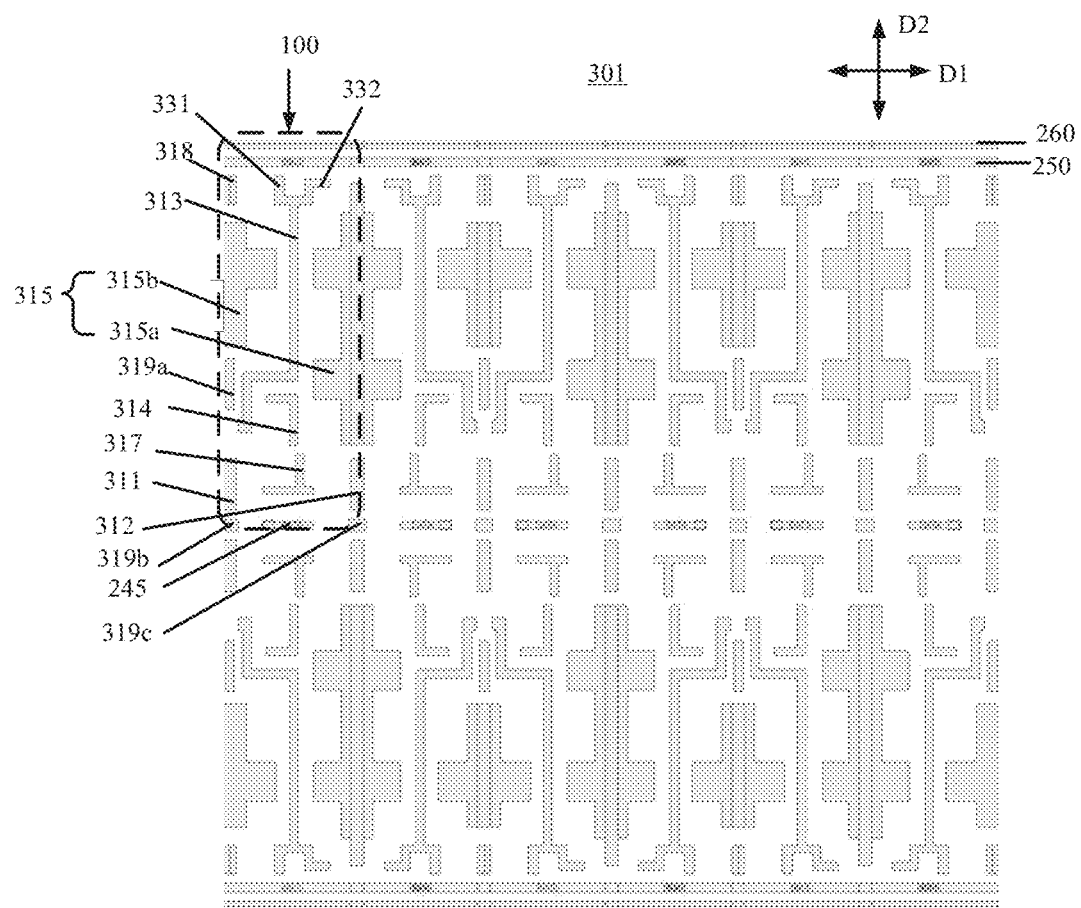
FIGS. 6A to 6B are schematic diagrams of a first conductive layer of a display substrate provided by at least one embodiment of the present disclosure.
Figure 6B:
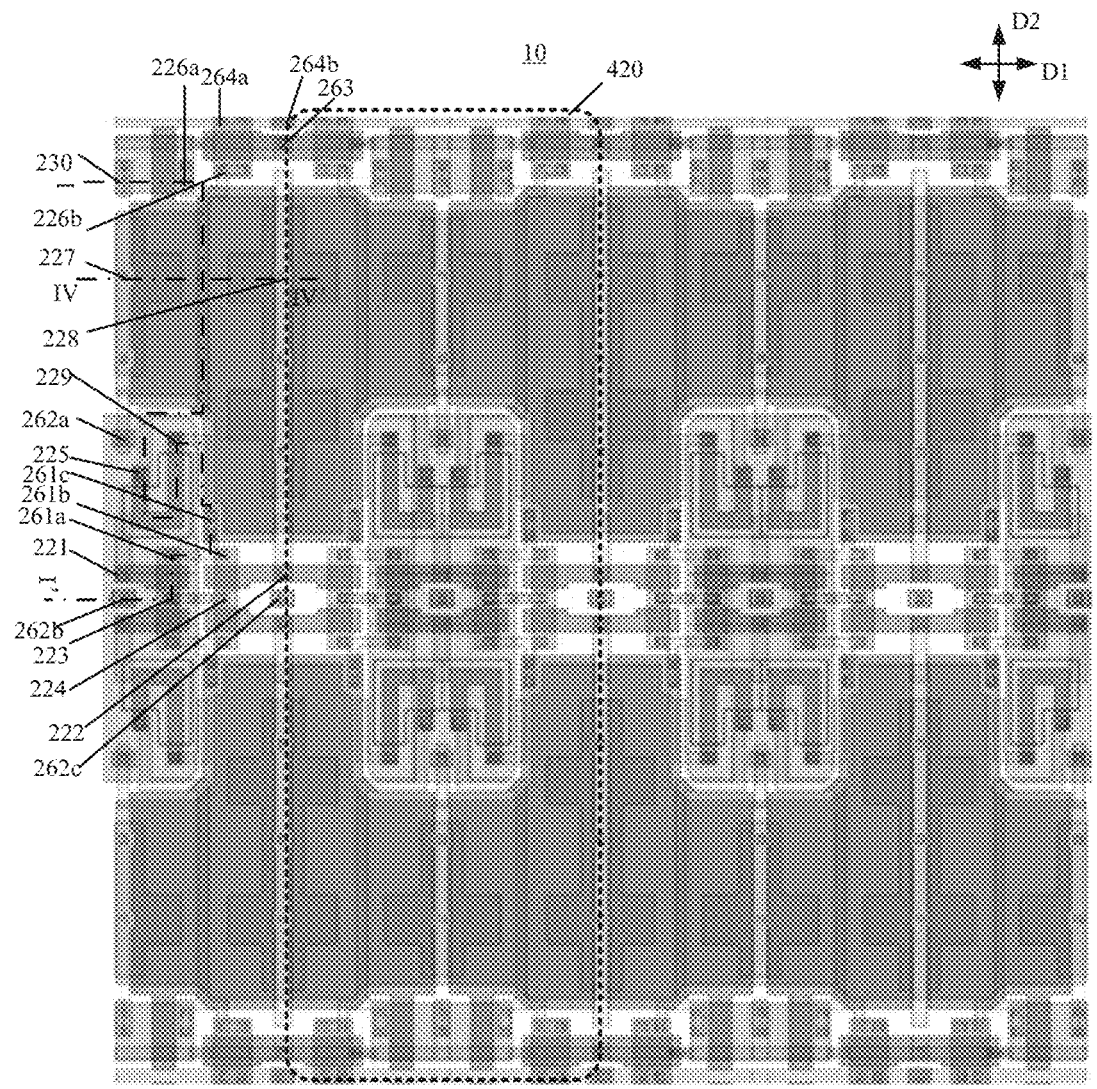
Figure 6C:
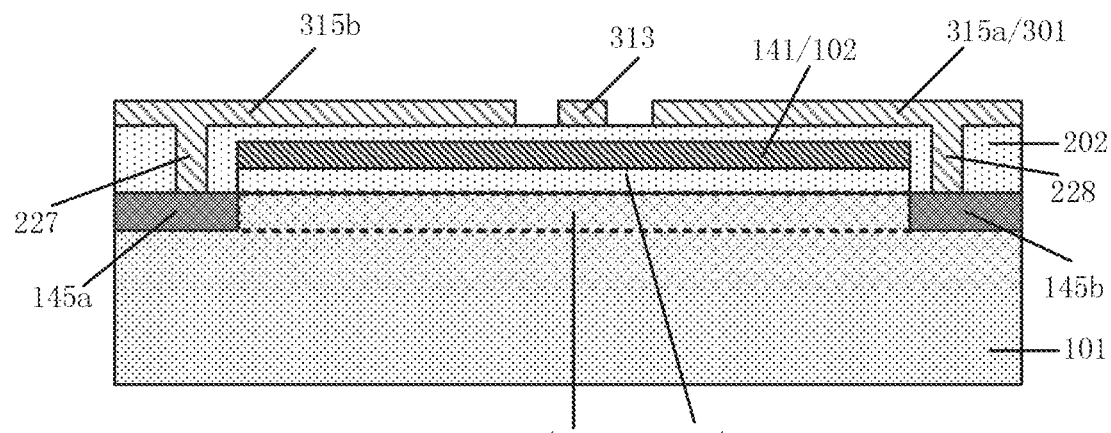
FIG. 6C shows a cross-sectional schematic diagram of FIG. 6B along a section line IV-IV'.

FIGS. 6A and 6B respectively show a pattern of the first conductive layer 301 and a situation where the first conductive layer 301 is arranged on the substrate structure shown in FIG. 4A, FIG. 6C shows a cross-sectional schematic diagram of FIG. 6B along a section line IV-IV'; FIG. 6B also shows via holes in the second insulating layer 202, and the via holes correspond to the contact regions in FIG. 4B in a one-to-one correspondence and are used to electrically connect each of the contact hole regions with the pattern in the first conductive layer 301. For clarity, only two rows and six columns of sub-pixels are shown in the figure, and a dotted frame is used to show a region of one sub-pixel 100; in addition, FIG. 6B also correspondingly shows a position of the section line I-I' in FIG. 3A.

As shown in FIG. 6A, patterns of the first conductive layers in two sub-pixels adjacent in the first direction D1 are symmetrical about a symmetry axis along the second direction D2; patterns of the first conductive layers in two sub-pixels adjacent in the second direction D2 are symmetrical about a symmetry axis along the first direction D1. The pattern of the first conductive layer will be exemplarily described below by taking one sub-pixel as an example.

As shown in FIG. 6A, the first conductive layer 301 includes a connection electrode 313 (an example of the second connection electrode of the present disclosure), and the connection electrode 313 is used to electrically connect the first terminal 131 of the resistance device 130 with the second electrode 152 of the driving sub-circuit 112.

For example, with reference to FIG. 6B, a first end of the connection electrode 313 is electrically connected with the first terminal 131 of the resistance device 130 through a via hole 225 (an example of the first via hole of the present disclosure) in the second insulating layer 202; a second end of the connection electrode 313 includes a first branch 331 and a second branch 332, combining with FIG. 3B, the first branch 331 is electrically connected with the first electrode 151 of the driving transistor N2 through the via hole 226a (an example of the second via hole of the present disclosure) in the second insulating layer 202, and the second branch 332 is electrically connected with the first electrode 181 of the bias transistor N3 through a via hole 226b in the second insulating layer 202.

For example, as shown in FIG. 6B, in the second direction D2, the via hole 225 and the via hole 226a are respectively located on opposite sides of the first capacitor electrode 141; that is, an orthographic projection of the connection electrode 313 on the base substrate 101 crosses over an orthographic projection of the first capacitor electrode 141 on the base substrate 101 in the second direction D2.

For example, a number of both the via hole 226a and the via hole 226b may be at least two, to reduce the contact resistance.

For example, with referring to FIGS. 6A and 6B, the first conductive layer 301 further includes a connection electrode 314, the connection electrode 314 is electrically connected with the second terminal 132 of the resistance device 130 through the via hole 229 in the second insulating layer 202, and the connection electrode 314 is configured to be electrically connected with the first electrode 121 of the light-emitting element 120.

For example, the connection electrode 314 is L-shaped, one branch of the connection electrode 314 is electrically connected with the second terminal 132 of the resistance device 130, and the other branch is configured to be electrically connected with the first electrode 121 of the light-emitting element 120.

For example, as shown in FIG. 6B and FIG. 6C, the first conductive layer 301 also includes a third capacitor electrode 315, the third capacitor electrode 315 overlaps with the first capacitor electrode 141 in a direction perpendicular to the base substrate. The third capacitor electrode 315 is on a side of the first capacitor electrode 141 away from the second capacitor electrode 142, and is configured to be electrically connected with the second capacitor electrode 142; that is, in the direction perpendicular to the base substrate, the second capacitor electrode 142 and the third capacitor electrode 315 are located on two sides of the first capacitor electrode 141 respectively, and are electrically connected with each other, so that a structure of parallel capacitors is formed, and the capacitance value of the storage capacitor Cst is increased.

For example, as shown in FIG. 6B and FIG. 6C, the third capacitor electrode 315 comprises a first portion 315a and a second portion 315b, and the first portion 315a and the second portion 315b are spaced apart from each other in the first direction D1. For example, the first portion 315a is electrically connected with the contact hole region 145b through a via hole 228 in the second insulating layer 202, so as to be electrically connected with the second capacitor electrode 142; the second portion 315b is electrically connected with the contact hole region 145a through a via hole 227 in the second insulating layer 202, so as to be electrically connected with the second capacitor electrode 142.

For example, the first portion 315a and the second portion 315b of the third capacitor electrode 315 are located on two sides of the connection electrode 313 in the first direction D1, and are respectively spaced apart from the connection electrode 313.

For example, the third capacitor electrodes of two sub-pixels adjacent in the first direction D1 are about a symmetry axis along the second direction D2; and the third capacitor electrodes of two sub-pixels adjacent in the second direction D1 are about a symmetry axis along the first direction D1.

For example, as shown in FIG. 6B, the first portions 315a or the second portions 315b of the third capacitor electrodes of two sub-pixels adjacent in the first direction D1 are in an integral structure.

For example, as shown in FIG. 6B, for each pixel unit group 420, the first portions 315a of the third capacitor electrodes of two sub-pixels adjacent in the first direction D1 are connected with each other as an integral structure.

For example, as shown in FIG. 6B, the second portion 315b of the third capacitor electrode 315 of a sub-pixel in each pixel unit group 420 and the second portion 315b of the third capacitor electrode 315 of a sub-pixel, which is adjacent to the sub-pixel, in a pixel unit group adjacent to the each pixel unit group 420 are connected as an integral structure.

For example, as shown in FIG. 6A, adjacent third capacitor electrodes 315 in two sub-pixels adjacent in the first direction D1 may be integrally formed to receive the same second power voltage VSS, and adjacent third capacitor electrodes 315 in two sub-pixels adjacent in the first direction Dlmay be integrally formed to receive the same second power voltage VSS.

For example, at least two via holes 227 and 228 may be arranged respectively to reduce the contact resistance; for example, the at least two via holes 227 are arranged along the second direction D2, and the at least two via holes 228 are arranged along the second direction D2.

For example, the first conductive layer 301 further includes a connection electrode 317 (an example of the first connection electrode of the present disclosure), and the connection electrode 317 is used to electrically connect the second terminal of the data writing sub-circuit with the first terminal of the storage sub-circuit, that is, electrically connecting the second electrode 161 of the first data writing transistor P1, the second electrode 171 of the second data writing transistor N1, and the first capacitor electrode 141.

With referring to FIG. 6A and FIG. 6B, the connection electrode 317 includes three ends, for example, a T-shaped structure. With referring to FIG. 3B, the first end of the connection electrode 317 is electrically connected with the second electrode of the first data writing transistor P1 through a via hole 261a in the second insulating layer 202, the second end of the connection electrode 317 is electrically connected with the second electrode of the second data writing transistor N1 through a via hole 261b in the second insulating layer 202, and the third end of the connection electrode 317 is electrically connected with the first capacitor electrode 141 through a via hole 261c in the second insulating layer 202.

For example, as shown in FIG. 6B, in the second direction D2, the third end of the connection electrode 314 at least partially overlaps with the connection electrode 317. This arrangement makes the pixel layout more compact, so that the space utilization rate of the display substrate is improved, and the resolution of the display substrate is improved.

With referring to FIG. 6A and FIG. 6B, the first conductive layer 301 further includes a first scan line connection portion 311 and a second scan line connection portion 312, and the first scan line connection portion 311 is configured to be electrically connected with the first scan line so that the gate electrode of the first data writing transistor P1 receives the first control signal SEL. The second scan line connection portion 312 is configured to be electrically connected with the second scan line so that the gate electrode of the second data writing transistor N1 receives the first control signal SEL_B.

For example, the first scan line connection portion 311 is electrically connected with the gate electrode of the first data writing transistor P1 through a via hole 221 in the second insulating layer 202, and the second scan line connection portion 312 is electrically connected with the gate electrode of the second data writing transistor N1 through a via hole 222 in the second insulating layer 202.

For example, as shown in FIG. 6A, sub-pixels adjacent in the first direction D1 share a first scan line connection portion 311 or a second scan line connection portion 312.

For the specific description of the first scan line connection portion and the second scan line connection portion, the description of FIGS. 10A to 10B below can be referred to.

As shown in FIG. 6A, the first conductive layer 301 further includes a data line connection portion 245, and the data line connection portion 245 is configured to be electrically connected with the data line, so that the first electrode of the first data writing transistor P1 and the first electrode of the second data writing transistor N1 receive the data signal Vd transmitted by the data line.

As shown in FIG. 6B, the data line connection portion 245 is electrically connected with the first electrode 161 of the first data writing transistor P1 through a via hole 223 in the second insulating layer 202, and the data line connection portion 245 is electrically connected with the first electrode 171 of the second data writing transistor N1 through a via hole 224 in the second insulating layer 202.

For example, as shown in FIG. 6A, a plurality of data line connection portions 245 are arranged at intervals in the first direction D1, for example, located at a boundary of two sub-pixel rows. For example, two sub-pixels adjacent in the second direction D2 share one data line connection portion 245.

For the specific description of the data line connection portion, the description of the second data line connection portion in FIGS. 8A to 8D below can be referred to.

Referring to FIGS. 6A and 6B, the first conductive layer 301 further includes a connection electrode 318, and the connection electrode 318 is electrically connected with the first electrode of the driving transistor N2 through a via hole 230 in the second insulating layer 202.

Referring to FIGS. 4A and 6B, the first conductive layer 301 further includes connection electrodes 319a, 319b, 319c, these connection electrodes are all arranged for biasing the substrates of the transistors, for example, used for connecting the N-type substrate to a first power voltage terminal to receive the first power voltage VDD (high voltage), or used for connecting the P-type substrate to a second power voltage terminal to receive the second power supply voltage VSS (low voltage), as a result, parasitic effects such as the substrate bias effect can be avoided, and the stability of the circuit can be improved.

With referring to FIG. 4B, the connection electrodes 319a and 319b are respectively electrically connected with the contact hole regions 411a and 411b in the second region (N-well region) 402 of the base substrate 101 through via holes 262a and 262b in the second insulating layer 202, the connection electrodes 319a and 319b are configured to be electrically connected with the first voltage terminal VDD to bias the N-type substrate of the first data writing transistor P1. The connection electrode 319c is electrically connected with the contact hole region 400a in the base substrate 101 through a via hole 262c in the second insulating layer 202, and the connection electrode 319c is configured to be electrically connected with the second voltage terminal VSS to bias the P-type substrate where the second data writing transistor N1 is located.

With referring to FIGS. 6A to 6B, the first conductive layer 301 further includes a bias voltage line 250, the bias voltage line 250 is extended along the first direction D1, and is electrically connected with the gate electrode of the bias transistor N3 through a via hole 263 in the second insulating layer 202, to provide the second common voltage Vcom2.

With reference to FIGS. 4B and 6A to 6B, the first conductive layer 301 further includes a power line 260, the power line 260 is extended along the first direction D1 and is used for transmitting the second power voltage VSS. The power line 260 is electrically connected with the first electrode of the bias transistor N3 through a via hole 264*a* in the second insulating layer 202 to provide the second power voltage VSS, and is electrically connected with a contact hole region 400*b* in the base substrate 101 through a via hole 264*b* in the second insulating layer 202 to bias the P-type substrate where the second data writing transistor N1 is located.

Figure 7A:
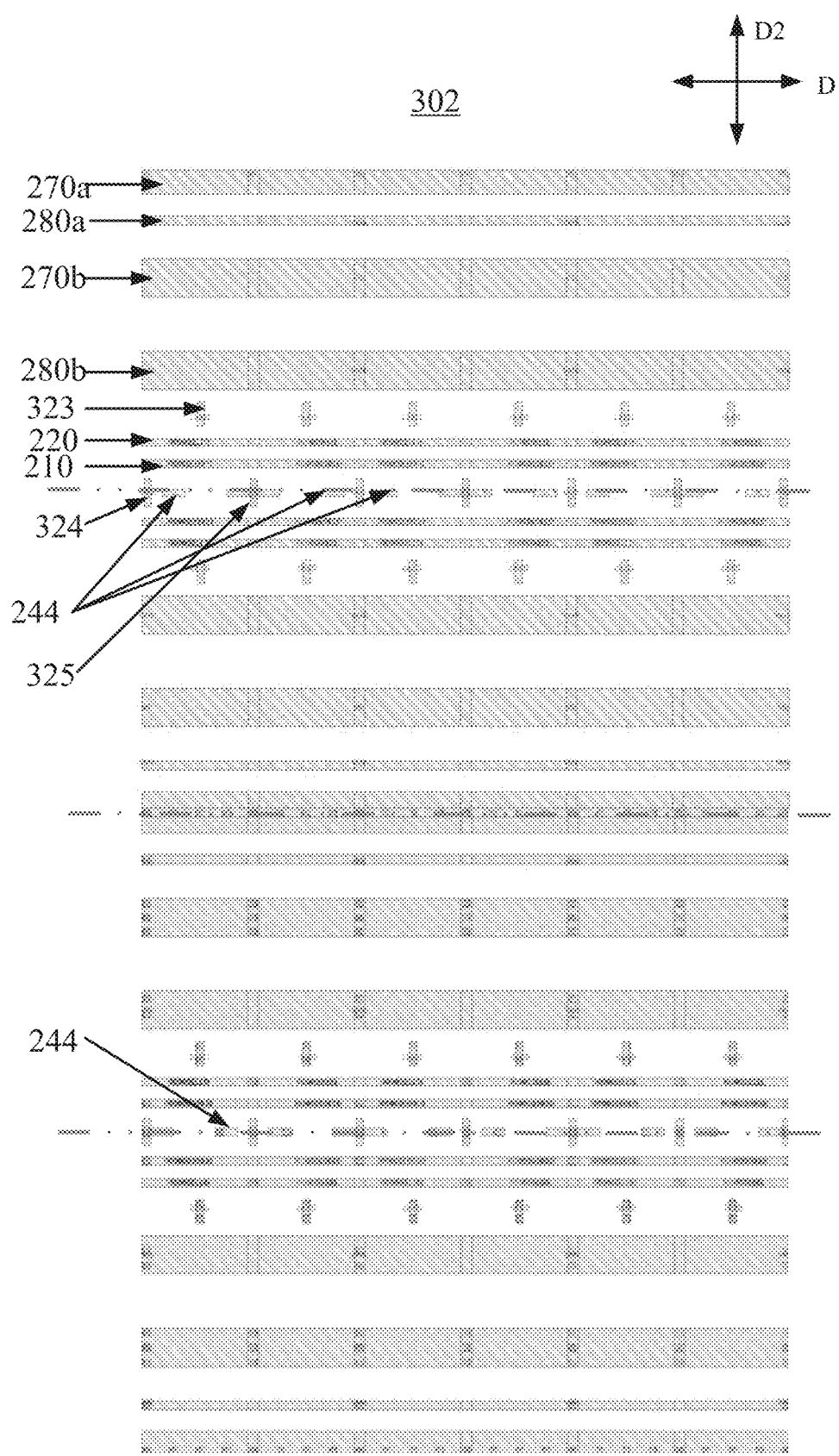
FIGS. 7A to 7B are schematic diagrams of a second conductive layer of a display substrate provided by at least one embodiment of the present disclosure.
Figure 7B:
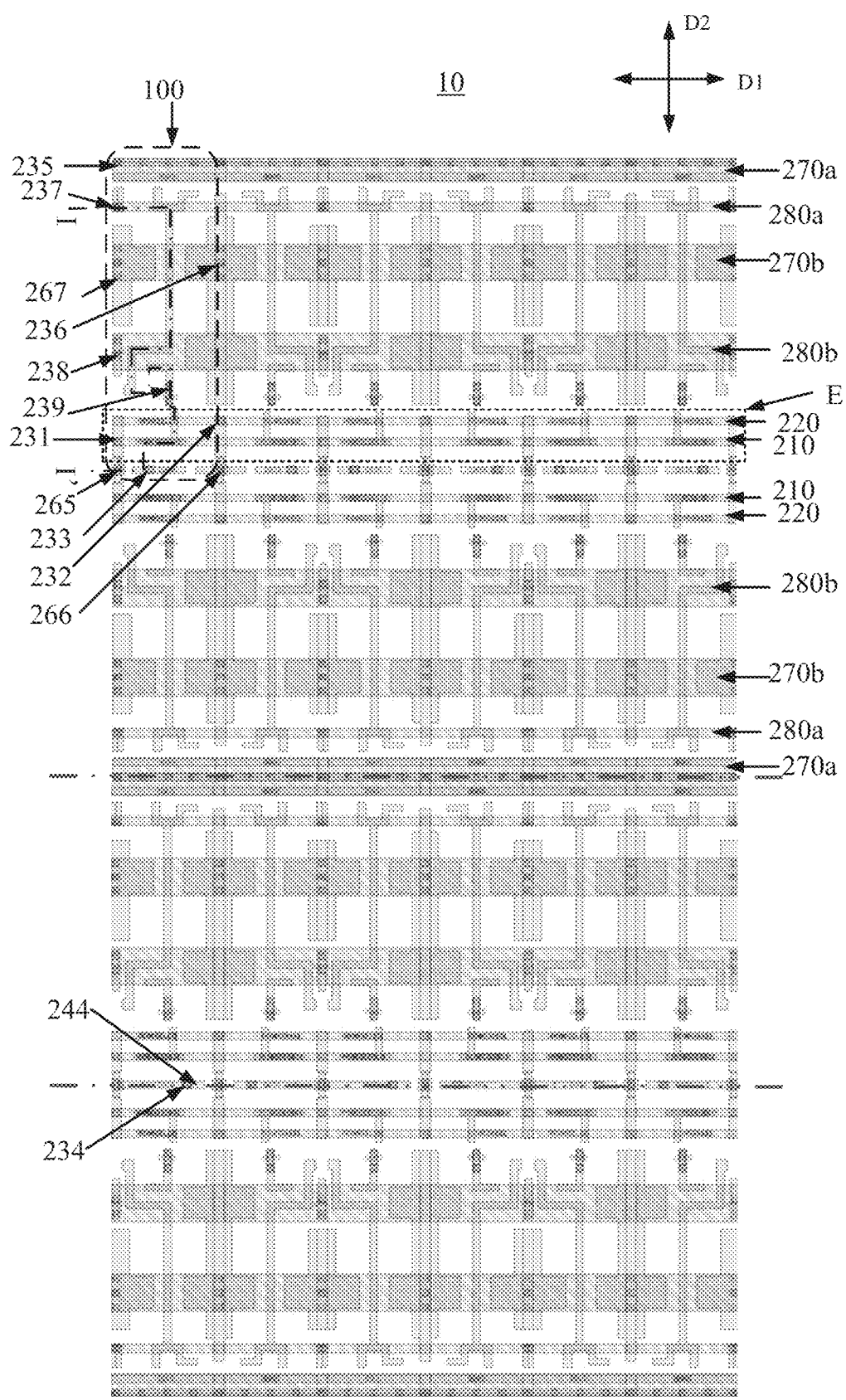

FIG. 7A shows a schematic diagram of the second conductive layer 302, FIG. 7B shows the second conductive layer 302 on the basis of the first conductive layer 301, FIG. 7B further shows the via hole in the third insulating layer 203, and the via hole in the third insulating layer 203 is used to connect the pattern in the first conductive layer 301 and the pattern in the second conductive layer 302. For clarity, only four rows and six columns of sub-pixels are shown in the figure, a dividing line of two sub-pixel rows is further shown by a dotted line; in addition, FIG. 7B also correspondingly shows a position of the section line I-I' in FIG. 3A.

As shown in FIG. 7A, patterns of second conductive layers in two sub-pixels adjacent in the first direction D1 are symmetrical about a symmetry axis along the second direction D2; and patterns of second conductive layers in two sub-pixels adjacent in the second direction D2 are symmetrical about a symmetry axis along the first direction D1. The patterns of the second conductive layers will be exemplarily described below by taking one sub-pixel as an example.

As shown in FIG. 7A, the second conductive layer 302 includes power lines 270*a*, 270*b*, 280*a*, and 280*b* extended along the first direction D1, the power lines 270*a* and 270*b* are used to transmit the second power voltage VSS, and the power lines 280*a* and 280*b* are used to transmit the first power voltage VDD. The power lines 270*a*, 280*a*, 270*b*, and 280*b* are alternately arranged one by one in the second direction D2.

With reference to FIGS. 3B, 7A, and 7B, the power line 270*a* is electrically connected with the power line 260 in the first conductive layer 301 through a plurality of via holes 235 in the third insulating layer 203, so that a parallel structure is formed, the resistance of the wiring is effectively reduced; the plurality of via holes 235 are arranged along the first direction D1. For example, the power line 270*b* is electrically connected with the third capacitor electrode 315 through via holes 236 in the third insulating layer 203 to provide the second power voltage VSS; for example, the plurality of via holes 236 are arranged along the second direction D2. For example, the power line 270*b* is also electrically connected with the third capacitor electrode 315 (315*b*) through via holes 267 in the third insulating layer 203 to provide the second power voltage VSS; for example, the plurality of via holes 267 are arranged along the second direction D2.

For example, in the second direction D2, a width of the power line 270*b* is greater than a width of the power line 270*a*, this is because the first portion and the second portion of the third capacitor electrode 315 that is electrically connected with the power line 270*b* both have a larger area, setting the power line 270*b* to have a larger width can facilitate the formation of a plurality of connection holes 236 and 267 with the third capacitor electrode 315, so that the contact resistance is effectively reduced.

With reference to FIGS. 7A and 7B, the power line 280*a* is electrically connected with the connection electrode 318 in the first conductive layer 301 through a via hole 237 in the third insulating layer 203, so that the power line 280*a* is connected with the first electrode of the driving transistor N2 to provide the first power supply voltage VDD. The power line 280*b* is electrically connected with the connection electrode 319*a* in the first conductive layer 301 through a via hole 238 in the third insulating layer 203, so that the second region (N-well region) 402 in the base substrate 101 is biased with a high voltage; for example, the plurality of via holes 238 are arranged along the second direction D2.

For example, in the second direction D2, a width of the power line 280*b* is greater than a width of the power line 280*a*, this is because the connection electrode 319*a* electrically connected to the power line 280*b* has a larger size in the second direction D2, setting the power line 280*b* to have a larger width can facilitate the formation of a plurality of connection holes 238 between the power line 280*b* and the connection electrode 319*a*, so that the contact region with the connection electrode 319*a* is increased, and the contact resistance is effectively reduced.

For example, the second conductive layer 302 further includes a plurality of first scan lines 210 and a plurality of second scan lines 220 extended along the first direction D1. For example, the scan line 11 shown in FIG. 1A may be the first scan line 210 or the second scan line 220.

With reference to FIG. 6A and FIG. 6B, the first scan line 210 is electrically connected with the first scan line connection portion 311 through a via hole 231 in the third insulating layer 203, and the second scan line 220 is electrically connected with the second scan line connection portion 312 through a via hole 232 in the third insulating layer 203.

For the specific description of the first scan line and the second scan line, the description of FIGS. 10A-10B below may be referred to.

For example, with referring to FIG. 3B, FIG. 7A and FIG. 7B, the second conductive layer 302 further includes a connection electrode 323, and the connection electrode 323 is electrically connected with the connection electrode 314 in the first conductive layer 301 through a via hole 239 in the third insulating layer 203, so that the connection electrode 323 is connected to the second terminal 132 of the resistance device 130. The connection electrode 323 is configured to be electrically connected with the first electrode 121 of the light-emitting element 120. For example, the number of the via hole 239 is at least two.

For example, with referring to FIG. 7A and FIG. 7B, the second conductive layer 302 further includes a connection electrode 324, and the connection electrode 324 is electrically connected with the connection electrode 319*b* in the first conductive layer 301 through a via hole 265 in the third insulating layer 203, so that the connection electrode 324 is electrically connected with the contact hole region 411*b* in the second region (N-well region) 402 in the base substrate 101.

For example, with referring to FIG. 7A and FIG. 7B, the second conductive layer 302 further includes a connection electrode 325, the connection electrode 325 is electrically connected with the connection electrode 319*c* in the first conductive layer 301 through a via hole 266 in the third insulating layer 203, so that the connection electrode 325 is electrically connected with the contact hole region 400*a* in the base substrate 101.

For example, the connection electrode 325 is in a cross-shaped structure. For example, the connection electrodes 324 and the connection electrodes 325 are alternately distributed in the first direction D1, and are located at a boundary of two sub-pixel rows.

For example, as shown in FIG. 7A, the second conductive layer 302 further includes a data line connection portion 244. With referring to FIG. 7B, the data line connection portion 244 is electrically connected with the data line connection portion 245 in the first conductive layer 301 through a via hole 233.

For example, as shown in FIG. 7A, a plurality of data line connection portions 244 are arranged at intervals in the first direction D1, and a connection electrode 324 or a connection electrode 325 is provided between every two adjacent data line connection portions 244.

For example, the data line connection portion 244 is located at a boundary between two sub-pixel rows. For example, two sub-pixels adjacent in the second direction D2 share one data line connection portion 244.

For example, with referring to FIGS. 7A and 7B, in the second direction D2, the data line connection portions 244 located in each column of sub-pixels are alternately located on two sides of the data line connection portions 245, and are electrically connected with the first end and the second end of the data line connection portions 245 through via holes 233 and 234, respectively, which is to connect the data line connection portions 245 to different data lines.

For a specific description of the data line connection portion, the description of the first data line connection portion in FIGS. 11A to 11D below may be referred to.

Figure 8A:
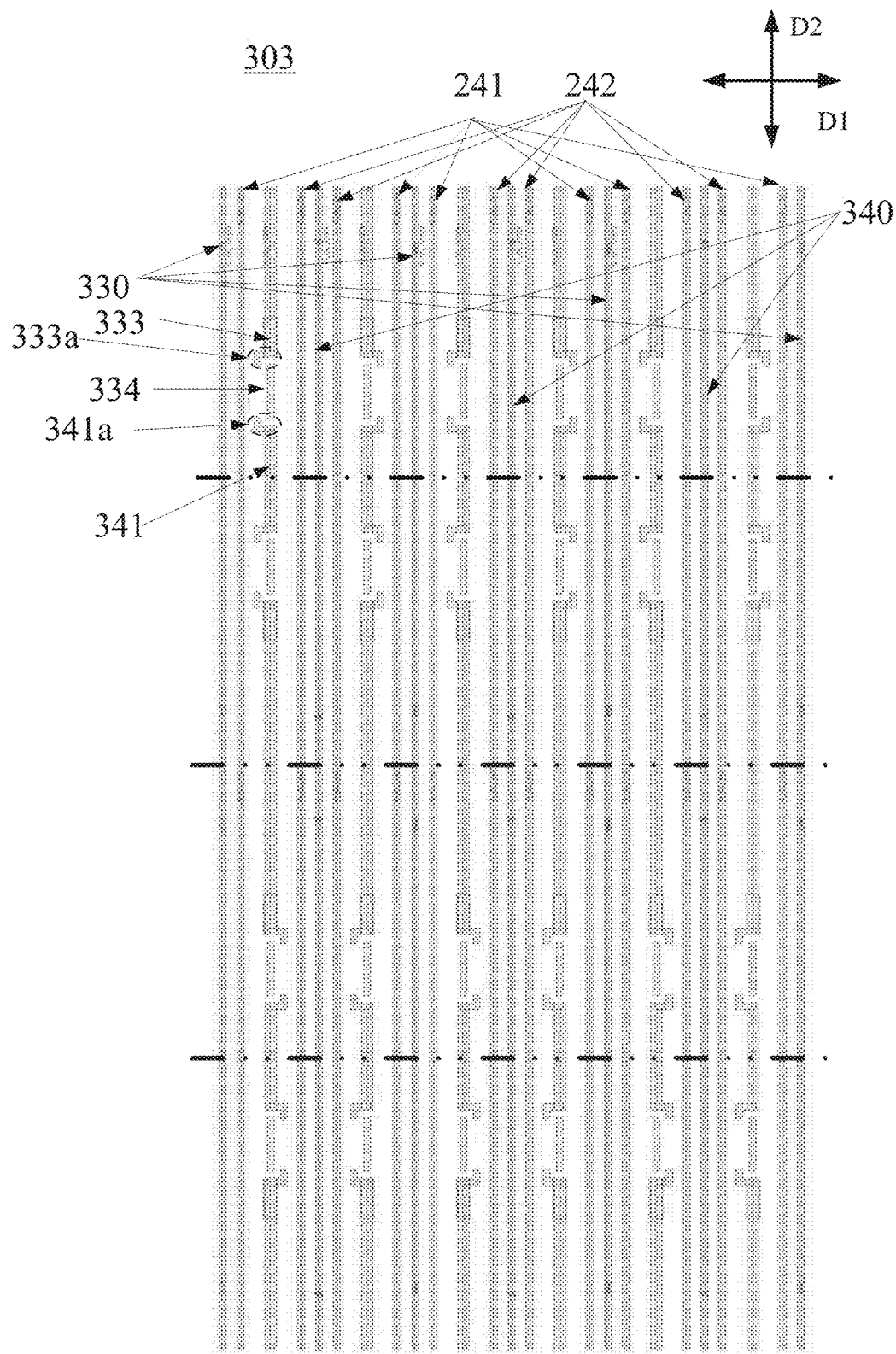
FIGS. 8A to 8B are schematic diagrams of a third conductive layer of a display substrate provided by at least one embodiment of the present disclosure.
Figure 8B:
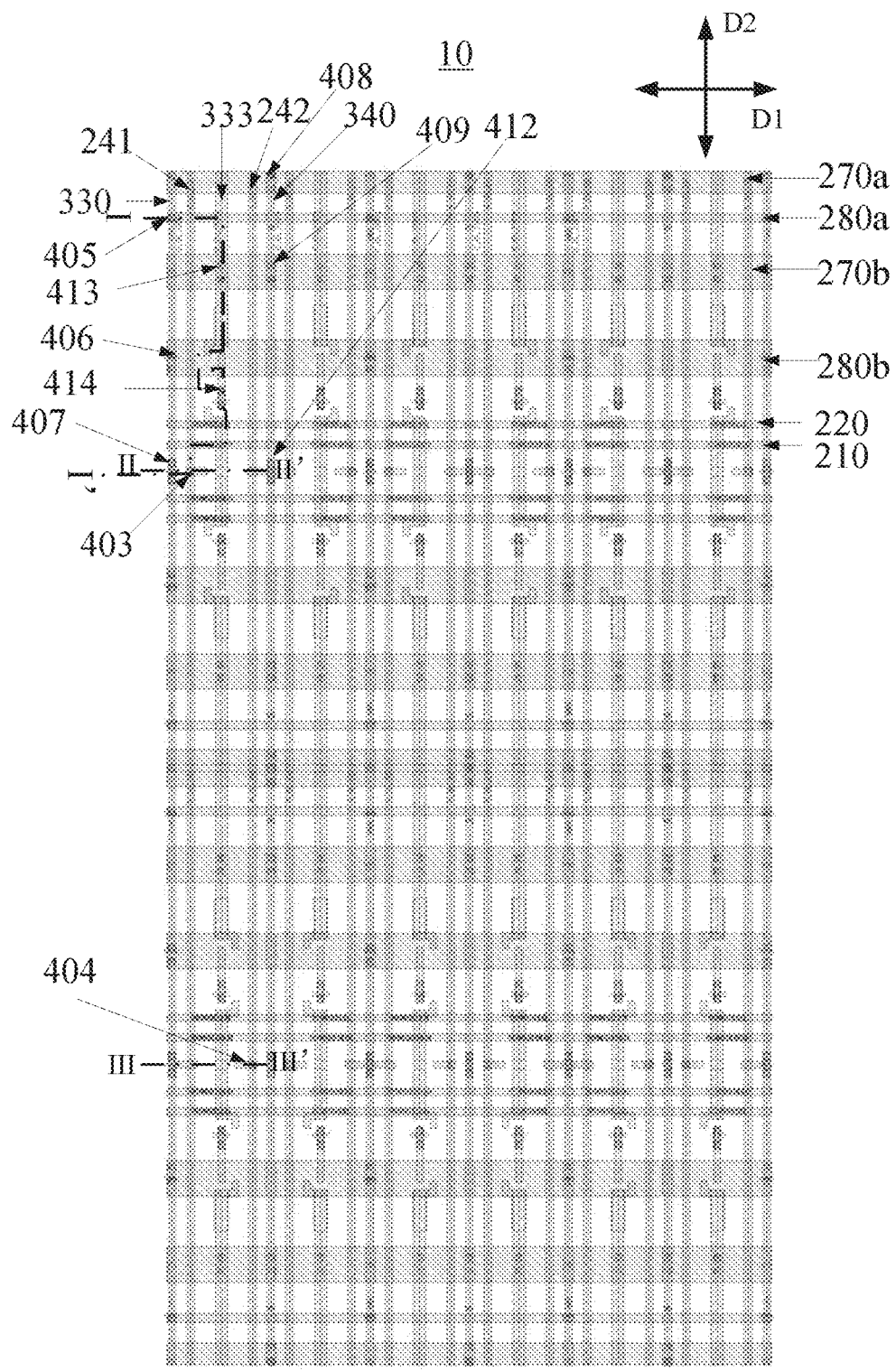

FIG. 8A shows a schematic diagram of the third conductive layer 303, FIG. 8B shows the third conductive layer 303 on the basis of the second conductive layer 302, FIG. 8B also shows the via holes in the fourth insulating layer 204, and the via holes in the fourth insulating layer 204 is used to connect the pattern in the second conductive layer 302 with the pattern in the third conductive layer 303. For clarity, the figures only show the conductive patterns corresponding to the sub-pixels in four rows and six columns, and a dividing line of two rows of sub-pixels is shown in FIG. 8A with a dashed line; in addition, FIG. 8B also correspondingly shows the position of the section line I-I' in FIG. 3A.

For example, the third conductive layer 303 includes a plurality of data lines extended along the second direction D2, and the data line is configured to be connected with the first terminal of the data writing sub-circuit in the sub-pixel to provide the data signal Vd. For example, as shown in FIG. 8A, the plurality of data lines include a plurality of first data lines 241 and a plurality of second data lines 242, the first data lines 241 and the second data lines 242 are alternately arranged one by one along the first direction D1. For example, the data line 12 shown in FIG. 1A may be the first data line 241 or the second data line 242.

For example, the data line is divided into a plurality of data line groups, each of the data line groups includes a first data line 241 and a second data line 242. For example, each sub-pixel column is correspondingly connected with a data line group, that is, with a first data line 241 and a second data line 242; that is, one column of sub-pixels is driven by two data lines. This helps to reduce the load on each data line, so that the driving ability of the data line is improved, the signal delay is reduced, and the display effect is improved.

Referring to FIG. 8B, the first data line 241 is electrically connected with the data line connection portion 244 which is between the first row of sub-pixels and the second row of sub-pixels and in the second conductive layer 302 shown in FIG. 7B through a via hole 403 in the fourth insulating layer 204, so as to provide the data signal to the first and second rows of sub-pixels; the second data line 242 is electrically connected with the data line connection portion 244 which is between the third row of sub-pixels and the fourth row of sub-pixels and in the second conductive layer 302 shown in FIG. 7B through a via hole 404 in the fourth insulating layer 204, so as to provide the data signal to the third and fourth rows of sub-pixels.

For the specific description of the first data line and the second data line, the descriptions in FIGS. 11A-11D below may be referred to. For the convenience of comparison, FIG. 8B shows the positions corresponding to the section lines II-II' and III-III' in FIG. 11B.

For example, the third conductive layer 303 includes power lines 330 and 340 extended along the second direction D2. The power line 330 is configured to transmit the first power voltage VDD, and the power line 340 is configured to transmit the second power voltage VSS. As shown in FIG. 8A, the power line 330 and the power line 340 are alternately arranged one by one in the first direction D1.

Referring to FIG. 8B, the power line 330 is electrically connected with the power lines 280a and 280b in the second conductive layer 302 through via holes 405 and 406 in the fourth insulating layer 204, respectively, so that a meshed power line structure for transmitting the first power voltage is formed. This structure helps to reduce the resistance on the power line, so that the voltage drop on the power line is reduced, which helps to evenly deliver the first power voltage VDD to each of the sub-pixels of the display substrate. The power line 330 is also electrically connected with the connection electrode 324 (referring to FIG. 7A) in the second conductive layer 302 through a via hole 407 in the fourth insulating layer, so that the power line 330 is electrically connected with the contact hole region 411b in the second region 402 (N-well region) in the base substrate 101, to bias the N-type substrate where the first data writing transistor P1 and the resistance device 130 are located.

Referring to FIG. 8B, the power line 340 is electrically connected with the power lines 270a and 270b in the second conductive layer 302 through a via hole 408 and a via hole 409 in the fourth insulating layer 204, respectively, so that a meshed power line structure for transmitting the second power supply voltage is formed. The meshed power line structure helps to reduce the resistance on the power line, so that the voltage rise on the power line is reduced, which helps to evenly deliver the second power voltage VSS to each of the sub-pixels of the display substrate. The power line 340 is also electrically connected with the connection electrode 325 (referring to FIGS. 3B and 6A) in the second conductive layer 302 through a via hole 412 in the fourth insulating layer, so that the power line 340 is electrically connected with the contact hole region 400a in the base substrate 101, to bias the P-type substrate where the transistors N1-N3 are located.

As shown in FIG. 8A, the third conductive layer 303 further includes a connection electrode 333, the connection electrode 333 is located between the first data line 241 and the second data line 242 in a data line group. As shown in conjunction with FIG. 7B, the connection electrode 333 is electrically connected with the power line 270b in the second conductive layer through a via hole 413 in the fourth insulating layer, for example, the number of the via 413 is at least two, so that the connection electrode 333 can fully contact with the power line 270b to reduce the contact resistance. The parallel connection electrode 333 arranged on the power line 270b can help to reduce the resistance on the power line 270b, so that the voltage rise on the power line is reduced, which helps to evenly deliver the second power voltage VSS to each of the sub-pixels of the display substrate.

As shown in FIG. 3B, FIG. 8A and FIG. 8B, the third conductive layer 303 further includes a connection electrode 334, the connection electrode 334 is electrically connected with the connection electrode 323 in the second conductive layer 302 through a via hole 414 in the fourth insulating layer, so that the connection electrode 334 is connected with a second terminal 132 of the resistance device 130. The connection electrode 334 is configured to be electrically connected with the first electrode 121 of the light-emitting element 120. For example, the number of the via holes 414 is at least two.

As shown in conjunction with FIG. 8A and FIG. 8B, the third conductive layer 303 further includes a shielding electrode 341, for example, the shielding electrode 341 is extended along the second direction D2, the shielding electrode 341 is located between a first data line 241 and a second data line 242 of a data line group, for example, the first data line 241 and the second data line 242 are symmetrically arranged on both sides of the shielding electrode 341. The shielding electrode 341 is arranged between the two data lines to play a role of shielding and prevent signals in the two data lines from interfering with each other. For example, the shielding electrode 341 is configured to receive a constant voltage to improve the shielding ability. In this embodiment, the shielding electrode 341 is configured to receive the second power voltage VSS.

For example, the display substrate comprises a plurality of shielding electrodes 341, the plurality of shielding electrodes 341 are arranged in a one-to-one correspondence with the plurality of data line groups, and each shielding electrode is between the first data line and the second data line of the corresponding data line group.

As shown in FIG. 8A, the connection electrode 333, the connection electrode 334, and the shielding electrode 341 are arranged in the second direction D2, and are located between the first data line 241 and the second data line 242; the connection electrode 333, the connection electrode 334, and the shielding electrode 341 constitute a shielding wall, which plays a role of shielding in an entire extension range of the first data line 241 and the second data line 242, to prevent the signals in the two data lines from interfering with each other.

For example, as shown in FIG. 8A, the connection electrode 333 and the shielding electrode 341 are located on two sides of the connection electrode 334 respectively, and are spaced apart from the connection electrode 334. The connection electrode 333 is provided with a protruding portion 333a at one end close to the connection electrode 334, the protruding portion 333a is in an L shape, a first branch of the protruding portion 333a is extended along the first direction D1, and is connected with the main body of the connection electrode 333, a second branch of the protruding portion 333a is extended along the second direction D2 and the direction approaching the connection electrode 334, the second branch is overlapped with a gap between the connection electrode 333 and the connection electrode 334 in the first direction D1, so that the shielding effect is improved, and the signal crosstalk between the two data lines is further avoided.

Similarly, the shielding electrode 341 is provided with an L-shaped protruding portion 341a at one end close to the connection electrode 334, and the L-shaped protruding portion 341a is used for further shielding the gap between the shielding electrode 341 and the connection electrode 334, to improve the shielding effect.

In this way, the shielding wall achieves complete shielding in the second direction D2, and the first data line 241 and the second data line 242 have no area directly facing each other in the first direction D1, so that a better signal shielding effect is achieved, a better stability of the display data is provided, and the display effect is improved.

Figure 9A:
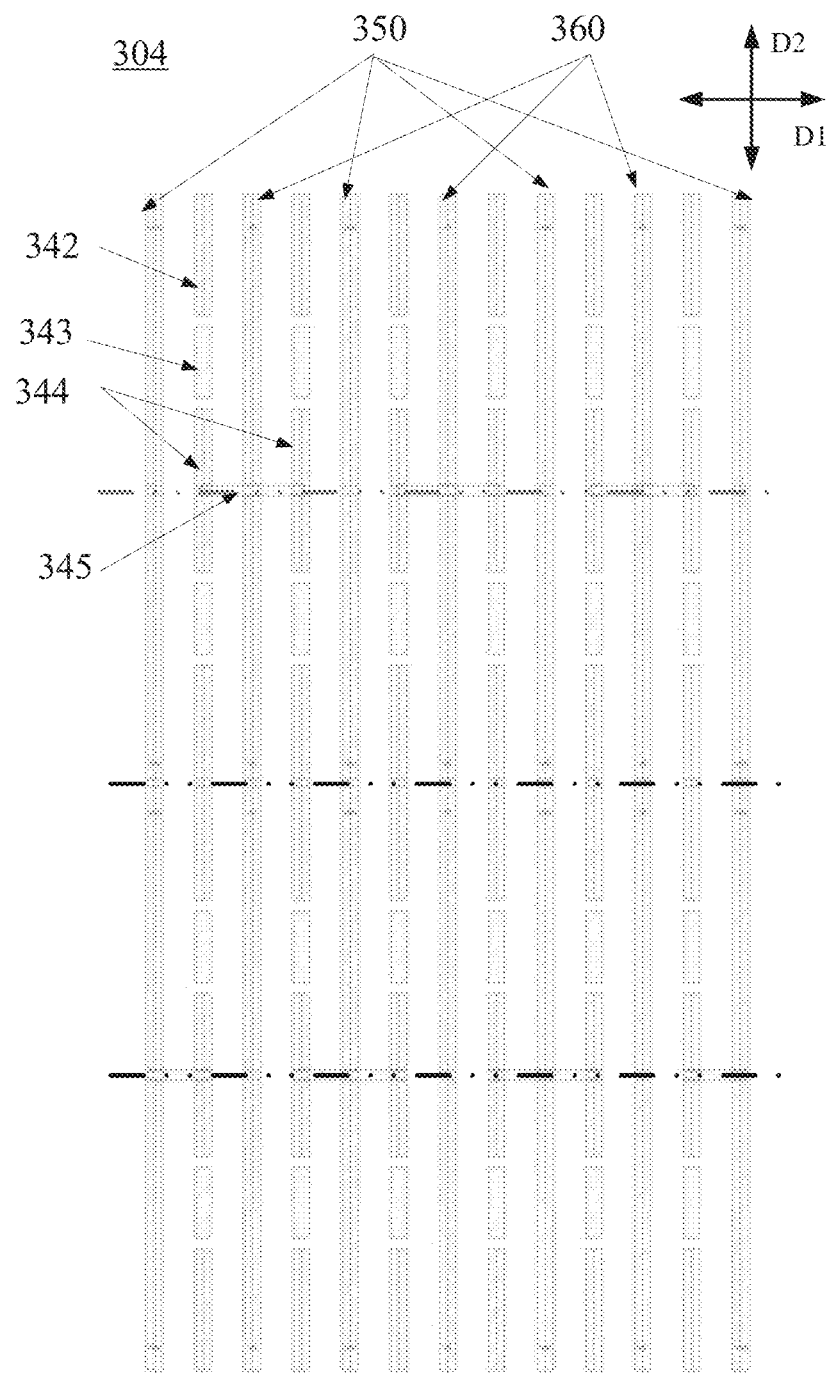
FIGS. 9A to 9B are schematic diagrams of a fourth conductive layer of a display substrate provided by at least one embodiment of the present disclosure.
Figure 9B:
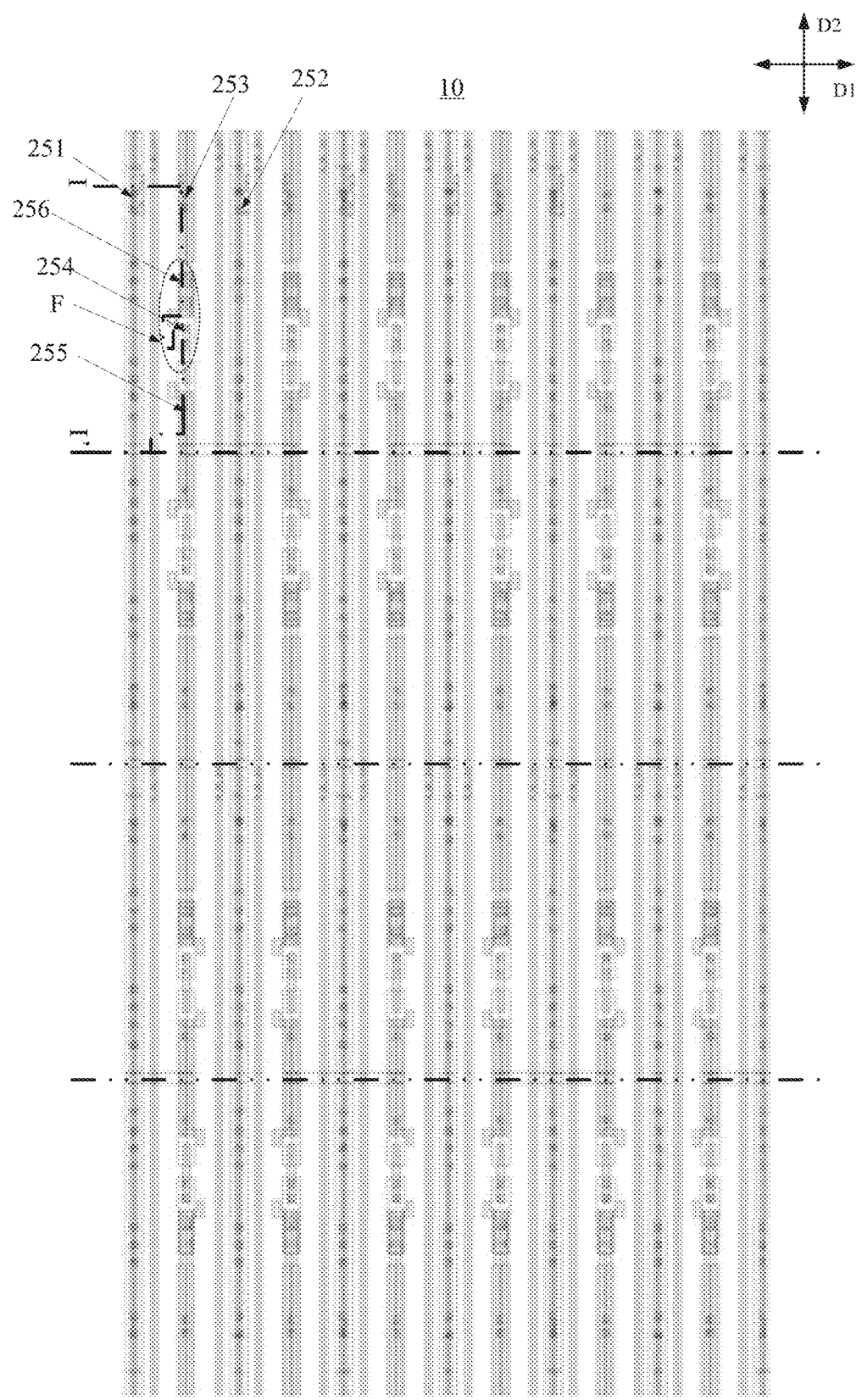

FIG. 9A shows a schematic diagram of the fourth conductive layer 304, FIG. 9B shows the fourth conductive layer 304 on the basis of the third conductive layer 303, and FIG. 9B also shows via holes in the fifth insulating layer 205, the via holes in the fifth insulating layer 205 are used to connect patterns in the third conductive layer 303 with patterns in the fourth conductive layer 304. For clarity, only four rows and six columns of sub-pixels are shown in the figure, a dividing line of two rows of sub-pixels is shown by a dotted line; in addition, FIG. 9B also correspondingly shows the position of the section line I-I' in FIG. 3A.

For example, the fourth conductive layer 304 includes power lines 350 and 360 extended along the second direction D2. The first power line 350 is used to transmit the first power voltage VDD, and the power line 360 is used to transmit the second power voltage VSS. As shown in FIG. 9A, the power lines 350 and the power lines 360 are alternately arranged one by one in the first direction D1.

For example, the plurality of power lines 350 and the plurality of power lines 330 are arranged in one-to-one correspondence, and the plurality of power lines 360 and the plurality of power lines 340 are arranged in one-to-one correspondence; in a direction perpendicular to the base substrate 101, each power line 350 and the corresponding power line 330 overlap with each other and are electrically connected with each other (for example, in parallel), each power line 360 and the corresponding power line 340 are overlapped and are electrically connected with each other (for example, in parallel). As a result, the resistance on the power line is reduced, and the display uniformity is improved.

Referring to FIG. 9B, the power line 350 is electrically connected with the corresponding power line 330 through a via hole 251 in the fifth insulating layer 205, and the power line 360 is electrically connected with the corresponding power line 340 through a via hole 252 in the fifth insulating layer. For example, the numbers of the via holes 251 and 252 are at least two respectively.

With reference to FIGS. 9A and 9B, the fourth conductive layer 304 further includes a connection electrode 342, the connection electrode 342 is electrically connected with the connection electrode 333 in the third conductive layer 303 through a via hole 253 in the fifth insulating layer, for example, the number of via holes 253 is at least two, so that the connection electrode 342 can fully contact the connection electrode 333 to reduce the contact resistance. Providing the connection electrode 342 helps to further reduce the resistance on the power line 270b, so that the voltage rise on the power line is reduced, which helps to evenly deliver the second power supply voltage VSS to each of the sub-pixels of the display substrate.

Combining FIG. 3B, FIG. 9A with FIG. 9B, the fourth conductive layer 304 further includes a connection electrode 343, the connection electrode 343 is electrically connected with the connection electrode 334 in the third conductive layer 303 through a via hole 254 in the fifth insulating layer, so that the connection electrode 343 is connected to a second terminal 132 of the resistance device 130. The connection electrode 343 is used for electrical connection with a first electrode 121 of the light-emitting element 120. For example, the number of the via holes 254 is at least two.

Combining FIG. 9A with FIG. 9B, the fourth conductive layer 304 further includes a connection electrode 344, and the connection electrode 344 is electrically connected with the shielding electrode 341 in the third conductive layer 303 through a via hole 255 in the fifth insulating layer. As shown in FIG. 9A, the fourth conductive layer 304 further includes a connection portion 345, which connects the connection electrode 344 to the power line 360 directly adjacent to the connection electrode 344.

For example, as shown in FIG. 9A, the connection electrodes 344 located on two sides of the power line 360 are symmetrically arranged about the power line 360, the power line 360, the connection electrodes 344 on two sides of the power line 360, and the corresponding connection portions 345 of the connection electrodes are connected with each other as an integral structure. In this way, the power line 360 can provide the second power voltage VSS to the shielding electrode 341, to improve the shielding ability of the shielding electrode.

For example, each via hole may be additionally filled with a conductive material (such as tungsten) to conduct electricity.

FIG. 9B also shows a contact hole region 256 of the connection electrode 343, and the contact hole region 256 is used to electrically connect with the first electrode 121 of the light-emitting element 120.

It should be noted that along the section line I-I', a part of the connection electrode 343 in the contact hole region 256 and a part of the connection electrode 343 corresponding to the via hole 254 are not continuous (as shown in the region F in FIG. 9B); however, for the convenience of description, the contact hole region 256 and the via hole 254 are shown on the continuous connection electrode 343 in the cross-sectional schematic diagram shown in FIG. 3B, which is consistent with the actual situation. For example, as shown in FIG. 3B, the display substrate 10 further includes a sixth insulating layer 206, and a via hole 257 is formed in the sixth insulating layer 206 corresponding to a contact hole region 256 of the connection electrode 343, the via hole 257 is filled with a conductive material (such as tungsten), then a polishing process (such as chemical mechanical polishing) is performed to form a flat surface, which is used to form the light-emitting element 120.

For example, the number of the via hole 257 is at least two.

For example, as shown in FIG. 3B, the numbers of the contact hole regions for electrical connection on the connection electrodes 314, 323, 334, and 343 connected with the first electrode 121 of the light-emitting element 120 are at least two, respectively, the contact resistance between the connection electrodes is reduced, in turn, the connection resistance between the resistance device 130 and the first electrode 121 of the light-emitting element 120 is reduced, so that the voltage drop on a transmission path of the data signal from the resistance device 130 to the first electrode 121 is reduced, the problems such as color shift and display unevenness caused by the loss of anode potential due to the voltage drop are alleviated, and the display effect is improved.

For example, as shown in FIG. 3B, in the direction perpendicular to the base substrate 101, the via holes 257, 254, and 414 corresponding to the first electrode 121 of the light-emitting element 120 do not overlap with each other. In the direction perpendicular to the substrate, stacking of the via holes leads to poor connection, disconnection or unevenness at the positions of the via holes, and this arrangement improves the electrical connection quality of the first electrode 121 of the light-emitting element 120, and improves the display effect.

As shown in FIG. 3B, the light-emitting element 120 includes a first electrode 121, a light-emitting layer 123, and a second electrode 122 sequentially disposed on the sixth insulating layer 206. For example, the first electrode 121 and the second electrode 122 are the anode and the cathode of the OLED, respectively. For example, a plurality of first electrodes 121 are arranged at intervals in a same layer, and correspond to the plurality of sub-pixels in a one-to-one correspondence. For example, the second electrode 122 is a common electrode, and is provided in an entire surface of the display substrate 10.

For example, as shown in FIG. 3B, the display substrate further includes a first encapsulation layer 124, a color filter layer 125, and a cover plate 126 on a side of the light-emitting element 120 away from the base substrate 101.

For example, the first encapsulation layer 124 is configured to seal the light-emitting element to prevent external moisture and oxygen from penetrating into the light-emitting element and the pixel circuit and from causing damage to the device. For example, the encapsulation layer 124 includes an organic thin film or a structure in which an organic thin film and an inorganic thin film are alternately stacked. For example, a water-absorbing layer may be arranged between the encapsulation layer 124 and the light-emitting element, and is configured to absorb residual water vapor or sol in the pre-production process of the light-emitting element. The cover plate 126 is, for example, a glass cover plate.

For example, as shown in FIG. 3B, the display substrate may further include a second encapsulation layer 127 located between the color filter layer 125 and the cover plate 126, and the second encapsulation layer 127 can protect the color filter layer 125.

For example, the light-emitting element 120 is configured to emit white light, and combines the color filter layer 125 to realize a full-color display.

In other examples, the light-emitting element 120 is configured to emit light of three primary colors, in this situation, the color filter layer 125 is not necessary. The embodiment of the present disclosure does not limit the manner in which the display substrate 10 realizes full-color display.

The following Table A exemplarily shows thickness ranges and example values of the first insulating layer to the sixth insulating layer, Table B exemplarily shows thickness ranges and example values of the first conductive layer to the fourth conductive layer, Table C exemplarily shows sizes and example values of the via hole VIA2 in the second insulating layer, the via hole VIA5 in the third insulating layer, the via hole VIA4 in the fourth insulating layer, the via hole VIM in the fifth insulating layer, and the via hole VIA6 in the sixth insulating layer, and Table D exemplarily shows example values of the channel width, length, and respective width-to-length ratio of each transistor (N1 to N4, and P1); however, this is not a limitation to the present disclosure.

TABLE A

| Film Layer | Numerical Range (Å) | Exemplary Value (Å) |
| --- | --- | --- |
| The first insulating layer 201 | 30~34 | 32 |
| The second insulating layer 202 | 10000~14000 | 12000 |
| The third insulating layer 203 | 6500~7500 | 7000 |
| The fourth insulating layer 204 | 6500~7500 | 7000 |
| The fifth insulating layer 205 | 6500~7500 | 7000 |
| The sixth insulating layer 206 | 6500~7500 | 7000 |

TABLE B

| Film Layer | Numerical Range (Å) | Exemplary Value (Å) |
| --- | --- | --- |
| The first conductive layer 201 | 4500~5500 | 5000 |
| The second conductive layer 202 | 4500~5500 | 5000 |
| The third conductive layer 203 | 4500~5500 | 5000 |
| The fourth conductive layer 204 | 4500~5500 | 5000 |

TABLE C

| Via Hole | Numerical Range (um) | Exemplary Value (um) |
| --- | --- | --- |
| VIA2 | 0.2-0.3 | 0.22 |
| VIA3 | 0.2-0.3 | 0.26 |
| VIA4 | 0.2-0.3 | 0.26 |
| VIA5 | 0.2-0.3 | 0.26 |
| VIA6 | 0.3-0.4 | 0.36 |

TABLE D

| Transistor | W(um)/L(um) |
| --- | --- |
| P1 | 0.6/0.6 |
| N1 | 0.6/0.6 |
| N2 | 1.5/0.6 |
| N3 | 1.02/0.76 |

For example, as shown in Table A, among the first insulating layer to the sixth insulating layer, a thickness of the first insulating layer 201 is the smallest, and the thickness of the second insulating layer 202 is the greatest. This is because the first insulating layer 201 includes the gate insulating layer of each transistor, and further includes the dielectric layer 104 of the storage capacitor Cst, providing the thickness of the first insulating layer 201 to be smaller can help to improve the gate control ability of the transistor to obtain a larger storage capacitor. In addition, the second insulating layer 202 serves as a field oxide layer, setting the second insulating layer 202 thicker helps an electrical isolation between the transistors. For example, the thicknesses of the third insulating layer 203, the fourth insulating layer 204, the fifth insulating layer 205, and the sixth insulating layer 206 are the same or similar; for example, the thickness of the second insulating layer 202 is 1.5 to 2 times of the thickness of the third insulating layer 203/the fourth insulating layer 204/the fifth insulating layer 205/the sixth insulating layer 206.

For example, a planar shape of each of the via holes can be a rectangular (such as square) or a circular, the size in Table C represents an average side length or an aperture of the rectangle. For example, as shown in Table C, the plurality of via holes in each of the insulating layers are provided with a same size. For example, among the second insulating layer to the sixth insulating layer, the size of the via hole in the sixth insulating layer 206 is the largest. This is because the sixth insulating layer 206 is closest to the light-emitting element, during the driving process of the light-emitting element, the current gathers up from the transistor in the bottom layer to the light-emitting element, so that the size of the via hole in the sixth insulating layer 206 is the largest, so as to transmit a larger convergent current.

For example, a distance between the first data writing transistor P1 and the second data writing transistor N1 ranges from 0.4 to 0.45 microns, for example, 0.42 microns, which helps to increase the pixel density. As shown in FIG. 4B, the distance D0 is a distance between the sides of the gate electrode 160 of the first data writing transistor P1 and the gate electrode 170 of the second data writing transistor N1 that are closest to each other.

For example, as shown in FIG. 4B, an equivalent length of the resistance device 130 is 4.4 microns, and an average width of the resistance device 130 is 0.42 microns.

For example, as shown in FIG. 4B, an effective capacitance area of the storage capacitor Cst is 20 square microns, that is, an effective area of the polysilicon layer 102 for forming the storage capacitor Cst is 20 square microns. For example, an area ratio of the storage capacitor Cst in each sub-pixel is 20%-35%, for example, 27%. The display substrate provided by the embodiments of the present disclosure can effectively increase the area ratio of the storage capacitor through reasonable layout, so that the capacitance value is increased.

For example, a thickness of the polysilicon layer 102 is 200 nanometers.

At least one embodiment of the present disclosure further provides a pixel structure, and the pixel structure includes a base substrate, a pixel row located on the base substrate, and a first scan line and a second scan line. The pixel row includes a plurality of sub-pixels located on the base substrate and the plurality of sub-pixels are arranged along a first direction; the first scan line and the second scan line extend along the first direction, and each of the sub-pixels includes a pixel circuit, the pixel circuit includes a data writing sub-circuit, a storage sub-circuit, and a driving sub-circuit. The data writing sub-circuit includes a first control electrode, a second control electrode, a first terminal and a second terminal, the first control electrode and the second control electrode of the data writing sub-circuit are respectively configured to receive the first control signal and the second control signal, the first terminal of the data writing sub-circuit is configured to receive a data signal, the second terminal of the data writing circuit is electrically connected with the first terminal of the storage sub-circuit, and is configured to transmit the data signal to the first terminal of the storage sub-circuit in response to the first control signal and the second control signal, the driving sub-circuit includes a control terminal, a first terminal and a second terminal, the control terminal of the driving sub-circuit is electrically connected with the first terminal of the storage sub-circuit, the first terminal of the driving sub-circuit is configured to receive the first power voltage, the second terminal of the driving sub-circuit is used to connect with the light-emitting element, the driving sub-circuit is configured to drive the light-emitting element to emit light in response to the voltage at the first terminal of the storage sub-circuit; the first scan line is electrically connected with the first control electrode of the data writing circuit of the plurality of sub-pixels to provide the first control signal; the second scan line is electrically connected with the second control electrode of the data writing circuit of the plurality of sub-pixels to provide the second control signal; the first scan line and the second scan line are provided with a same resistance, and an area of an orthographic projection of the first scan line on the base substrate is the same as an area of an orthographic projection of the second scan line on the base substrate.

In some examples, for example, the first scan line and the second scan line refer to a portion, which is in the display region, of a wiring that transmits the corresponding control signal from the scan driving circuit to each of the sub-pixels, so that in a case of comparing the resistances and the areas, the portion of the wiring outside the display region can be ignored.

In other examples, for example, the first scan line and the second scan line may also represent all portions of the wiring that transmits the corresponding control signal from the scan driving circuit to each of the sub-pixels and include the portions of the wiring located in the display region and the non-display region, for example, the portion S shown in FIG. 1A. For example, the first control signal SEL and the second control signal SEL_B can be output by a same gate driving circuit unit (such as a GOA unit).

With this arrangement, it can be ensured that a resistance-capacitance (RC) load on the first scan line is the same as a resistance-capacitance (RC) load on the second scan line. Referring to IA, in a case that the control signal is transmitted from the scan driving circuit 14 to each of the sub-pixels, a proportion of the portion of the scan line 11 (for example, the first scan line and the second scan line) outside the display region (shown by the dashed frame) is relatively small, so that the RC loads of the portions of the scan lines 11 in the display region are provided to be the same can improve the synchronization of the first control signal SEL and the second control signal SEL_B; with reference to FIG. 2C, for example, in a case of entering from the data writing stage 1 to the light-emitting stage 2, the above setting can make a rising edge of the first control signal SEL and a falling edge of the second control signal SEL_B occur at the same time. Therefore, the anti-interference performance of the pixel circuit is improved.

The present disclosure further provides a display substrate including a plurality of pixel structures, the plurality of pixel rows in the plurality of pixel structures are arranged in the second direction, and the first direction intersects the second direction, so that the plurality of sub-pixels of the plurality of pixel rows are a plurality of pixel columns.

It should be noted that the pixel structure provided by the embodiment of the present disclosure can be applied to the display substrate 10 provided by any one of the foregoing embodiments. However, the pixel structures provided by the embodiments of the present disclosure are not limited to a silicon-based display substrate, for example, may also be applied to a glass substrate or a flexible substrate, in this case, the light-emitting element may also be, for example, in a bottom emission structure or a double-side emission structure.

Figure 10A:
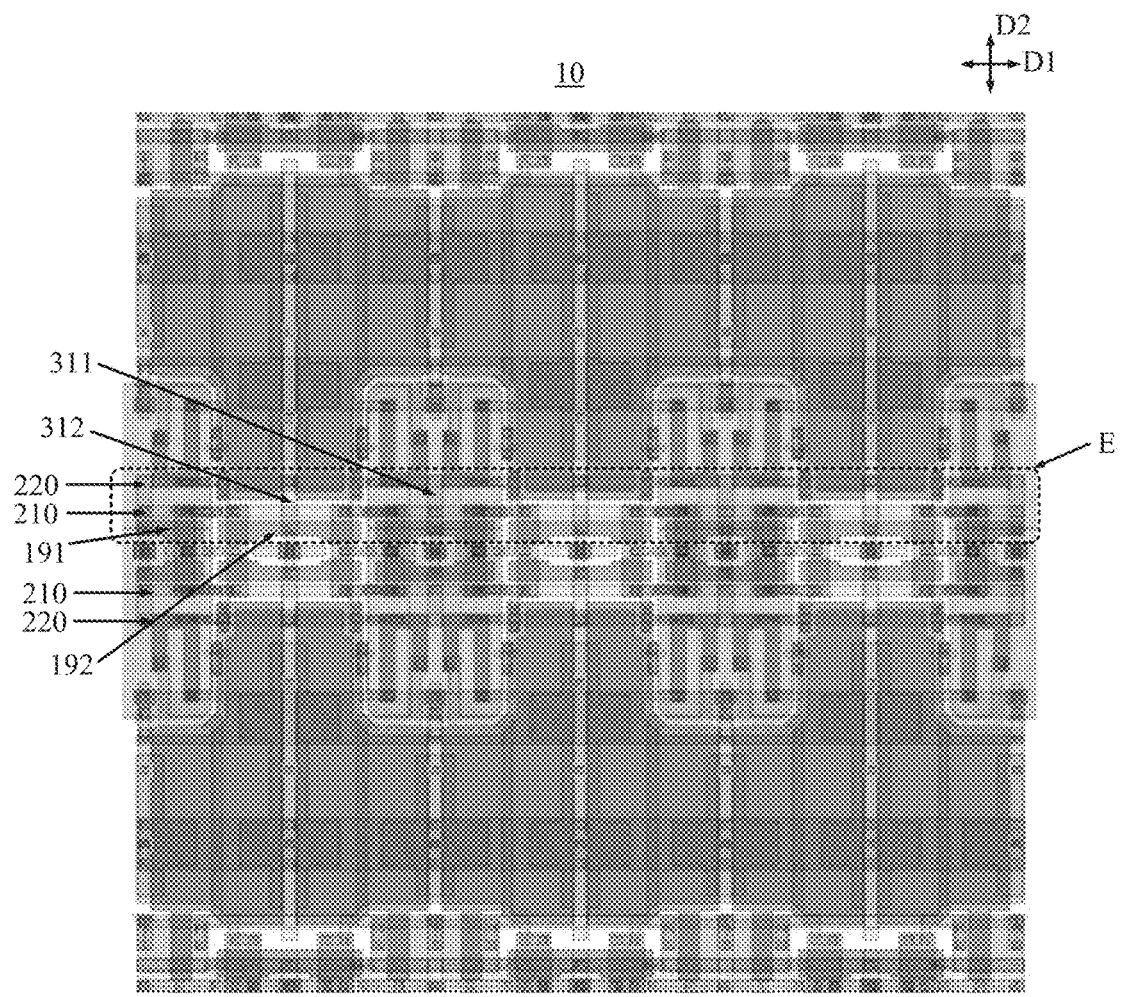
FIG. 10A is a fourth schematic diagram of a display substrate provided by at least one embodiment of the present disclosure.

FIG. 10A shows a schematic diagram of a display substrate provided by at least one embodiment of the present disclosure. For clarity, the figure shows two rows and six columns of sub-pixels, namely only two above pixel structures. Compared with the display substrate illustrated in FIG. 3A, the display substrate omits the third conductive layer and the fourth conductive layer. In the following, the arrangement of the first scan line and the second scan line in the display substrate and the pixel structure provided by the embodiment of the present disclosure will be exemplarily described with reference to FIG. 10A, but the embodiments of the present disclosure are not limited thereto.

For example, as shown in FIG. 10A, each sub-pixel row is respectively correspondingly connected with a first scan line 210 and a second scan line 220, but the present disclosure is not limited thereto.

For example, the display substrate 10 further includes a plurality of first scan line connection portions 311 electrically connected with the first scan line 210 and a plurality of second scan line connection portions 312 electrically connected with the second scan line 220; the first scan line 210 is electrically connected with the first control electrode (that is, the gate electrode of the first data writing transistor) of the data writing circuit of a row of sub-pixels through the plurality of first scan line connection portions 311, and the second scan line 220 is electrically connected with the second control electrode (that is, the gate electrode of the second data writing transistor) of the data writing circuit of the row of sub-pixels through the plurality of second scan line connection portions 312.

For example, the first scan line 210 and the second scan line 220 are arranged in a same layer and insulated from each other and are made of a same material.

For example, the plurality of first scan line connection portions 311 and the plurality of second scan line connection portions 312 are arranged at intervals in a same layer and are made of a same material, and are located in a different conductive layer from the first scan line 210 and the second scan line 220.

Figure 10B:
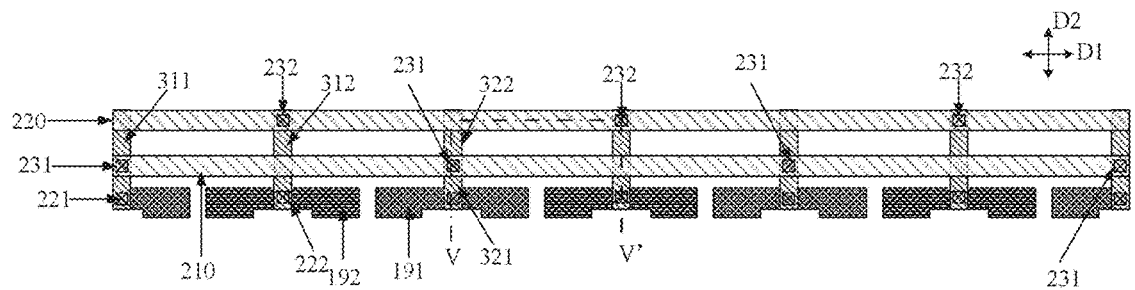
FIG. 10B is an enlarged schematic diagram of a region shown by a dotted line of the display substrate in FIG. 10A.
Figure 10C:
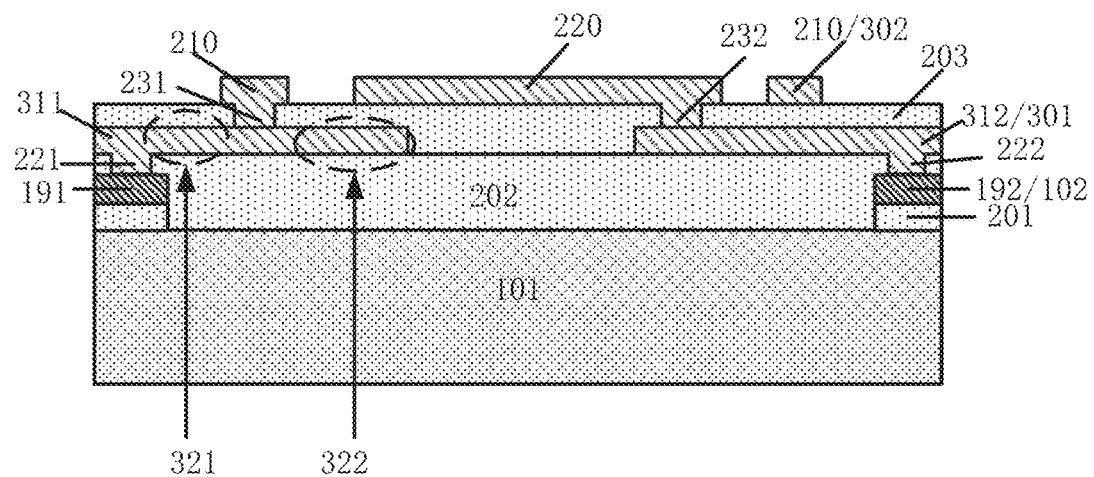
FIG. 10C is a cross-sectional schematic diagram of FIG. 10B along a section line V-V'.

FIG. 10B shows an enlarged schematic diagram of the region E in the dashed frame region in FIG. 10A, for clarity, the figure only shows the gate electrodes of the first data writing transistor P1 and the second data writing transistor N1, the first scan lines 210, and the second scan lines 220, and the first scan line connection portions 311 and the second scan line connection portions 312. For the convenience of comparison, the position of the E region is also correspondingly shown in FIG. 7B. FIG. 10C shows a cross-sectional schematic diagram of FIG. 10B along a section line V-V'.

For example, the lengths and the line widths of the first scan line 210 and the second scan line 220 are respectively the same.

For example, the first scan line connection portion 311 and the second scan line connection portion 312 are alternately arranged in the first direction D1, and the extension direction of the first scan line connection portion 311 and the extension direction of the second scan line connection portions 312 are different from the first direction D1. The orthographic projection of the first scan line connection portions 311 on the base substrate intersects with both the orthographic projections of the first scan line 210 and the second scan line 220 on the base substrate. The orthographic projection of the second scan line connection portions 312 on the base substrate intersect with both the orthographic projections of the first scan line 210 and the second scan line 220 on the base substrate. For example, both the first scan line connection portion 311 and the second scan line connection portion 312 are linear structures, and extend along the second direction D2.

For example, a sum of areas of orthographic projections of the plurality of first scan line connection portions 311 on the base substrate is the same as a sum of areas of orthographic projections of the plurality of second scan line connection portions 312 on the base substrate. Therefore, the parasitic capacitances on the plurality of first scan line connection portions 311 and the parasitic capacitances on the plurality of second scan line connection portions 312 are the same.

This setting makes the loads caused by the parasitic capacitances of the wirings (including the corresponding scan lines and connection portions) are the same while the first control signal and the second control signal respectively transmitting from the first scan line and the second scan line to the data writing sub-circuit, and the synchronization of the first control signal and the second control signal is further improved.

For example, a size of the first data writing transistor P1 electrically connected with the first scan line and a size of the second data writing circuit N1 electrically connected with the second scan line are the same, thus the loads generated on respective scan lines are also the same, and the synchronization of the first control signal and the second control signal is further improved, so that the anti-interference performance of the circuit is improved.

For example, each of the plurality of first scan line connection portions 311 has a same length along the second direction D2, and each of the plurality of first scan line connection portions 311 has a same line width. Each of the plurality of second scan line connection portions 312 has a same length in the second direction D2, and each of the plurality of second scan line connection portions 312 has a same line width.

For example, the first scan line 210 is electrically connected with the first scan line connection portion 311 through the via holes 231, the second scan line 220 is electrically connected with the second scan line connection portions 312 through the via holes 232, and the via hole 231 and the via hole 232 are both located in the third insulating layer 203.

For example, as shown in FIG. 10B, the first control electrode group 191 formed by the first control electrodes of two sub-pixels adjacent in the first direction D1 and the second control electrode group 192 formed by the second control electrodes of the two sub-pixels adjacent in the first direction D1 are alternately arranged one by one in the first direction D1.

For example, as shown in FIG. 10B, the first scan line connection portion 311 is electrically connected with the first control electrode group 191 or the first control electrode through the via hole 221, the second scan line connection portion 312 is electrically connected with the second control electrode group 192 or the second control electrode through the via hole 222. For example, the plurality of first scan line connection portions 311 are electrically connected with the plurality of first control electrode groups 191 in a one-to-one correspondence, and the plurality of second scan line connection portions 312 are electrically connected with the plurality of second control electrode groups 192 in a one-to-one correspondence.

For example, the first scan lines 210 and the second scan lines 220 are located on a same side of the plurality of first control electrode groups 191 and the plurality of second control electrode groups 192, and the first scan lines 210 are closer to the plurality of first control electrode groups 191 and the second control electrode groups 192.

For example, as shown in FIG. 10B, in a direction perpendicular to the base substrate, the first scan lines 210 intersect with both the first scan line connection portion 311 and the second scan line connection portion 312, and the second scan lines 220 intersect with both the first scan line connection portion 311 and the second scan line connection portion 312. The via hole 231 is located at the intersection of the first scan line 210 and the first scan line connection portion 311, and the via hole 232 is located at the intersection of the second scan line 220 and the second scan line connection portion 312.

For example, as shown in FIG. 10B, the via hole 231 and the via hole 232 are alternately arranged in the first direction D1 and are staggered in the second direction, and the via hole 231 is closer to the plurality of the first control electrode groups 191 and the plurality of second control electrode groups 192 than the via hole 232.

As shown in FIG. 10B, one end of the second scan line connection portion 312 is electrically connected with the corresponding second scan line 220 through the via hole 232, and the other end of the second scan line connection portion 312 is electrically connected with the second control electrode or the second control electrode group to be connected through the via hole 222. The first scan line 210 passes between the via hole 232 and the via hole 222.

For example, as shown in FIG. 10B, the first scan line connection portion 311 includes a main body portion 321 and an extension portion 322, the extension portion 322 is a portion extended from the main body portion 321 and away from the first scan line 20 along the second direction. The main body portion 321 is used to electrically connect the first scan line connection portion 311 and the first control electrode or the first control electrode group, and the main body portion 321 is located between the first scan line 210 and the connected first control electrode or first control electrode group in the second direction D2; the extension portion 322 is located at a side of the first scan lines 210 away from the first control electrode or first control electrode group connected with the extension portion 322 in the second direction D2.

Here, the extension portion 322 serves as a dummy structure, and does not actually play a role of electrical connection, the extension portion 322 is arranged to make the length and the area of the first scan line connection portion 311 respectively the same as the length and the area of the second scan line connection portion 312, thereby forming the same capacitive load on the first scan line connection portion 311 and on the second scan line connection portion 312.

For example, as shown in FIG. 10B, the via hole 221 is located in the middle of the first control electrode group 191, and the via hole 222 is located in the middle of the second control electrode group 192. The two first control electrodes in the first control electrode group 191 are axisymmetric with respect to the first scan line connection portion 311 correspondingly connected with the first control electrode group 191 to the first control electrode group and an extension line of the first scan line connection portion 311; and the two second control electrodes in the second control electrode group 192 are axisymmetric with respect to the second scan line connection portion 312 correspondingly connected to the second control electrode group and an extension line of the second scan line connection portion 312.

Referring to FIG. 10A, the first scan lines 210 correspondingly connected with two adjacent pixel rows are symmetrical about a symmetry axis along the first direction D1, and the second scan lines 220 corresponding to two adjacent pixel rows are symmetrical about a symmetry axis along the first direction D1.

The display substrate 10 includes a plurality of data lines extended along the second direction D2, and the data line is used to connect with the first terminal of the data writing sub-circuit in the sub-pixel to provide the data signal Vd.

Figure 11A:
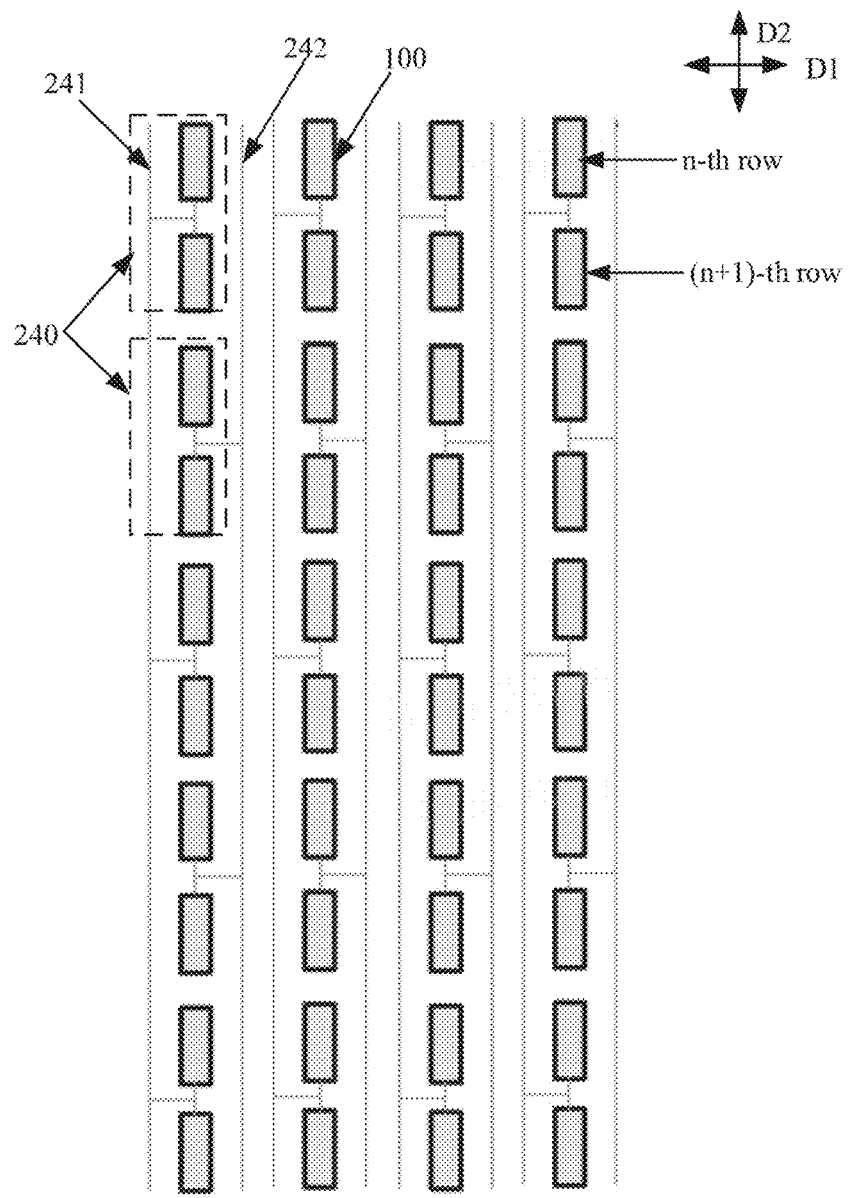
FIG. 11A is a fifth schematic diagram of a display substrate provided by at least one embodiment of the present disclosure.

FIG. 11A shows a schematic diagram of a display substrate provided by other embodiments of the present disclosure, the figure shows a schematic diagram of a data line of a display substrate provided by at least one embodiment of the present disclosure, but the embodiments of the present disclosure are not limited to this case.

With reference to FIG. 8A, the data lines are divided into a plurality of data line groups, each of the plurality of data line groups includes a first data line 241 and a second data line 242. The plurality of data line groups are electrically connected with the plurality of pixel columns in a one-toone correspondence to provide the data signal Vd. Each of the sub-pixel columns is electrically connected with a first data line 241 and a second data line 242 respectively; that is, one column of sub-pixels is driven by two data lines.

For example, as shown in FIG. 11A, each sub-pixel column is correspondingly connected with two data lines, that is, a first data line 241 and a second data line 242. For each column of sub-pixels, two sub-pixels in an n-th pixel row and in an (n+1)-th pixel row in the plurality of pixel rows constitute a pixel group 240, and share one data line, where n is an odd number or an even number greater than 0. For each column of sub-pixels, in the second direction D2, the N-th pixel group 240 is connected with the first data line 241, and the (N+1)-th pixel group 240 is connected with the second data line 242, where N is a natural number, that is, in the second direction D2, the pixel group 240 is alternately connected with the first data line 241 and the second data line 242, the odd-numbered pixel groups share one data line, and the even-numbered pixel groups share another data line.

By setting two data lines to drive a sub-pixel column, the load on each data line can be reduced, so that the driving ability of the data line is improved, the signal delay is reduced, and the display effect is improved.

Since the display substrate provided by the embodiment of the present disclosure is symmetry in structure, the layout of the signal line can be matched with the driving mode of the above-mentioned data line, to achieve the effect of optimized design.

For example, with reference to FIG. 4A, the first electrodes of two first data writing transistors P1 in a pixel group 240 are connected with each other as an integral structure (see region A1), and the first electrodes of two second data writing transistors N1 are connected with each other as an integral structure (see region A2), thus in accordance with the above-mentioned driving method of the data line, a connecting via hole can be provided for the first electrodes of the integrated structure to be connected with the data line in a limited contact region, so that the data line is electrically connected with the two first data writing transistors P1 or the two second data writing transistors N2 in the pixel group 240, instead of being connected with the two transistors through a via hole separately. This not only saves the process, but also makes the layout design more compact under the restriction of the design rules, and the resolution of the display substrate is improved.

Figure 11B:
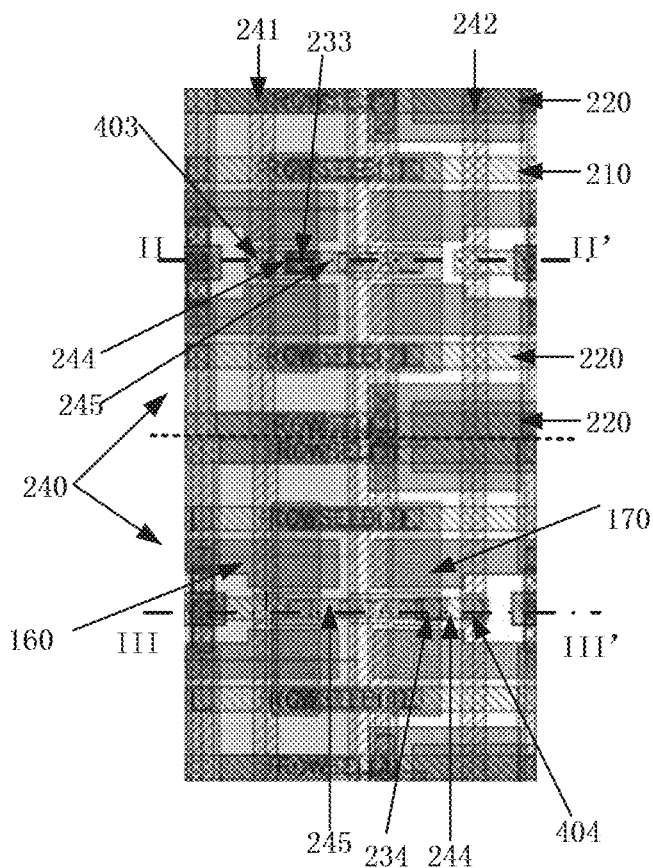
FIG. 11B is a sixth schematic diagram of a display substrate provided by at least one embodiment of the present disclosure.

FIG. 11B shows the connection structure of the data lines in two adjacent pixel groups 240, for clarity, only partial diagrams of the sub-pixels in each of the pixel groups connected with the first data line and the second data line are selectively shown, and the partial diagrams corresponding to the two pixel groups are put together, to show the continuous relationship of signal lines, where the dotted line shows a dividing line of the two pixel groups.

As shown in FIG. 11B, in a direction perpendicular to the base substrate, the first data line 241 overlaps with the first data writing transistor P1, and is electrically connected with the first electrodes of two adjacent first data writing transistors P1 in one pixel row 240; and the second data line 242 overlaps with the second data writing transistor N1, and is electrically connected with the first electrodes of two adjacent second data writing transistors N1 in one pixel group 240.

For example, as shown in FIG. 11B, in the direction perpendicular to the base substrate, the first data line 241 overlaps with the gate electrode 160 of the first data writing transistor P1, the second data line 242 overlaps with the gate electrode 170 of the second data writing transistor N1; that is, both the first data line 241 and the second data line 242 pass through the pixel region, and no additional pixel space is occupied, to improve the space utilization.

Figure 11C:
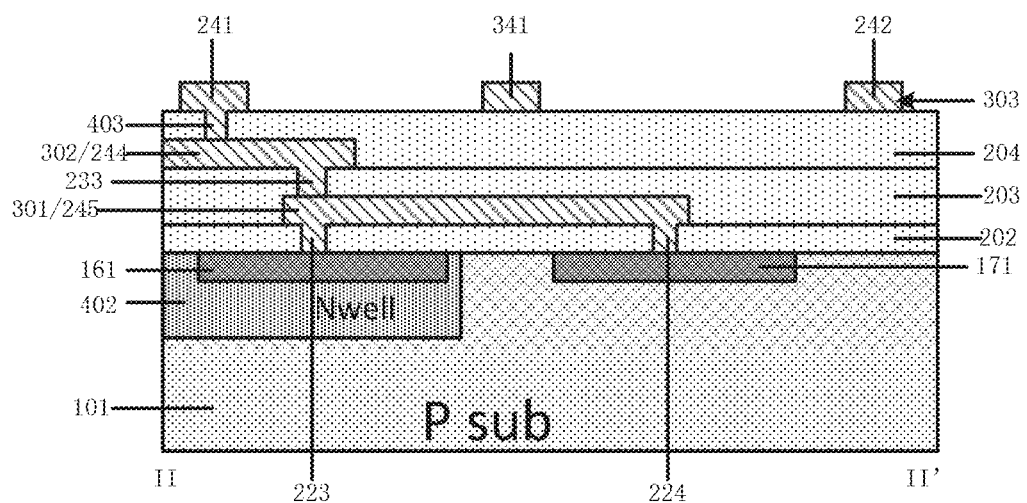
FIG. 11C is a cross-sectional schematic diagram of the display substrate shown in FIG. 11B along a section line II-II'.
Figure 11D:
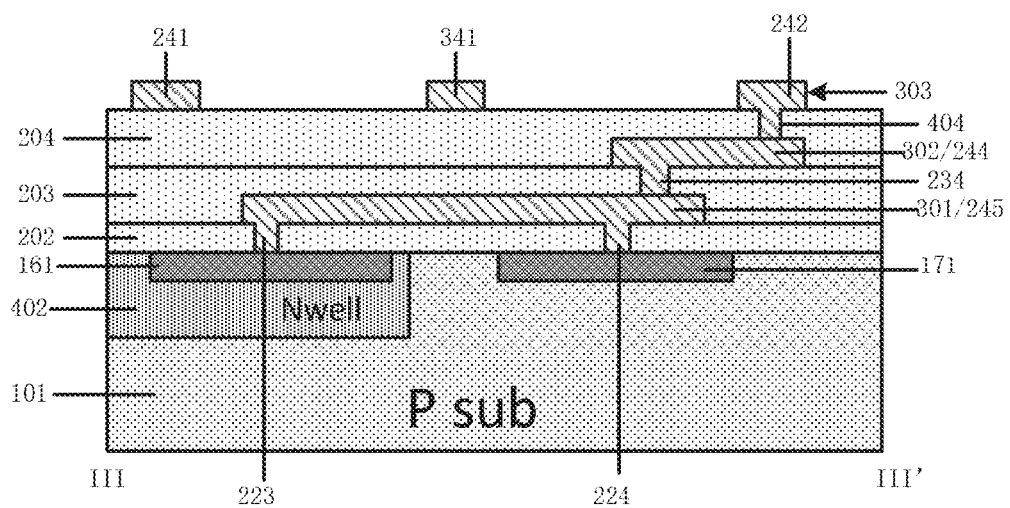
FIG. 11D is a cross-sectional schematic diagram of the display substrate shown in FIG. 11B along a section line.

FIG. 11C and FIG. 11D respectively show a cross-sectional schematic diagram of FIG. 11B along the section lines II-II' and III-III', and the section lines are, for example, along the first direction D1. For clarity, the figures only show the structure that is electrically connected with the data line, and other structures are omitted. As shown in FIGS. 11C and 11D, the first data line 241 and the second data line 242 are located in the third conductive layer 303, and are electrically connected with the corresponding first data line connection portions 244 in the second conductive layer 302 through the via holes 403 and 404 in the fourth insulating layer 204, respectively. In the direction perpendicular to the base substrate, the first data line connection portion 244 overlaps with the corresponding first data line 241 or the second data line 242 respectively. The first data line connection portion 244 is electrically connected with the second data line connection portion 245 in the first conductive layer 301 through the via holes 233 and 234 in the third insulating layer 203, the second data line connection portion 245 is electrically connected with the first electrode 161 of the first data writing transistor P1 and the first electrode 171 of the second data writing transistor N1 through the via holes 223 and 224 in the second insulating layer 202, respectively, so that the data signal is transmitted to the transistors.

Since the first electrodes of the two adjacent first data writing transistors P1 and the first electrodes of the two adjacent second data writing transistors N1 in one pixel row are respectively connected as an integral structure, and the second data line connection portion 245 electrically connects the first electrode of the first data writing transistor P1 with the first electrode of the second data writing transistor N1 in one sub-pixel, thus, the second data line connection portion 245 electrically connects the first electrodes 161 of the two first data writing transistors P1 and the first electrodes 171 of the two second data writing transistors N1 of two sub-pixels adjacent in the second direction D2 in one sub-pixel group, and the second data line connection portion 245 is connected to the corresponding first data line 241 or the corresponding second data line 242 through the corresponding first data line connection portion 244. It can be seen that the first electrodes of the four transistors only need to be provided with one via hole in both the third insulating layer and the fourth insulating layer to realize electrical connection with the data line, the layout space is greatly saved, and the space utilization is improved.

As shown in FIGS. 11B to 11D, for example, the first data line 241 and the second data line 242 are symmetrically arranged on two sides of the second data line connection portion 245.

For example, as shown in FIGS. 11C and 11D, the third conductive layer further includes a shielding electrode 341, the shielding electrode 341 is located between the first data line 241 and the second data line 242, for example, the first data line 241 and the second data line 242 are symmetrically arranged on two sides of the shielding electrode 341. The shielding electrode 341 is arranged between the two data lines to play a role of shielding, so as to prevent signals in the two data lines from interfering with each other. For example, the shielding electrode 341 is configured to receive a constant voltage to improve the shielding ability; for example, the shielding electrode 341 is configured to receive the second power voltage.

For example, as shown in FIG. 4A, the first electrodes 161 of the first data writing transistors P1 of two sub-pixels 100 adjacent in the second direction D2 are connected with each other as an integral structure, and the first electrodes 171 of the second data writing transistors N1 of two sub-pixels 100 adjacent in the second direction D2 are connected with each other as an integral structure.

For example, the materials of the above-mentioned first to fourth conductive layers are metal materials, such as gold (Au), silver (Ag), copper (Cu), aluminum (Al), molybdenum (Mo), magnesium (Mg), tungsten (W), and alloy materials of the above metals. For example, the materials of the first to fourth conductive layers may also be conductive metal oxide materials, such as indium tin oxide (ITO), indium zinc oxide (IZO), zinc oxide (ZnO), zinc aluminum oxide (AZO), and so on.

For example, the material of the first insulating layer to the sixth insulating layer is, for example, an inorganic insulating layer, such as silicon oxide, silicon nitride, silicon oxynitride, or other silicon oxide, silicon nitride or silicon oxynitride, or metal oxynitride insulating materials, for example, aluminum oxide, and titanium nitride.

For example, the light-emitting element 120 is a top emitting structure, the first electrode 121 is reflective, and the second electrode 122 is transmissive or semi-transmissive. For example, the first electrode 121 is made of a material with a high work function to act as an anode, such as an ITO/Ag/ITO laminated structure; the second electrode 122 is made of a material with a low work function to act as a cathode, for example, is a semi-transmissive metal or metal alloy material, such as an Ag/Mg alloy material.

At least one embodiment of the present disclosure further provides a display panel, which includes any one of the above display substrates 10. It should be noted that the above-mentioned display substrate 10 provided by at least one embodiment of the present disclosure may include a light-emitting element 120, and may also not include the light-emitting element 120, that is, the light emitting element 120 can be formed in a panel factory after the display substrate 10 is completed. In the case that the display substrate 10 itself does not include the light-emitting element 120, the display panel provided by the embodiment of the present disclosure further includes the light-emitting element 120 in addition to the display substrate 10.

Figure 12:
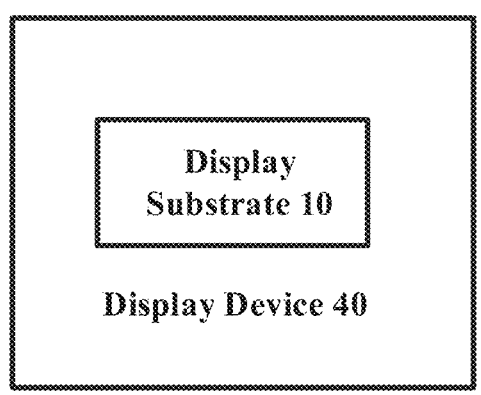
FIG. 12 is a schematic diagram of a display device provided by at least one embodiment of the present disclosure.

At least one embodiment of the present disclosure further provides a display device 40, as shown in FIG. 12, the display device 40 includes any one of the above-mentioned display substrates 10 or display panels, and the display device in this embodiment may be any product or component that has a display function, such as a display, an OLED panel, an OLED TV, an electronic paper, a mobile phone, a tablet computer, a notebook computer, a digital photo frame, and a navigator.

What are described above is related to only the illustrative embodiments of the present disclosure and not limitative to the protection scope of the present application. Therefore, the protection scope of the present application shall be defined by the accompanying claims.

What is claimed is:

1. A display substrate, comprising a base substrate and a sub-pixel on the base substrate, wherein the sub-pixel comprises a pixel circuit, and the pixel circuit comprises a data writing sub-circuit, a storage sub-circuit and a driving sub-circuit, the storage sub-circuit comprises a storage capacitor, and the capacitor comprises a first capacitor electrode and a second capacitor electrode which respectively serve as a first terminal and a second terminal of the storage sub-circuit;

the data writing sub-circuit is electrically connected with the first terminal of the storage sub-circuit, and is configured to transmit a data signal to the first terminal of the storage sub-circuit in response to a control signal;

the driving sub-circuit comprises a control electrode, a first electrode and a second electrode, and the control electrode is electrically connected with the first terminal of the storage sub-circuit; the driving sub-circuit is configured to control a driving current which drives a light-emitting element to emit light;

the display substrate further comprises a first connection electrode; the first connection electrode is in a same layer as the second capacitor electrode and is insulated from the second capacitor electrode, and the first connection electrode is directly electrically connected with the first capacitor electrode to electrically connect the first capacitor electrode to the data writing sub-circuit.

2. The display substrate according to claim 1, wherein the first connection electrode comprises a first portion extended along a first direction and a second portion extended along a second direction, the first portion and the second portion are in an integral structure, and the first direction and the second direction are orthogonal to each other;

the first portion is electrically connected with the data writing sub-circuit and the second portion is electrically connected with the first capacitor electrode.

3. The display substrate according to claim 2, wherein an orthographic projection of the first portion of the first connection electrode on the base substrate is not overlapped with an orthographic projection of the storage capacitor on the base substrate.

4. The display substrate according to claim 1, wherein the driving sub-circuit comprises a driving transistor, and a gate electrode, a first electrode and a second electrode of the driving transistor respectively serve as the control electrode, the first electrode and the second electrode;

in a direction perpendicular to the base substrate, the first connection electrode is not overlapped with a channel region of the driving transistor.

5. The display substrate according to claim 1, further comprising a polysilicon layer on the base substrate, wherein the control electrode of the driving sub-circuit is in the polysilicon layer, and the first connection electrode is on a side of the polysilicon layer away from the base substrate.

6. The display substrate according to claim 1, wherein the driving current flows from the first electrode to the light-emitting element along a current path which sequentially comprises a first straight current path, a second polyline current path and a third U-shaped current path.

7. The display substrate according to claim 6, wherein the second polyline current path and the first straight current path are respectively in different layers of the display substrate.

8. The display substrate according to claim 6, wherein the first straight current path is in the base substrate, and the second polyline current path is in a layer where the first connection electrode is located.

9. The display substrate according to claim 6, further comprising a second connection electrode, wherein the second polyline current path is in the second connection electrode, and a first terminal of the second connection electrode is electrically connected with the second electrode of the driving sub-circuit.

10. The display substrate according to claim 9, wherein in a direction perpendicular to the base substrate, the first connection electrode is not overlapped with the second connection electrode.

11. The display substrate according to claim 9, wherein the first connection electrode and the second connection electrode are in a same layer and are insulated from each other.

12. The display substrate according to claim 9, further comprising a U-shaped resistor on the base substrate,
wherein one terminal of the U-shaped resistor is electrically connected with a second terminal of the second connection electrode, and another terminal of the U-shaped resistor is configured to be electrically connected with the light-emitting element.

13. The display substrate according to claim 12, wherein the U-shaped resistor and the control electrode of the driving sub-circuit are in a same polysilicon layer, and a resistivity of the U-shaped resistor is higher than a resistivity of the control electrode of the driving sub-circuit.

14. The display substrate according to claim 9, wherein in a direction perpendicular to the base substrate, the second connection electrode is at least partially overlapped with the first capacitor electrode.

15. The display substrate according to claim 6, wherein an opening of the third U-shaped current path is facing a side where the driving sub-circuit is located.

16. The display substrate according to claim 1, wherein the storage capacitor further comprises a third capacitor electrode, wherein the third capacitor electrode is on a side of the first capacitor electrode away from the second capacitor electrode and is configured to be electrically connected with the second capacitor electrode.

17. The display substrate according to claim 16, wherein the third capacitor electrode is in the base substrate.

18. The display substrate according to claim 1, comprising a plurality of sub-pixels arranged in an array along a first direction and a second direction different from the first direction,
wherein along the second direction, the data writing sub-circuit, the first connection electrode and the driving sub-circuit are sequentially arranged.

19. The display substrate according to claim 18, wherein the first connection electrode comprises a first portion extended along the first direction and a second portion extended along the second direction, and the first portion and the second portion are in an integral structure;
the first portion is electrically connected with the data writing sub-circuit and the second potion is electrically connected with the first capacitor electrode.

20. A display device, comprising the display substrate of claim 1 and the light-emitting element.

* * * * *